(12) United States Patent
Hirose et al.

(10) Patent No.: US 12,446,465 B2
(45) Date of Patent: *Oct. 14, 2025

(54) ORGANIC COMPOUND, LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Tomoya Hirose, Kanagawa (JP); Hiroshi Kadoma, Kanagawa (JP); Satoko Shitagaki, Kanagawa (JP); Satoshi Seo, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/436,617

(22) Filed: Feb. 8, 2024

(65) Prior Publication Data

US 2024/0188433 A1 Jun. 6, 2024

Related U.S. Application Data

(63) Continuation of application No. 16/573,475, filed on Sep. 17, 2019, now Pat. No. 11,910,710, which is a continuation of application No. 13/939,768, filed on Jul. 11, 2013, now abandoned.

(30) Foreign Application Priority Data

Jul. 13, 2012 (JP) ................. 2012-157602

(51) Int. Cl.
| | |
|---|---|
| H10K 85/60 | (2023.01) |
| H10K 50/11 | (2023.01) |
| H10K 71/16 | (2023.01) |
| H10K 85/30 | (2023.01) |
| H10K 101/10 | (2023.01) |
| H10K 102/10 | (2023.01) |

(52) U.S. Cl.
CPC ..... *H10K 85/6572* (2023.02); *H10K 85/6576* (2023.02); *H10K 50/11* (2023.02); *H10K 71/164* (2023.02); *H10K 85/342* (2023.02); *H10K 2101/10* (2023.02); *H10K 2102/103* (2023.02)

(58) Field of Classification Search
CPC .......... H01L 2251/308; H01L 51/0071; H01L 51/0072; H01L 51/0073; H01L 51/0074; H01L 51/001; H01L 51/0085; H01L 51/5016; C07D 487/04; C07D 235/02; C07D 221/12; C07D 333/76; C07D 307/91; C09K 11/06; C09K 2211/1018; C09K 2211/1044; C09K 2211/1096; C09K 2211/1048; C09K 2211/1051; C09K 2211/1088; C09K 2211/1092; H10K 85/657; H10K 85/6572; H10K 85/6576; H10K 85/6574; H10K 85/342; H01K 50/11

See application file for complete search history.

(56) References Cited

U.S. PATENT DOCUMENTS

| | | | |
|---|---|---|---|
| 8,368,062 B2 | 2/2013 | Lee et al. | |
| 9,000,169 B2 | 4/2015 | Lee et al. | |
| 9,034,486 B2 | 5/2015 | Kadoma et al. | |
| 9,139,562 B2 | 9/2015 | Lee et al. | |
| 11,910,710 B2 * | 2/2024 | Hirose | H10K 85/6576 |
| 2002/0182441 A1 | 12/2002 | Lamansky et al. | |
| 2003/0124381 A1 | 7/2003 | Thompson et al. | |
| 2003/0141809 A1 | 7/2003 | Furugori et al. | |
| 2005/0221116 A1 | 10/2005 | Cocchi et al. | |
| 2007/0099026 A1 | 5/2007 | Lee et al. | |
| 2007/0190359 A1 | 8/2007 | Knowles et al. | |
| 2009/0278444 A1 | 11/2009 | Forrest et al. | |
| 2010/0237334 A1 | 9/2010 | Ma et al. | |
| 2011/0127513 A1 | 6/2011 | Lee et al. | |
| 2011/0210316 A1 | 9/2011 | Kadoma et al. | |
| 2012/0025697 A1 | 2/2012 | Kadoma et al. | |
| 2012/0205632 A1 | 8/2012 | Shitagaki et al. | |
| 2012/0205687 A1 | 8/2012 | Yamazaki et al. | |
| 2012/0206035 A1 | 8/2012 | Shitagaki et al. | |
| 2012/0242219 A1 | 9/2012 | Seo et al. | |
| 2012/0256535 A1 | 10/2012 | Seo et al. | |

(Continued)

FOREIGN PATENT DOCUMENTS

| | | |
|---|---|---|
| CN | 103764789 A | 4/2014 |
| EP | 2311826 A | 4/2011 |
| EP | 2570412 A | 3/2013 |

(Continued)

OTHER PUBLICATIONS

Nishizeki et al., machine translation of JP 2010-215759 (2010) pp. 1-178. (Year: 2010).*
Baranoff.E et al., "Flrpic: archetypal blue phosphorescent emitter for electroluminescence", Dalton Transactions, 2015, vol. 44, pp. 8318-8329, Royal Society of Chemistry.
Hino.Y et al., "Red Phosphorescent Organic Light-Emitting Diodes Using Mixture System of Small-Molecule and Polymer Host", Jpn. J. Appl. Phys. (Japanese Journal of Applied Physics), Apr. 21, 2005, vol. 44, No. 4B, pp. 2790-2794, The Japan Society of Applied Physics.
Endo.A et al., "Efficient Up-Conversion of Triplet Excitons Into a Singlet State and Its Application for Organic Light Emitting Diodes", Appl. Phys. Lett. (Applied Physics Letters), Feb. 24, 2011, vol. 98, No. 8, pp. 083302-1-083302-3.

*Primary Examiner* — Dylan C Kershner
(74) *Attorney, Agent, or Firm* — Husch Blackwell LLP

(57) ABSTRACT

A novel organic compound with which the emission characteristics, emission efficiency, and reliability of a light-emitting element can be improved is provided. The organic compound has an imidazo[1,2-f]phenanthridine skeleton and a dibenzothiophene skeleton or a dibenzofuran skeleton bonded through an arylene group. The light-emitting element including the organic compound in a light-emitting layer shows high efficiency and low power consumption.

4 Claims, 24 Drawing Sheets

(56) References Cited

U.S. PATENT DOCUMENTS

2013/0181196 A1  7/2013 Lee et al.
2014/0014930 A1  1/2014 Hirose et al.

FOREIGN PATENT DOCUMENTS

| EP | 2730634 A | 5/2014 |
|----|-----------|--------|
| JP | 2009-267255 A | 11/2009 |
| JP | 2010-215759 A | 9/2010 |
| JP | 2010-267847 A | 11/2010 |
| JP | 2011-528033 | 11/2011 |
| JP | 2012-054542 A | 3/2012 |
| JP | 2014-528916 | 10/2014 |
| JP | 6547021 | 7/2019 |
| KR | 2013-0006293 A | 1/2013 |
| WO | WO-2012/017842 | 2/2012 |
| WO | WO-2013/009013 | 1/2013 |

* cited by examiner

--- Fluorescence spectrum of first (213) or third (215) organic compound
--- Phosphorescence spectrum of first (213) or third (215) organic compound
—— Absorption spectrum of second organic compound (214)
▬▬ Emission spectrum of exciplex

ORGANIC COMPOUND, LIGHT-EMITTING ELEMENT, LIGHT-EMITTING DEVICE, ELECTRONIC DEVICE, AND LIGHTING DEVICE

This application is a continuation of copending U.S. application Ser. No. 16/573,475, filed on Sep. 17, 2019 which is a continuation of U.S. application Ser. No. 13/939,768, filed on Jul. 11, 2013 (now abandoned), which are all incorporated herein by reference.

BACKGROUND OF THE INVENTION

1. Field of the Invention

The present invention relates to an organic compound and a light-emitting element including the organic compound. The present invention also relates to a light-emitting device, an electronic device, and a lighting device each including the light-emitting element.

2. Description of the Related Art

In recent years, research and development have been extensively conducted on light-emitting elements using electroluminescence (EL). In a basic structure of such a light-emitting element, a layer containing a light-emitting substance is interposed between a pair of electrodes. By applying voltage to this element, light can be emitted from the light-emitting substance.

Such a light-emitting element is a self-luminous element and has advantages over liquid crystal displays, such as high visibility of pixels and no need of a backlight; thus, such a light-emitting element is thought to be suitable as a flat panel display element. Besides, such a light-emitting element has advantages in that it can be manufactured to be thin and lightweight. Very high speed response to an input signal is also a feature of such a light-emitting element.

Furthermore, since such a light-emitting element can be formed in a film form, planar light emission can be easily obtained; thus, a large-area element utilizing planar light emission can be formed. This feature is difficult to obtain with point light sources typified by incandescent lamps and LEDs or linear light sources typified by fluorescent lamps. Thus, the light-emitting element also has great potential as a planar light source applicable to a lighting device and the like.

Light-emitting elements utilizing electroluminescence are broadly classified according to whether they use an organic compound or an inorganic compound as a light-emitting substance. In the case where an organic compound is used as a light-emitting substance, application of voltage to a light-emitting element causes injection of electrons and holes from a pair of electrodes into a layer including the light-emitting organic compound, and thus current flows. The light-emitting organic compound is put into an excited state when carriers (electrons and holes) injected recombine, and emits light in returning to a ground state from the excited state (electrons and holes recombine). The excited state formed by an organic compound can be a singlet excited state or a triplet excited state. Light emission from the singlet excited state is called fluorescence, and light emission from the triplet excited state is called phosphorescence.

In improving element characteristics of such a light-emitting element, there are many problems which depend on substances used for the light-emitting element. Therefore, improvement in an element structure, development of a substance, and the like have been extensively carried out in order to solve the problems. For example, a light-emitting element is disclosed in which a compound including an imidazophenanthridine ring is used as a phosphorescent dopant and a host compound (see Patent Document 1).

REFERENCE

Patent Document

[Patent Document 1] Japanese Published Patent Application No. 2010-215759

SUMMARY OF THE INVENTION

Although development of materials used for light-emitting elements has progressed as disclosed in Patent Document 1, there is room for improvement in many aspects such as emission characteristics, emission efficiency, synthesis efficiency, and reliability; thus, development of more excellent light-emitting elements has been needed.

Besides, the compound disclosed in Patent Document 1, in which an imidazophenanthridine ring and the 2-position of a dibenzofuran ring are bonded through an arylene group, is difficult to synthesize and put to practical use. Although Patent Document 1 describes various structures of general formulae of the compounds having an imidazophenanthridine ring as a basic skeleton, it does not show specific synthesis methods or the like of some of the compounds. Moreover, Patent Document 1 does not attest or suggest that the compounds were actually synthesized or evaluated.

In view of the above, an object of one embodiment of the present invention is to provide a novel organic compound with which the emission characteristics, emission efficiency, and reliability of a light-emitting element can be improved. Another object is to provide a light-emitting element including the organic compound. Other objects are to provide a light-emitting device, an electronic device, and a lighting device each including the light-emitting element.

One embodiment of the present invention is a light-emitting element which includes, between a cathode and an anode, a light-emitting layer containing an organic compound. In the organic compound, an imidazo[1,2-f]phenanthridine skeleton and a dibenzothiophene skeleton or a dibenzofuran skeleton are bonded through an arylene group.

The imidazo[1,2-f]phenanthridine skeleton with an electron-transport property and the dibenzothiophene skeleton or dibenzofuran skeleton with a hole-transport property are bonded through the arylene group, whereby the organic compound has a bipolar property to receive electrons and holes efficiently.

Another embodiment of the present invention is a light-emitting element which includes, between a cathode and an anode, a light-emitting layer containing a first organic compound and a second organic compound. In the first organic compound, an imidazo[1,2-f]phenanthridine skeleton and a dibenzothiophene skeleton or a dibenzofuran skeleton are bonded through an arylene group. The second organic compound is an organometallic iridium complex.

A further embodiment of the present invention is a light-emitting element which includes, between a cathode and an anode, a light-emitting layer containing a first organic compound, a second organic compound, and a third organic compound. In the first organic compound, an imidazo[1,2-f]phenanthridine skeleton and a dibenzothiophene skeleton or a dibenzofuran skeleton are bonded through an arylene group. The second organic compound is an organometallic iridium complex. The third organic compound is a hole-transport material without an amine skeleton. Although the use of a hole-transport material with an amine skeleton as the third organic compound can improve a hole-transport property, such a hole-transport material with an amine skeleton has a low triplet excitation energy level and thus causes quenching of triplet excitation energy of the second organic compound which contributes to light emission, so that emission efficiency is reduced.

In the above structure, it is preferable that an electron-transport layer be provided in contact with the light-emitting layer on the cathode side and the electron-transport layer contain the above organic compound or the first organic compound. When the organic compound of one embodiment of the present invention is used for not only the light-emitting layer but also the electron-transport layer, emission characteristics of the light-emitting element can be further improved.

In each of the above structures, it is preferable that a hole-transport layer be provided in contact with the light-emitting layer on the anode side and the hole-transport layer contain a hole-transport material without an amine skeleton. It is further preferable that the hole-transport material have a carbazole skeleton. In the case where the hole-transport layer contains a hole-transport material with an amine skeleton, the low triplet excitation energy level causes quenching of triplet excitation energy of the second organic compound which contributes to light emission, so that emission efficiency is reduced. In contrast, the hole-transport material with a carbazole skeleton has a high triplet excitation energy level to prevent the problem of quenching, and is therefore favorably used.

Further, in each of the above structures, it is further preferable that the 4-position of the dibenzothiophene skeleton or dibenzofuran skeleton be bonded to the arylene group. In that case, the synthesis can be simplified.

Further, in each of the above structures, it is further preferable that the 7-position of the imidazo[1,2-f] phenanthridine skeleton be bonded to the arylene group to provide a high triplet excitation energy level.

A still further embodiment of the present invention is a light-emitting element which includes, between a cathode and an anode, a light-emitting layer containing an organic compound represented by General Formula (G1). Note that the organic compound represented by General Formula (G1) is a useful, novel compound and is one embodiment of the present invention.

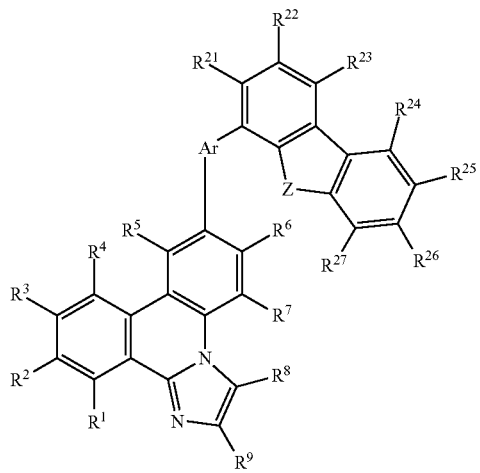

(G1)

In General Formula (G1), $R^1$ to $R^9$ and $R^{21}$ to $R^{27}$ separately represent hydrogen, an alkyl group having 1 to 4 carbon atoms, or a substituted or unsubstituted aryl group having 6 to 13 carbon atoms. Ar represents a substituted or unsubstituted arylene group having 6 to 13 carbon atoms. Z represents a sulfur atom or an oxygen atom.

In the above structure, Ar preferably represents a substituted or unsubstituted phenylene group or a substituted or unsubstituted biphenyldiyl group, and further preferably represents a substituted or unsubstituted m-phenylene group to obtain a high triplet excitation energy level.

A yet still further embodiment of the present invention is a light-emitting element which includes, between a cathode and an anode, a light-emitting layer containing an organic compound represented by General Formula (G2). Note that the organic compound represented by General Formula (G2) is a useful, novel compound and is one embodiment of the present invention.

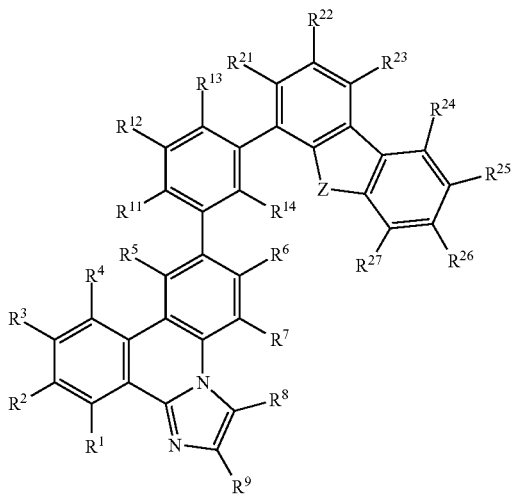

(G2)

In General Formula (G2), $R^1$ to $R^9$, $R^{11}$ to $R^{14}$, and $R^{21}$ to $R^{27}$ separately represent hydrogen, an alkyl group having 1 to 4 carbon atoms, or a substituted or unsubstituted aryl group having 6 to 13 carbon atoms. Z represents a sulfur atom or an oxygen atom.

The above-mentioned organic compound has a high triplet excitation energy level ($T_1$ level). Thus, the light-emitting element in which such an organic compound is used in the light-emitting layer can have high emission efficiency.

A light-emitting device including the light-emitting element with any of the above structures and an electronic device and a lighting device each including the light-emitting device are also included in the scope of one embodiment of the present invention. That is, the light-emitting device in this specification refers to an image display device or a light source (including a lighting device). In addition, the light-emitting device includes, in its category, all of a module in which a connector such as a flexible printed circuit (FPC) or a tape carrier package (TCP) is connected to a light-emitting device, a module in which a printed wiring board is provided on the tip of a TCP, and a module in which an integrated circuit (IC) is directly mounted on a light-emitting element by a chip on glass (COG) method.

According to one embodiment of the present invention, it is possible to provide a novel organic compound with which the emission characteristics, emission efficiency, and reliability of a light-emitting element can be improved. Furthermore, according to one embodiment of the present invention, a light-emitting element including the organic compound can be provided. According to the embodiments of the present invention, a light-emitting device, an electronic device, and a lighting device each including the light-emitting element can be provided.

DETAILED DESCRIPTION OF THE INVENTION

Hereinafter, embodiments of the present invention will be described in detail with reference to the accompanying drawings. Note that the present invention is not limited to the following description, and it will be easily understood by those skilled in the art that the mode and detail can be modified in various ways without departing from the spirit and scope of the present invention. Therefore, the present invention should not be construed as being limited to the description in the following embodiments.

Embodiment 1

In this embodiment, a light-emitting element which includes a light-emitting layer between a cathode and an anode will be described with reference to FIG. 1.

Figure 1:
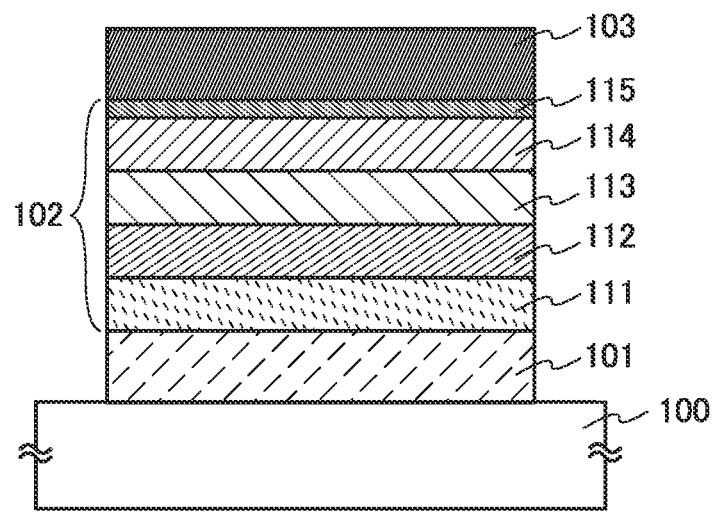
FIG. 1 illustrates a light-emitting element of one embodiment of the present invention.

As illustrated in FIG. 1, the light-emitting element in this embodiment includes an EL layer 102 between a first electrode 101 and a second electrode 103. The EL layer 102 includes at least a light-emitting layer 113 and also includes a hole-injection layer 111, a hole-transport layer 112, an electron-transport layer 114, an electron-injection layer 115, and the like. Note that in this embodiment, the first electrode 101 is used as an anode and the second electrode 103 is used as a cathode.

The light-emitting layer 113 contains an organic compound in which an imidazo[1,2-f]phenanthridine skeleton and a dibenzothiophene skeleton or a dibenzofuran skeleton are bonded through an arylene group.

The imidazo[1,2-f]phenanthridine skeleton with an electron-transport property and the dibenzothiophene skeleton or dibenzofuran skeleton with a hole-transport property are bonded through the arylene group, whereby the organic compound has a bipolar property to receive electrons and holes efficiently. In addition, the synthesis can be simplified when the 4-position of the dibenzothiophene skeleton or dibenzofuran skeleton is bonded to the arylene group.

The hole-injection layer 111 included in the EL layer 102 is a layer containing a substance having a high hole-transport property and an acceptor substance. When electrons are removed from the substance having a high hole-transport property owing to the acceptor substance, holes acting as a carrier are generated. Thus, holes are injected from the hole-injection layer 111 into the light-emitting layer 113 through the hole-transport layer 112.

The electron-injection layer 115 included in the EL layer 102 is a layer containing a substance having a high electron-transport property and a donor substance. When electrons are donated to the substance having a high electron-transport property owing to the donor substance, electrons acting as a carrier are generated. Thus, electrons are injected from the electron-injection layer 115 into the light-emitting layer 113 through the electron-transport layer 114.

A specific example in which the light-emitting element described in this embodiment is manufactured is described below.

A substrate 100 is used as a support of the light-emitting element. For example, glass, quartz, plastic, or the like can be used for the substrate 100. A flexible substrate may be used. The flexible substrate is a substrate that can be bent, such as a plastic substrate made of, for example, polycarbonate, polyarylate, or poly(ether sulfone). Alternatively, a film (made of polypropylene, a polyester, poly(vinyl fluoride), poly(vinyl chloride), or the like), a film on which an inorganic substance is deposited by evaporation, or the like can be used. Note that a different substrate can be used as long as it can function as a support in a process of manufacturing the light-emitting element.

For the first electrode 101 and the second electrode 103, a metal, an alloy, an electrically conductive compound, a mixture thereof, and the like can be used. Specifically, indium oxide-tin oxide (ITO: indium tin oxide), indium oxide-tin oxide containing silicon or silicon oxide, indium oxide-zinc oxide, indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, examples of which are an alkali metal such as lithium (Li) or cesium (Cs) and an alkaline earth metal such as magnesium (Mg), calcium (Ca), or strontium (Sr), an alloy containing such an element, a rare earth metal such as europium (Eu) or ytterbium (Yb), an alloy containing such an element, graphene, and the like can be used. The first electrode 101 and the second electrode 103 can be formed by, for example, a sputtering method, an evaporation method (including a vacuum evaporation method), or the like.

As a substance with a high hole-transport property that is used for the hole-injection layer 111 and the hole-transport layer 112, a π-electron rich heteroaromatic compound (e.g., a carbazole derivative or an indole derivative) or an aromatic amine compound can be used. For example, the following substances can be used: a compound having an aromatic amine skeleton such as 4,4'-bis[N-(1-naphthyl)-N-phenylamino]biphenyl (abbreviation: NPB), N,N-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II).

In the above-mentioned substances, a compound having a carbazole skeleton is preferable because the compound is highly reliable and has a high hole-transport property to contribute to a reduction in driving voltage.

Furthermore, as a material that can be used for the hole-injection layer 111 and the hole-transport layer 112, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine](abbreviation: Poly-TPD) can be used.

A layer in which any of the substances with a high hole-transport property given above and a substance with an acceptor property are mixed is preferably used as the hole-injection layer 111 and the hole-transport layer 112, in which case a favorable carrier-injection property is obtained. Examples of the acceptor substance to be used include a transition metal oxide such as an oxide of a metal belonging to any of Groups 4 to 8 of the periodic table. Specifically, molybdenum oxide is particularly preferable.

Although a compound with an amine skeleton is also given as a material which can be used for the hole-transport layer 112, it is preferable that the material used for the hole-transport layer 112 do not have an amine skeleton but have a carbazole skeleton.

In the case where the hole-transport layer 112 contains a hole-transport material with an amine skeleton, the low triplet excitation energy level causes quenching of triplet excitation energy of the second organic compound which contributes to light emission, so that emission efficiency is reduced. In contrast, the hole-transport material with a carbazole skeleton has a high triplet excitation energy level to prevent the problem of quenching, and is therefore favorably used.

The light-emitting layer 113 preferably contains, for example, an electron-transport material as a host material (a first organic compound), a light-emitting material which converts triplet excitation energy into light as a guest material (a second organic compound), and a hole-transport material as an assist material (a third organic compound). Note that a relation between the host material and the assist material is not limited to the above; an electron-transport material may be used as the assist material and a hole-transport material may be used as the host material.

Here, the organic compound of one embodiment of the present invention can be used as the host material (the first organic compound). In the organic compound of one embodiment of the present invention, an imidazo[1,2-f] phenanthridine skeleton and a dibenzothiophene skeleton or a dibenzofuran skeleton are bonded through an arylene group. That is, the organic compound of one embodiment of the present invention is an organic compound represented by General Formula (G1).

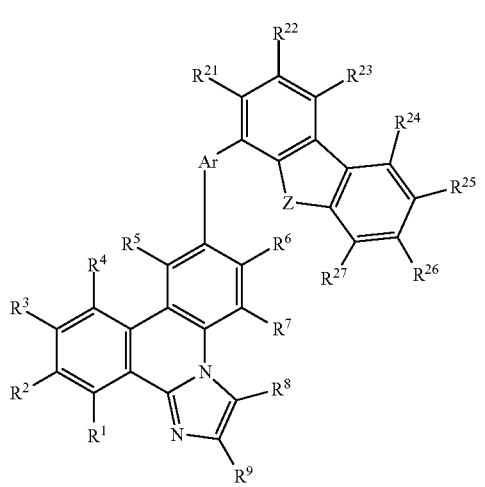

(G1)

In General Formula (G1), $R^1$ to $R^9$ and $R^{21}$ to $R^{27}$ separately represent hydrogen, an alkyl group having 1 to 4 carbon atoms, or a substituted or unsubstituted aryl group having 6 to 13 carbon atoms. Ar represents a substituted or unsubstituted arylene group having 6 to 13 carbon atoms. Z represents a sulfur atom or an oxygen atom.

By having the dibenzothiophene skeleton or dibenzofuran skeleton that is a hole-transport skeleton as well as the imidazo[1,2-f]phenanthridine skeleton that is an electron-transport skeleton, the organic compound of one embodiment of the present invention can easily receive holes. Therefore, the use of the organic compound of one embodiment of the present invention as the host material in the light-emitting layer 113 facilitates recombination of electrons and holes. In addition, since the imidazo[1,2-f] phenanthridine skeleton and the dibenzothiophene skeleton or dibenzofuran skeleton are bonded through the arylene group in the above organic compound, a reduction in the band gap and a reduction in the triplet excitation energy level can be small as compared to those in the case where the skeletons are directly bonded. Moreover, the thermal property and the stability of film quality are improved. By the use of the organic compound for the light-emitting layer 113, an element with high current efficiency can be obtained.

In General Formula (G1), Ar preferably represents a substituted or unsubstituted phenylene group or a substituted or unsubstituted biphenyldiyl group, and further preferably represents a substituted or unsubstituted m-phenylene group. That is, the organic compound of one embodiment of the present invention is an organic compound represented by General Formula (G2).

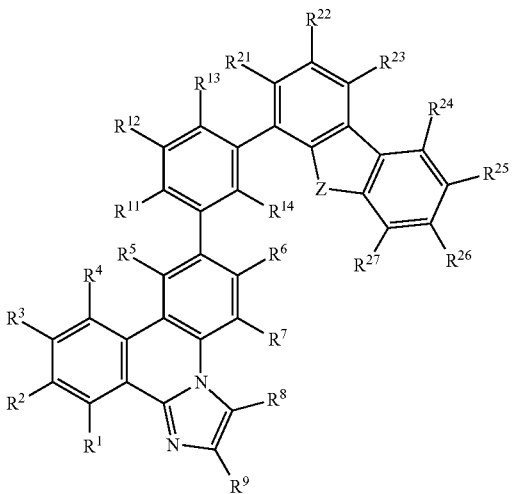

(G2)

In General Formula (G2), $R^1$ to $R^9$, $R^{11}$ to $R^{14}$, and $R^{21}$ to $R^{27}$ separately represent hydrogen, an alkyl group having 1 to 4 carbon atoms, or a substituted or unsubstituted aryl group having 6 to 13 carbon atoms. Z represents a sulfur atom or an oxygen atom.

Specific examples of the organic compound represented by General Formula (G1) are organic compounds represented by Structural Formulae (100) to (168) and Structural Formulae (200) to (268). However, it is to be noted that the present invention is not limited to these organic compounds.

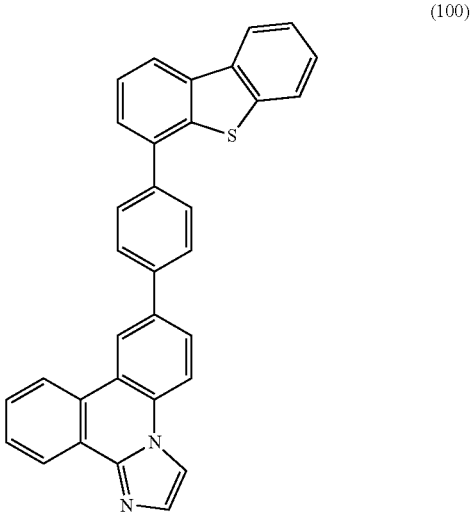

(100)

-continued
(101)
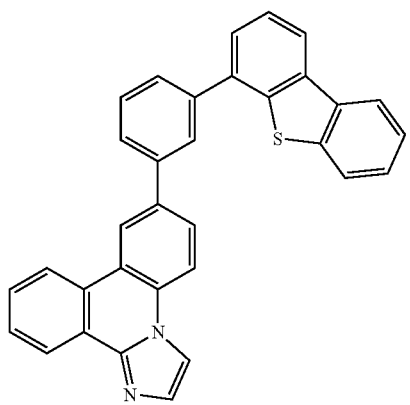
(102)
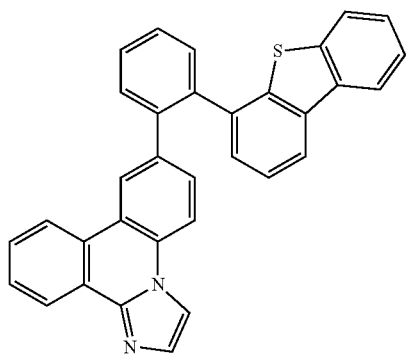
(103)
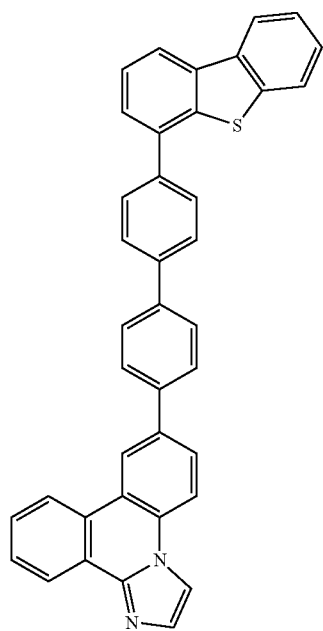
(104)
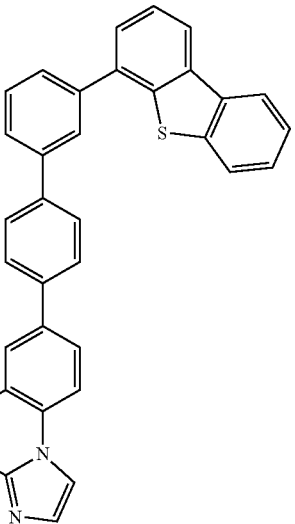
(105)
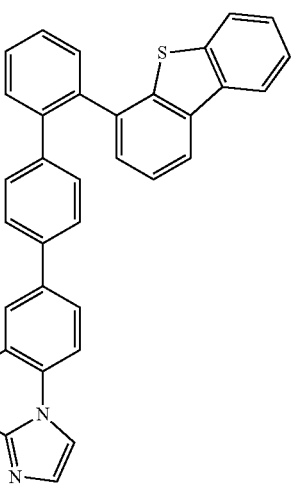
(106)
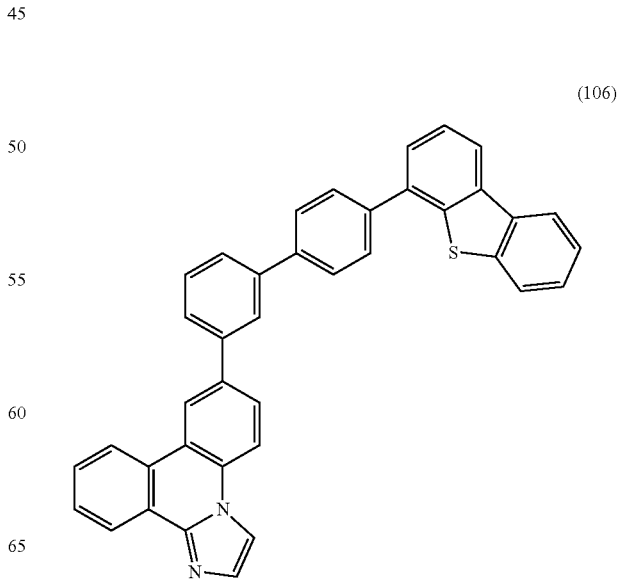

(107)
(108)
(109)
(110)
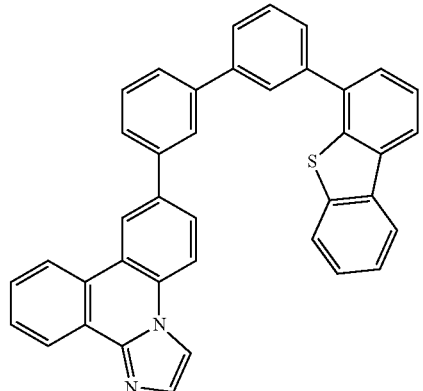
(111)
(112)
(113)
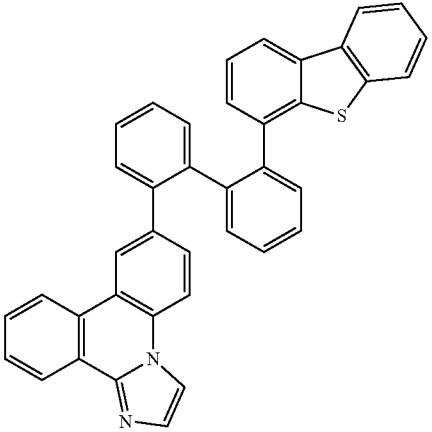
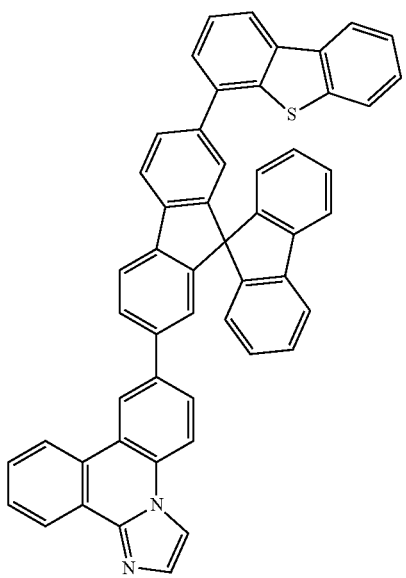
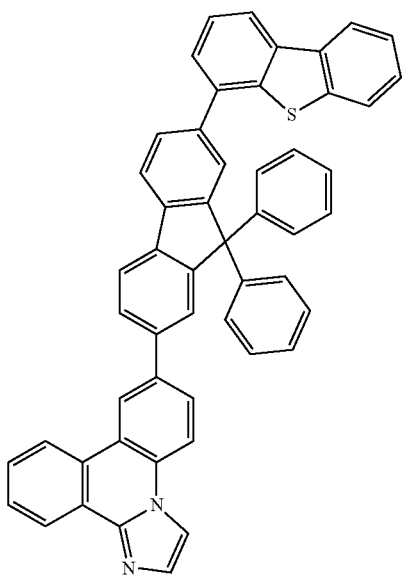

(114)
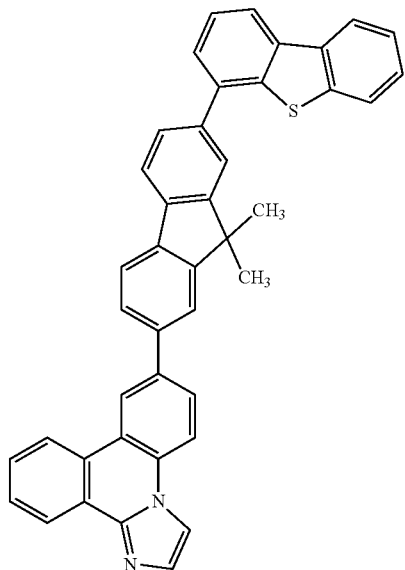
(115)
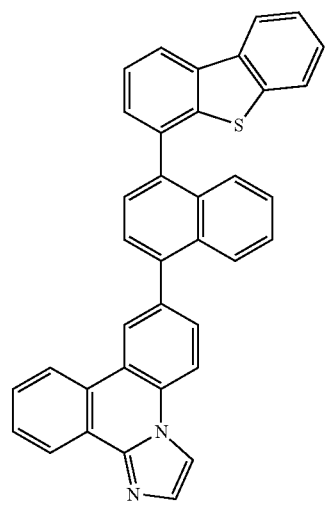
(116)
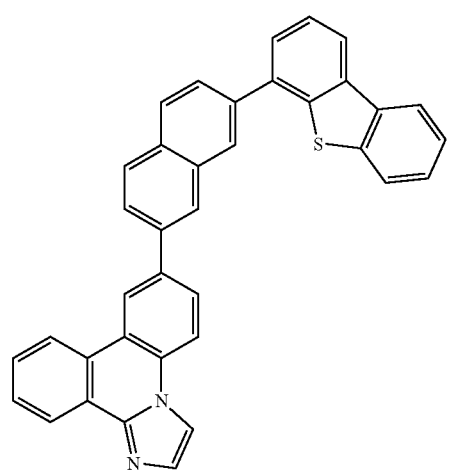
(117)
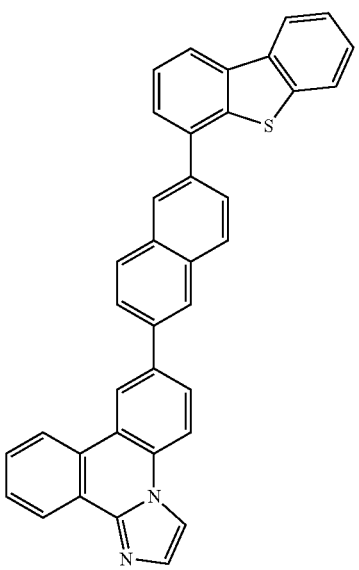
(118)
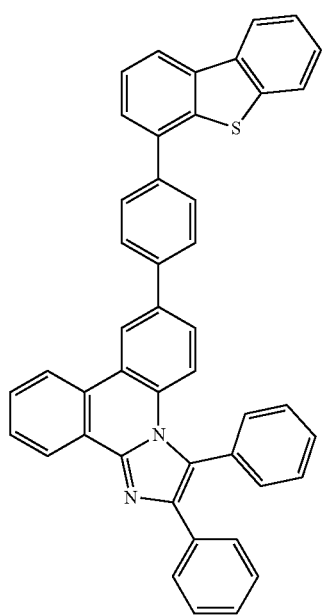

(119)
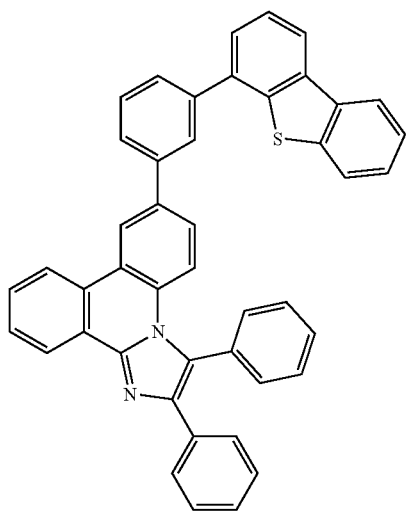
(121)
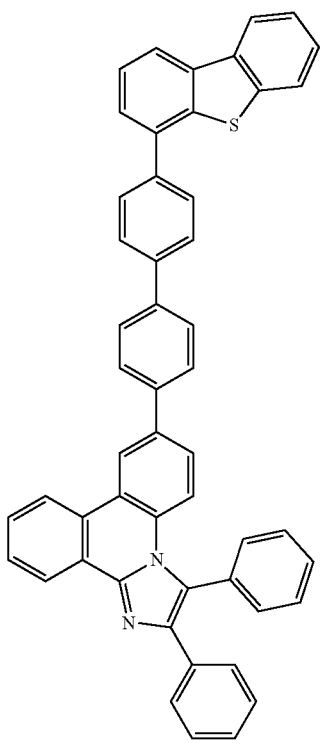
(120)
(122)
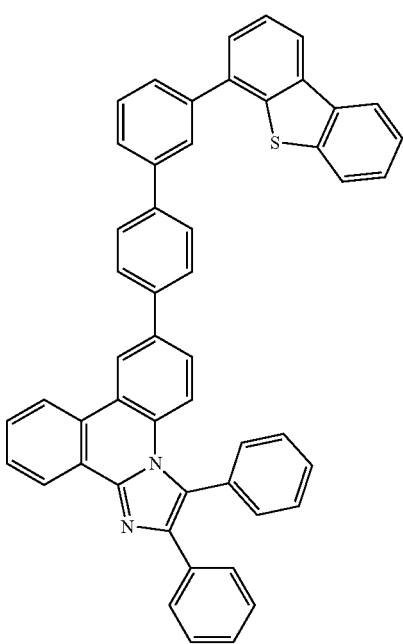

(123)
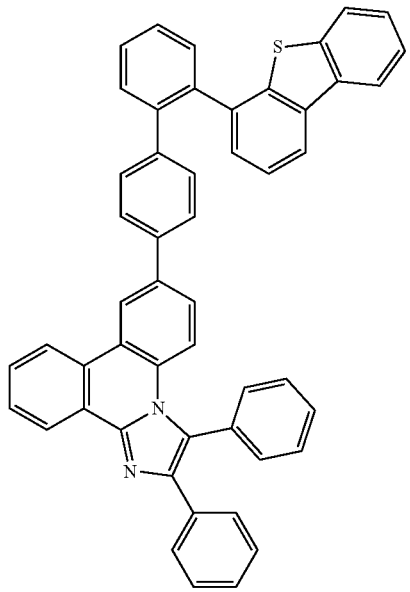
(124)
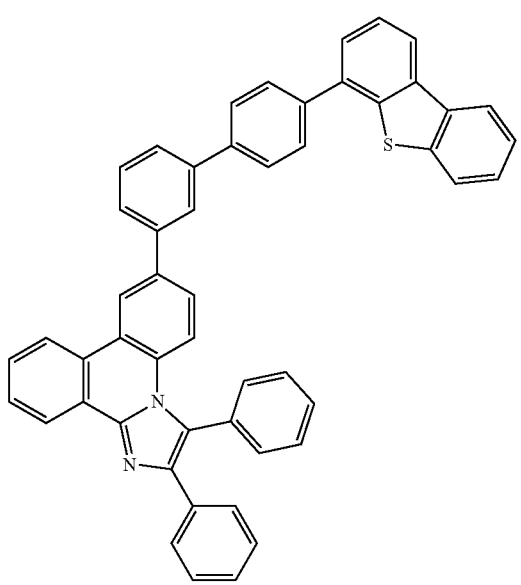
(125)
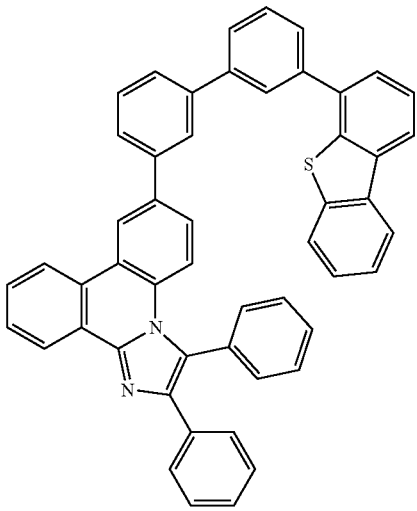
(126)
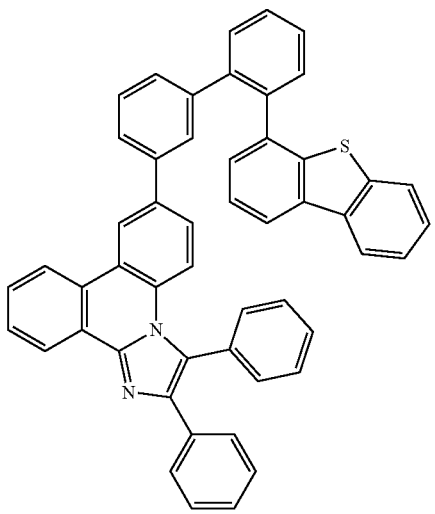
(127)
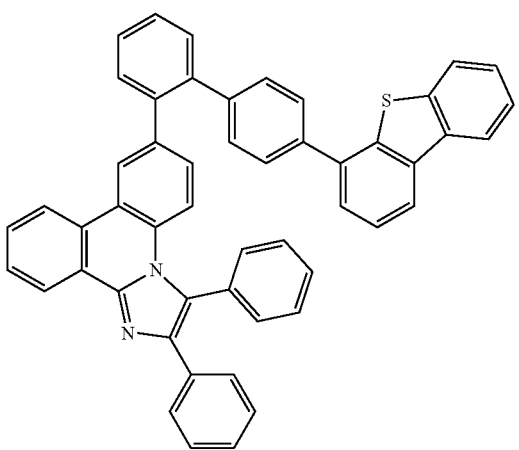

(128)
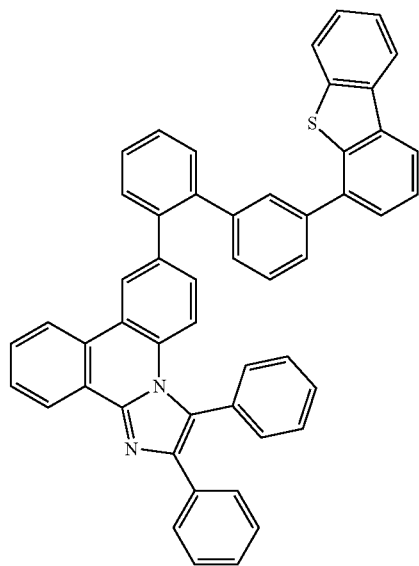
(129)
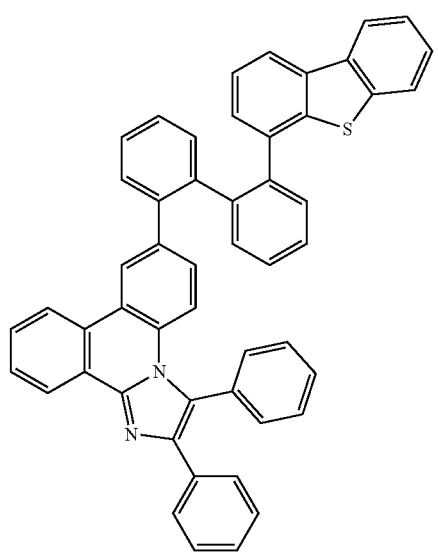
(130)
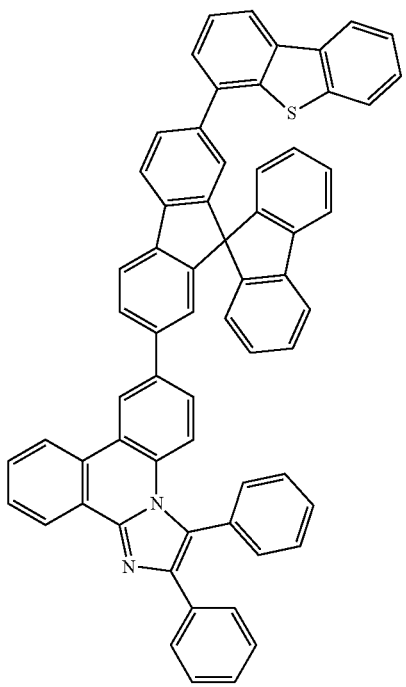
(131)
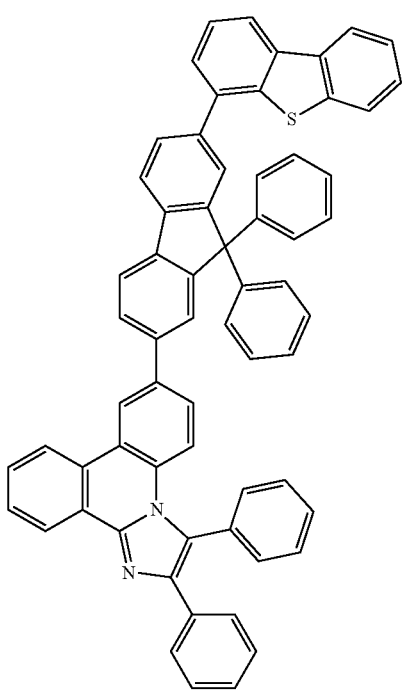

(132)
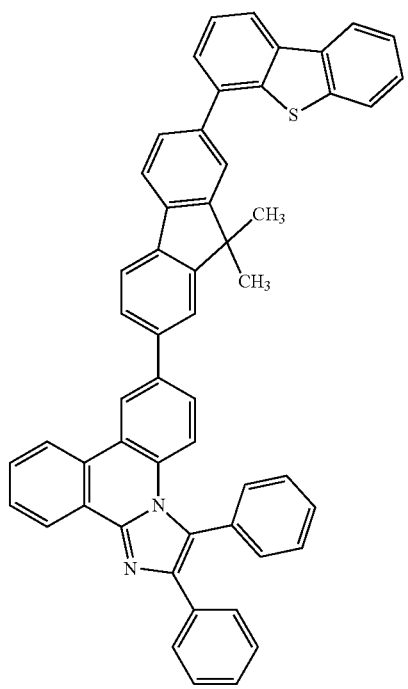
(133)
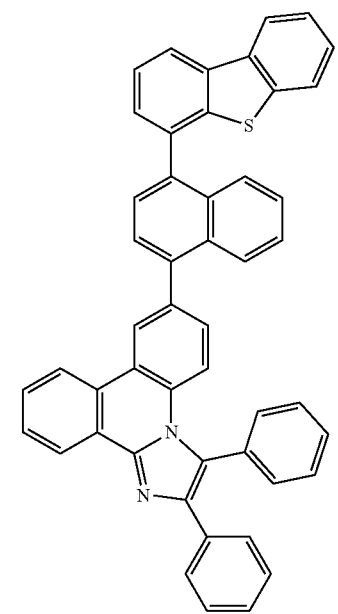
(134)
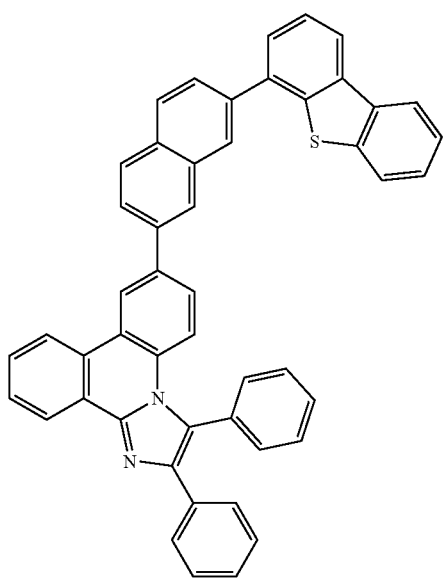
(135)
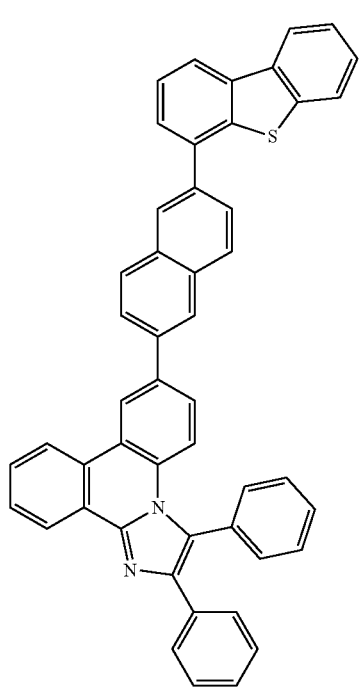
(136)
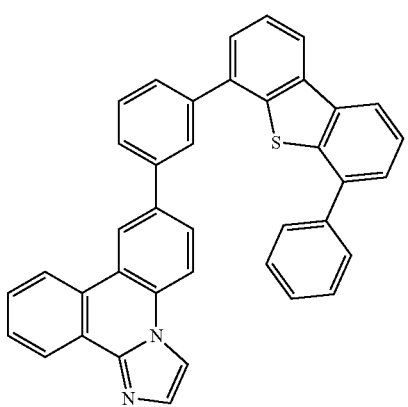

(137)
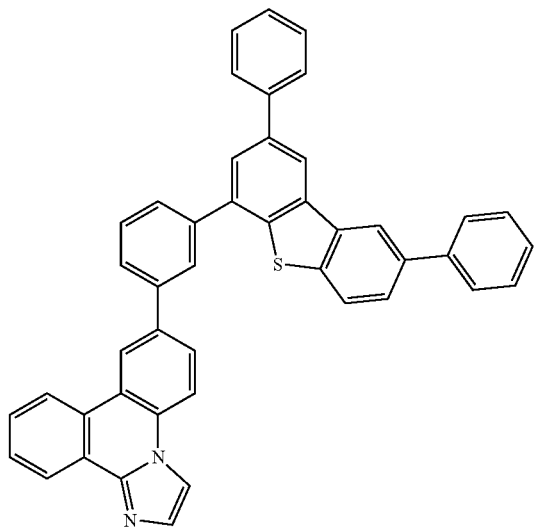
(138)
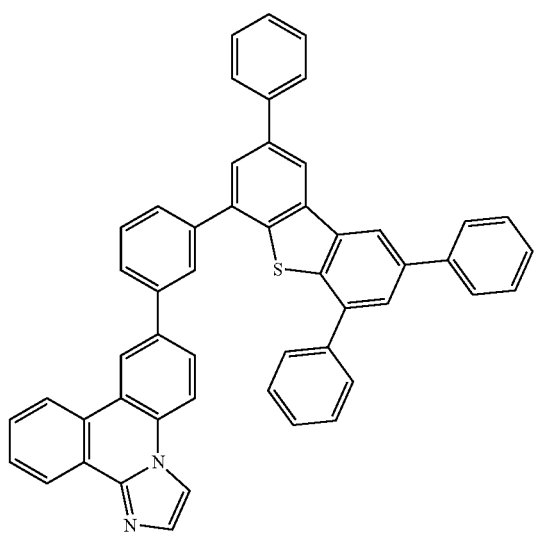
(139)
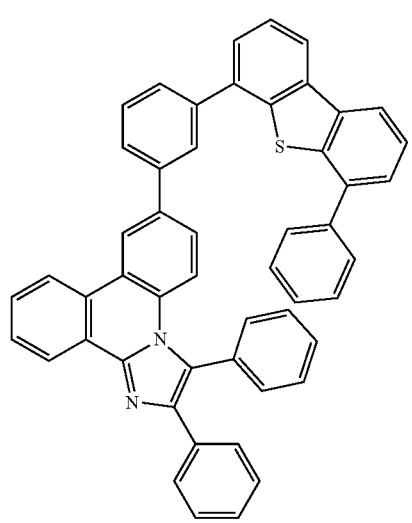
(140)
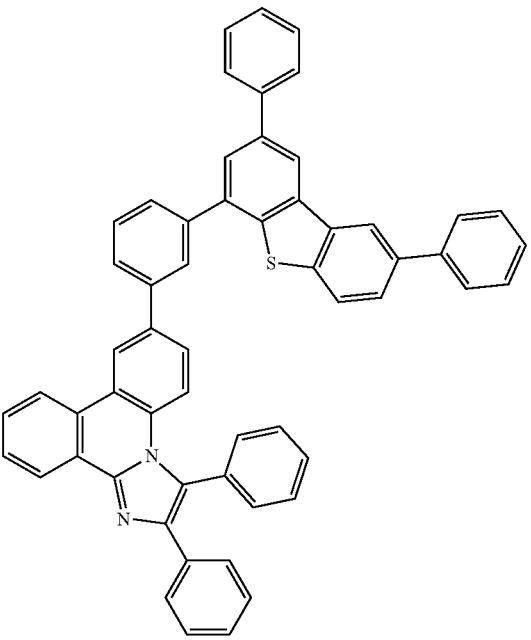
(141)
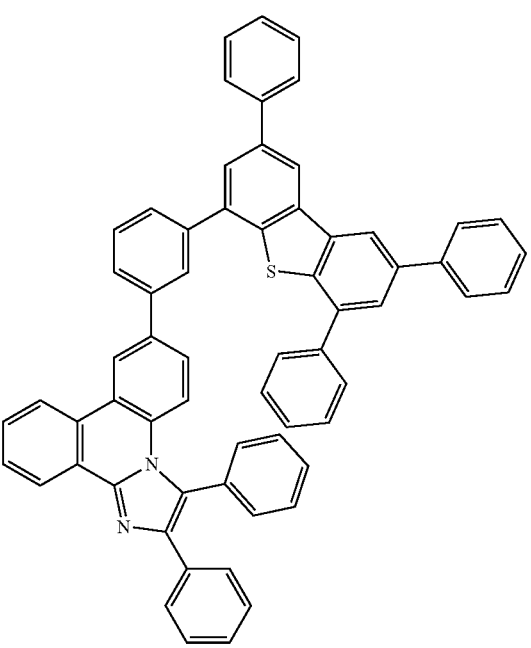

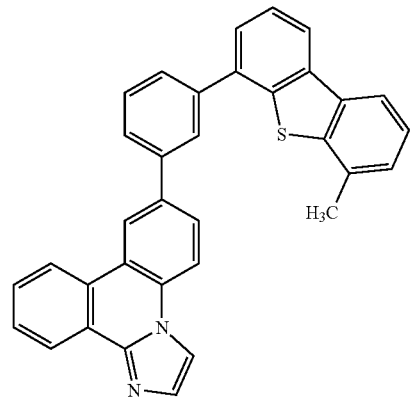
(142)
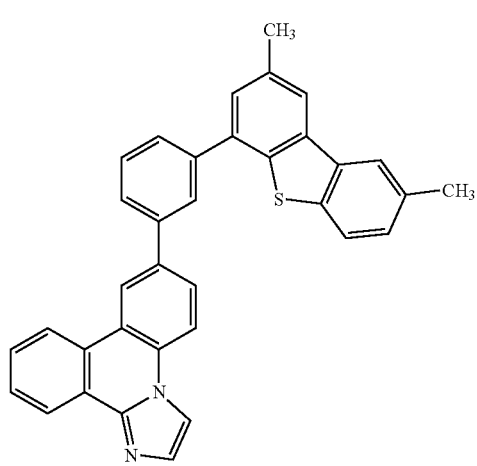
(143)
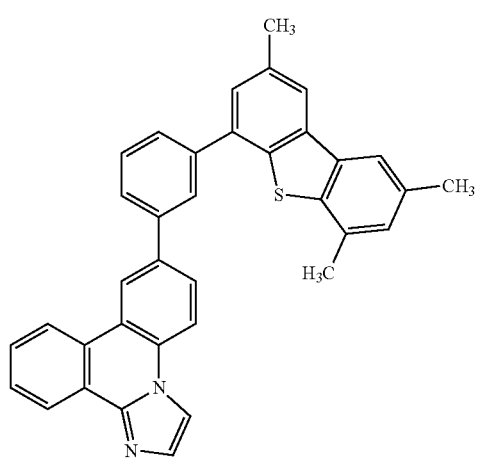
(144)
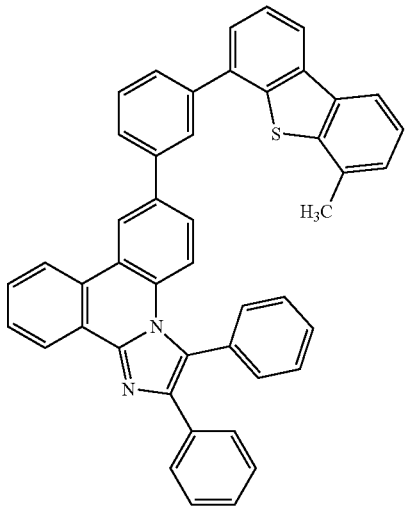
(145)
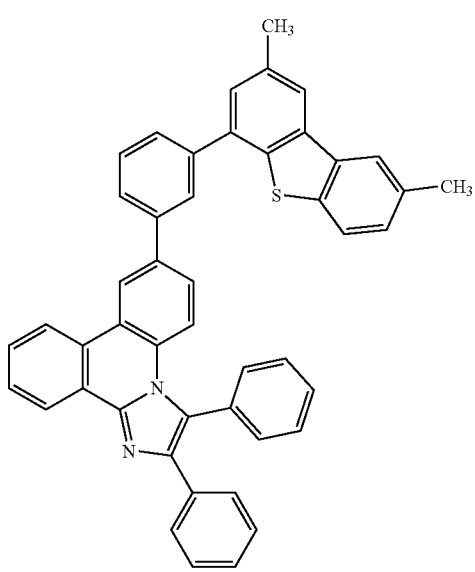
(146)
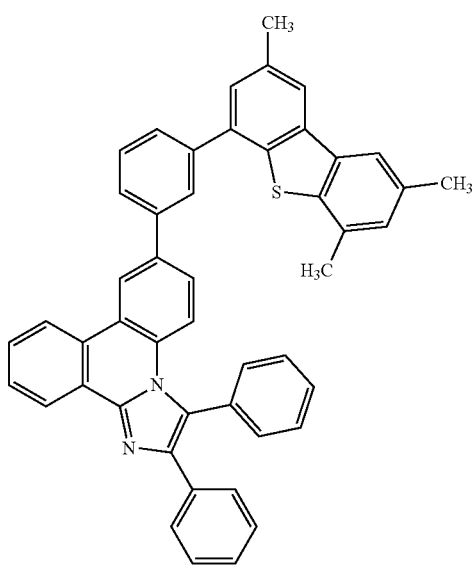
(147)

(148)
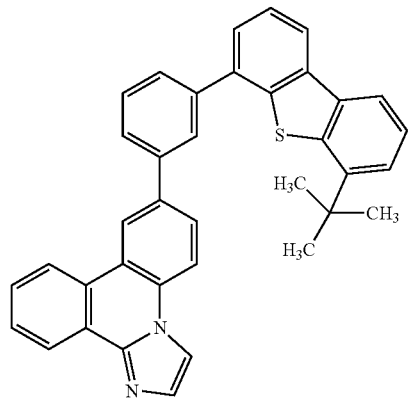
(151)
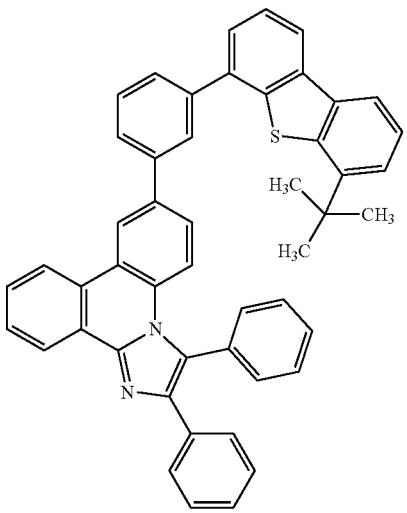
(149)
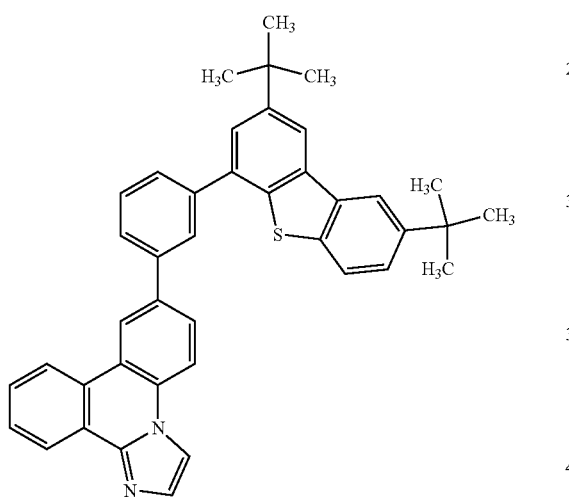
(150)
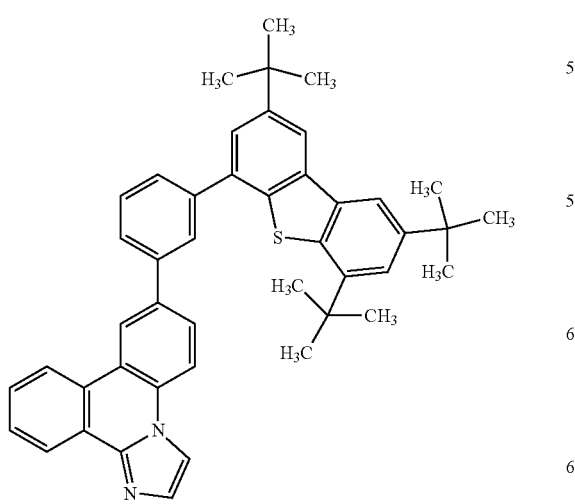
(152)
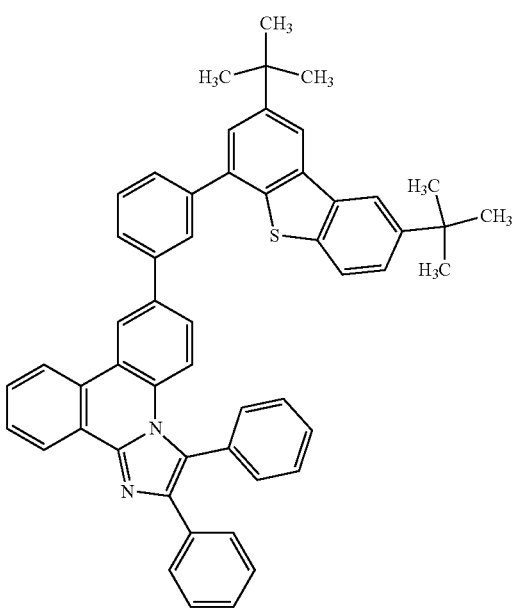

(153)
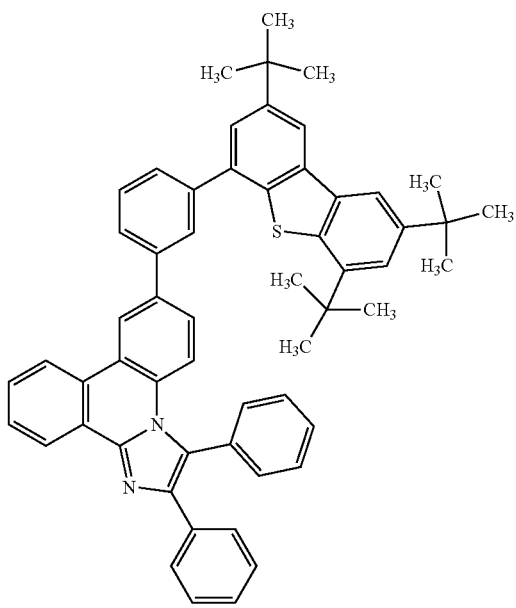
(154)
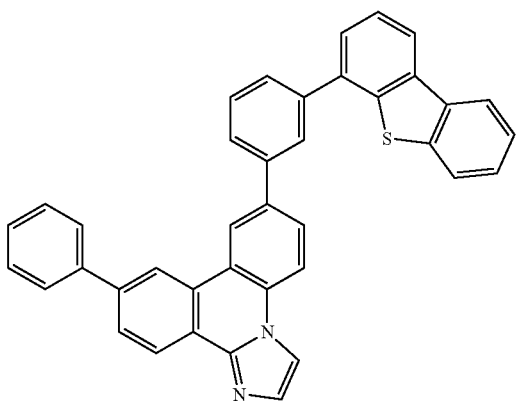
(155)
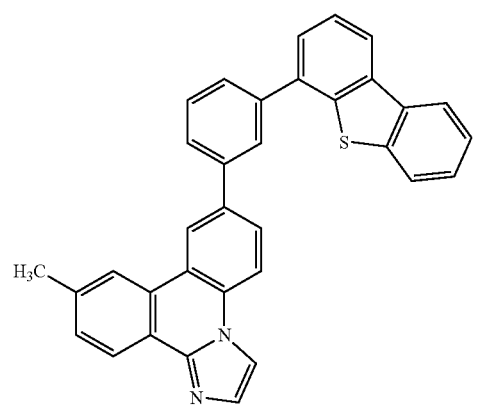
(156)
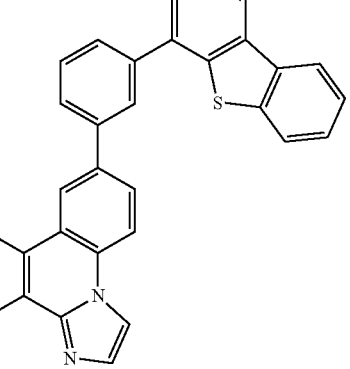
(157)
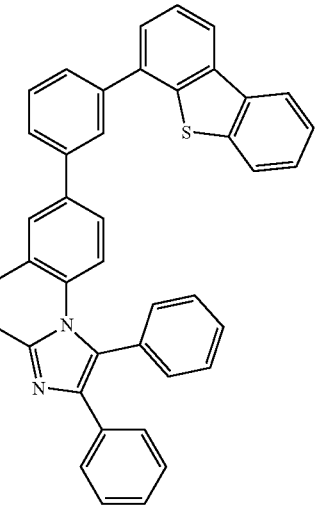
(158)
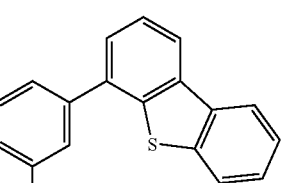
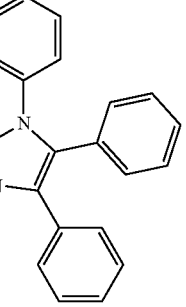

(159)
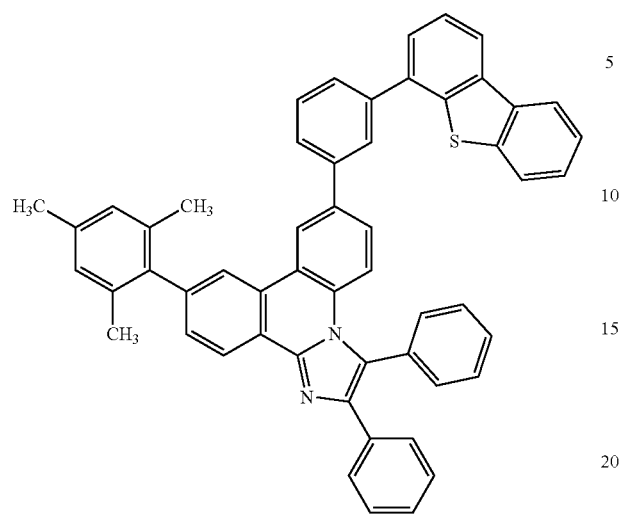
(160)
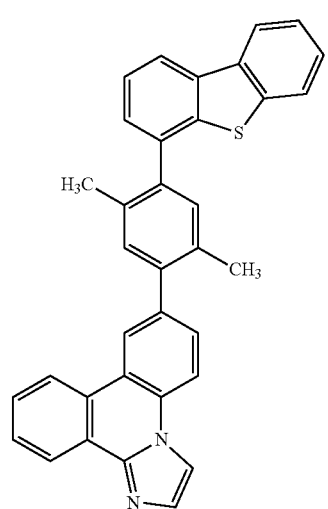
(161)
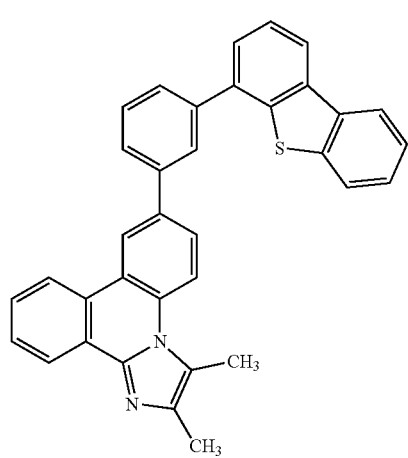
(162)
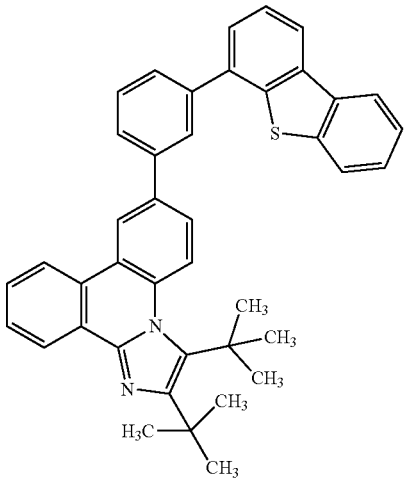
(163)
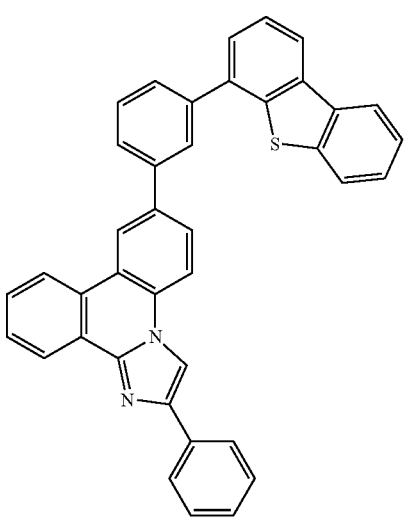
(164)
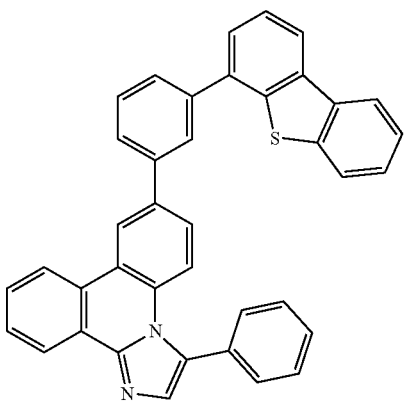

(165) 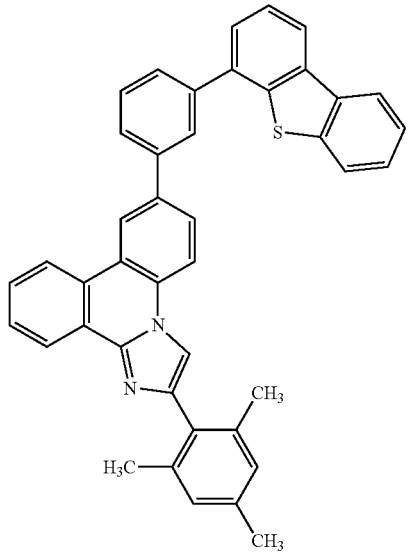
(166) 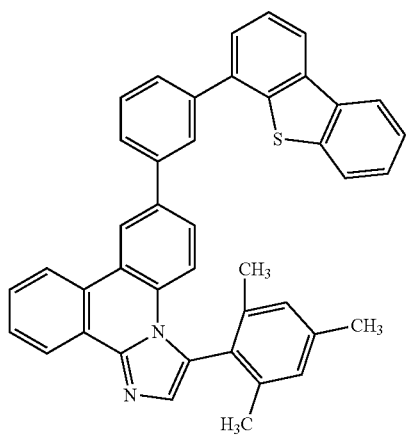
(167) 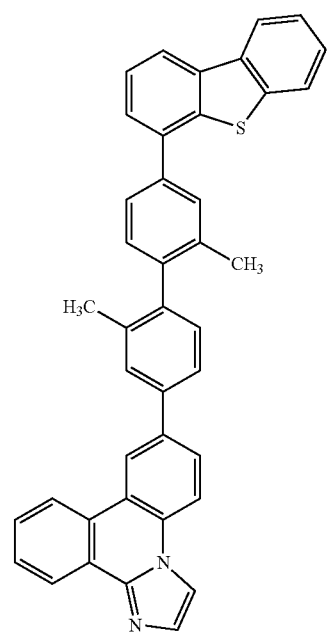
(168) 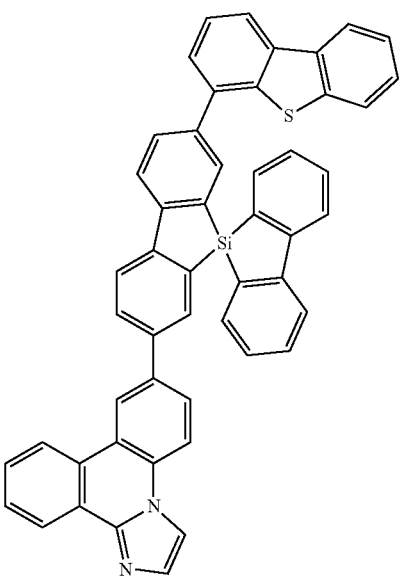
(200) 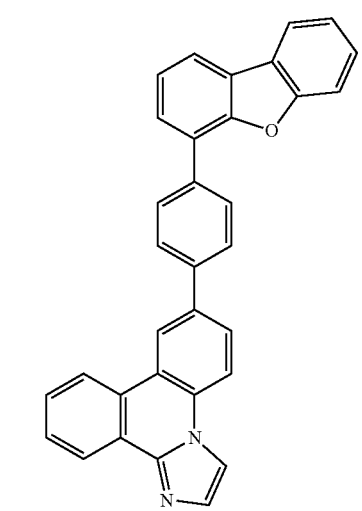
(201) 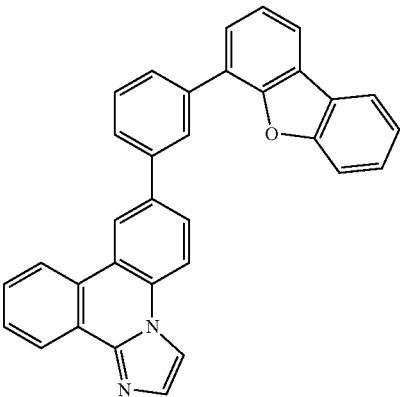

(202)
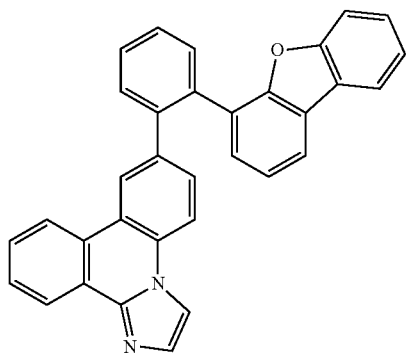
(203)
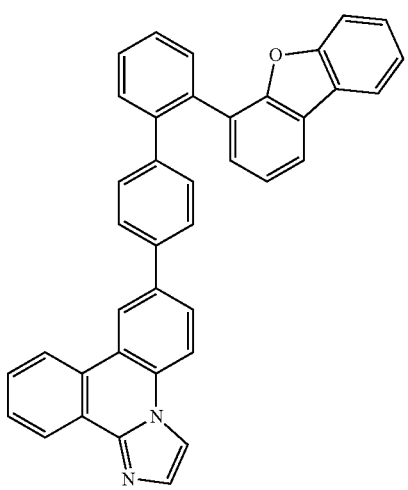
(204)
(205)
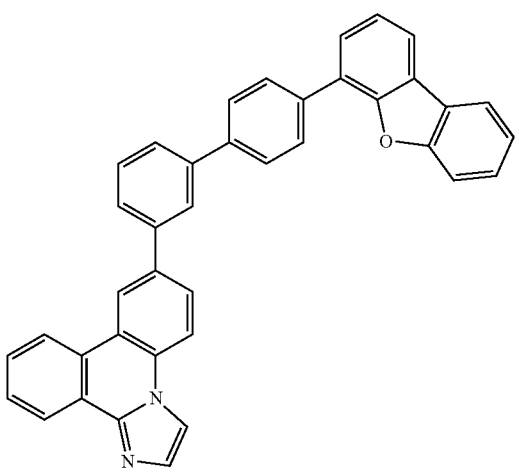
(206)
(207)
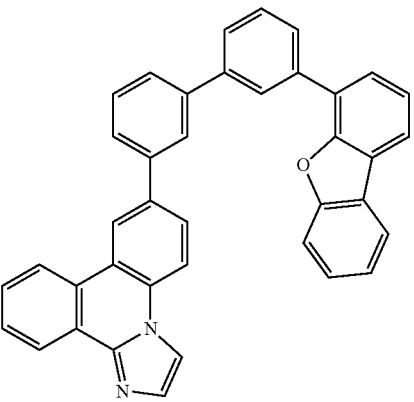

(208)
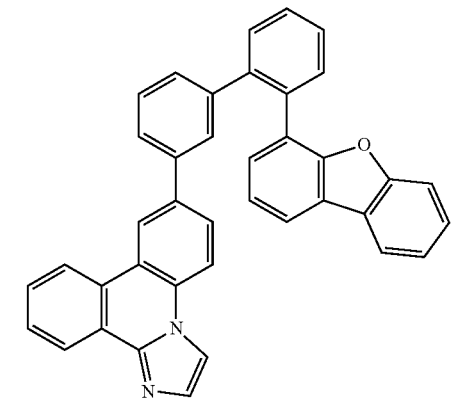
(209)
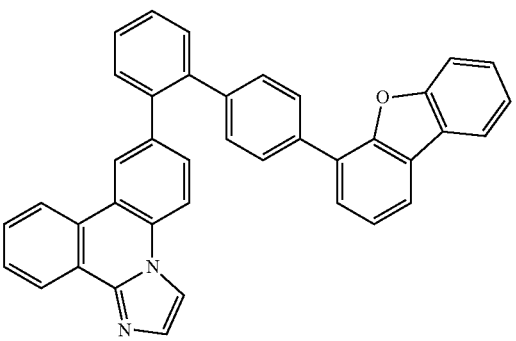
(210)
(211)
(212)
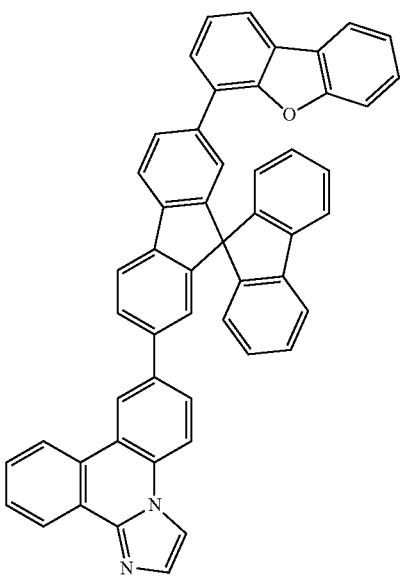
(213)
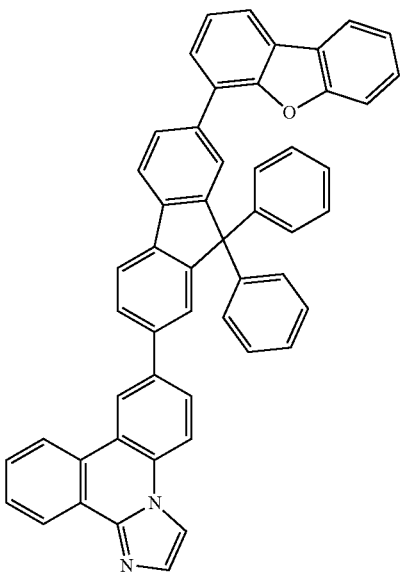

(214)
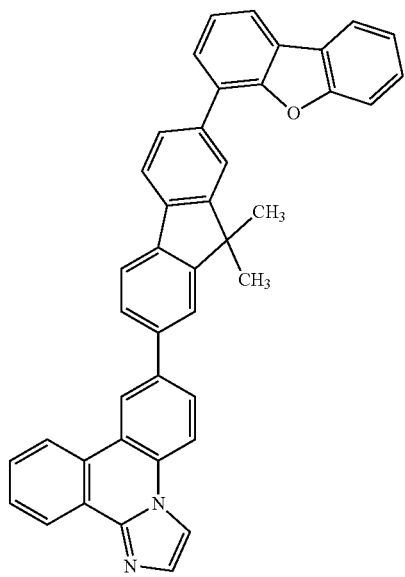
(215)
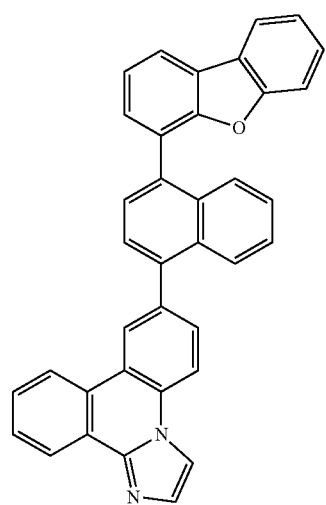
(216)
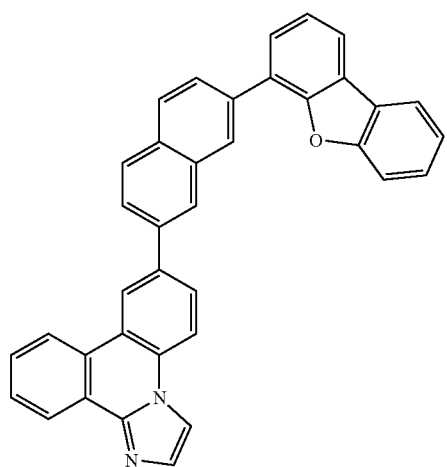
(217)
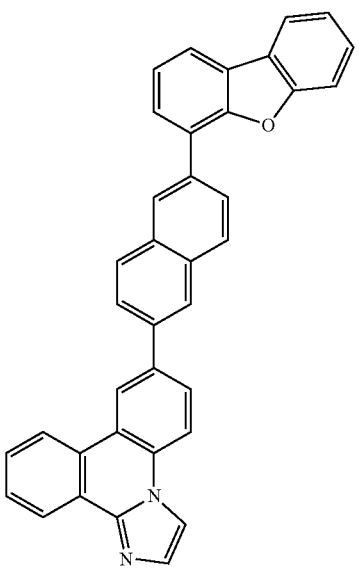
(218)
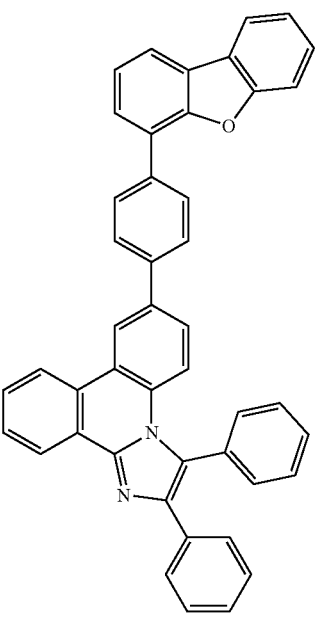

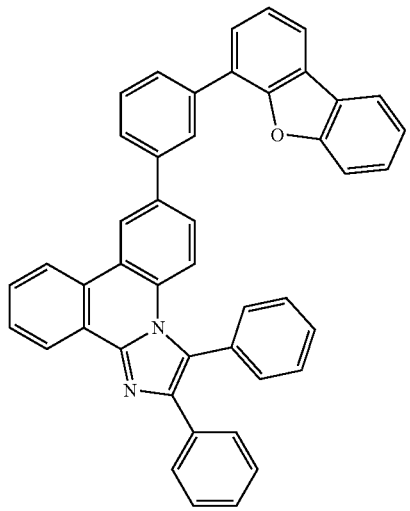
(219)
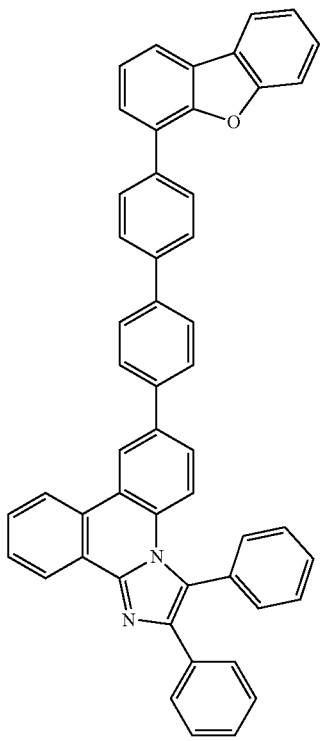
(221)
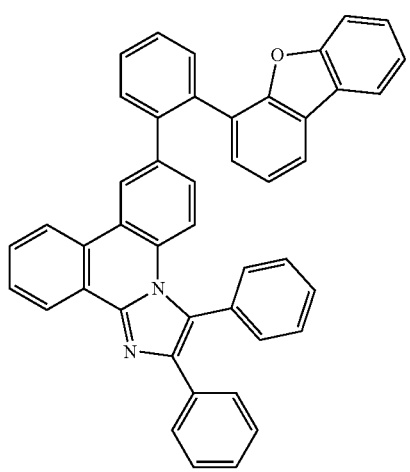
(220)
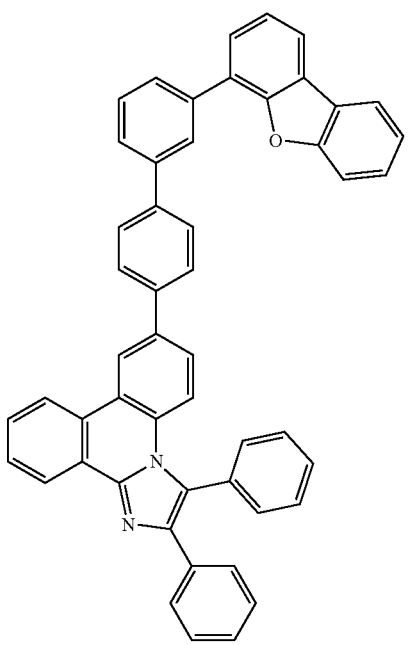
(222)

(223)
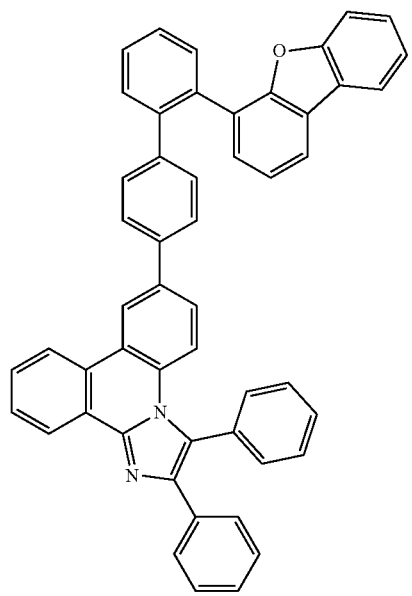
(224)
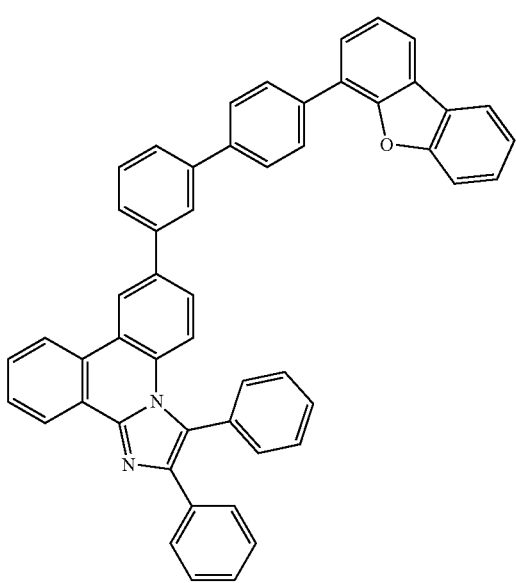
(225)
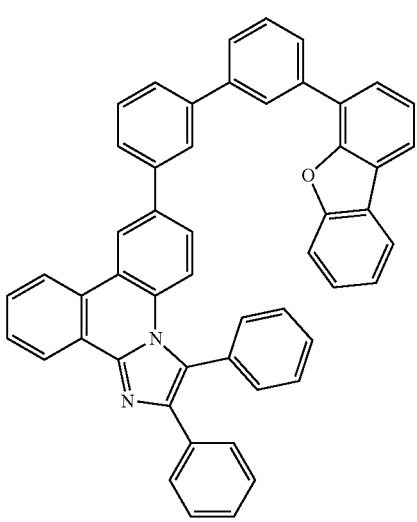
(226)
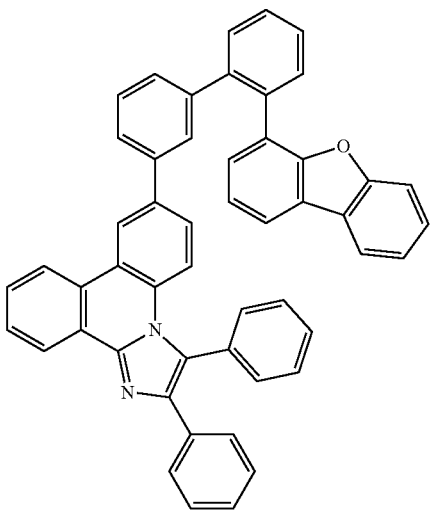
(227)
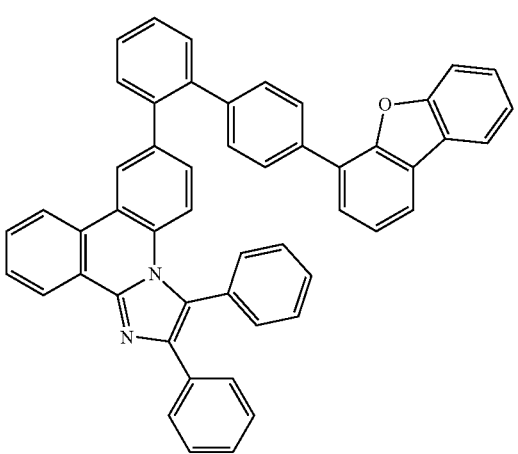

(228)
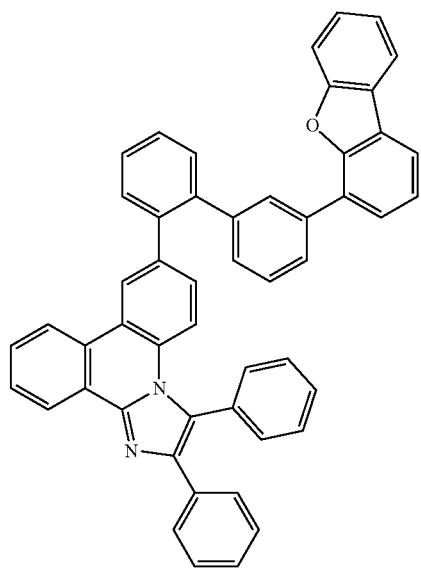
(229)
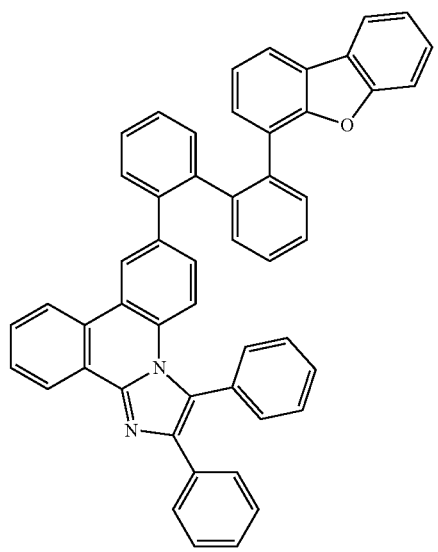
(230)
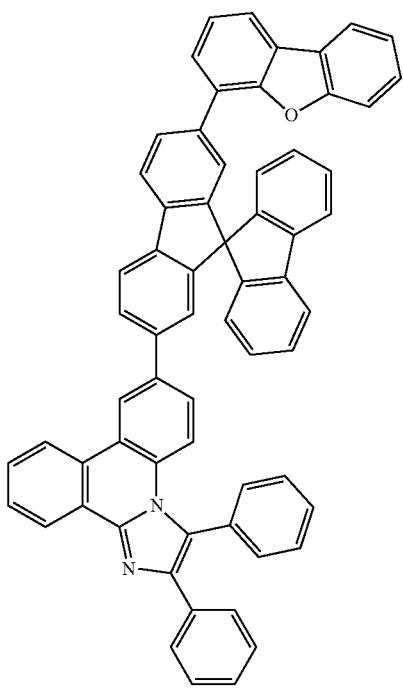
(231)
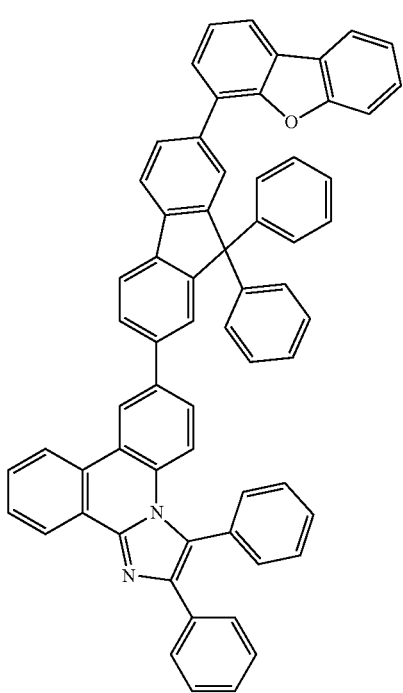

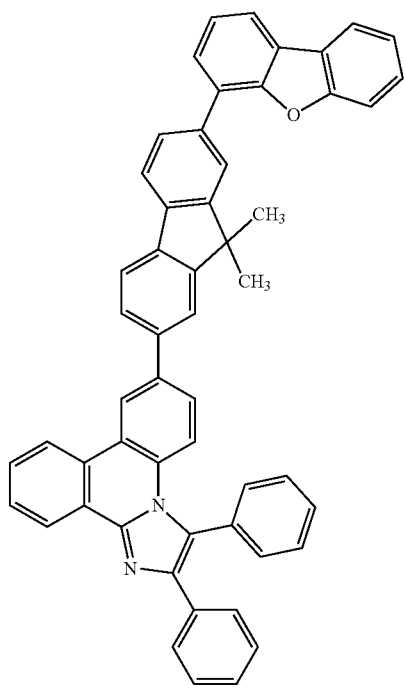
(232)
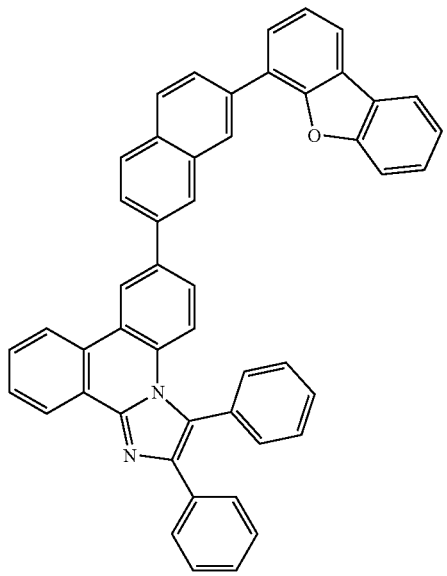
(234)
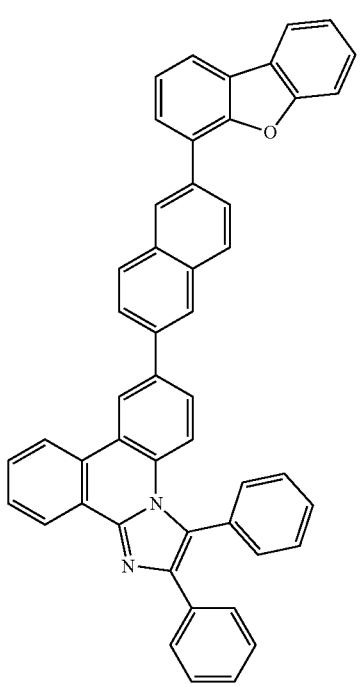
(235)
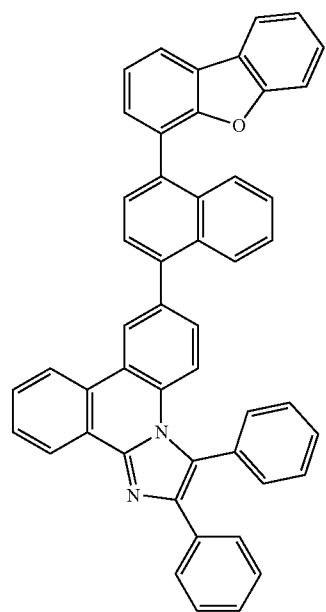
(233)
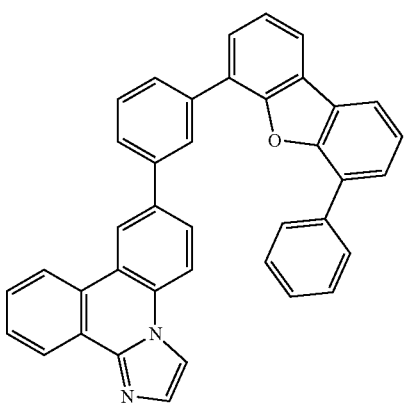
(236)

(237)
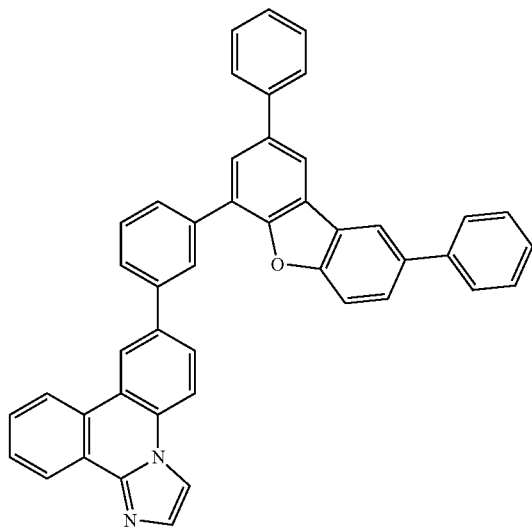
(238)
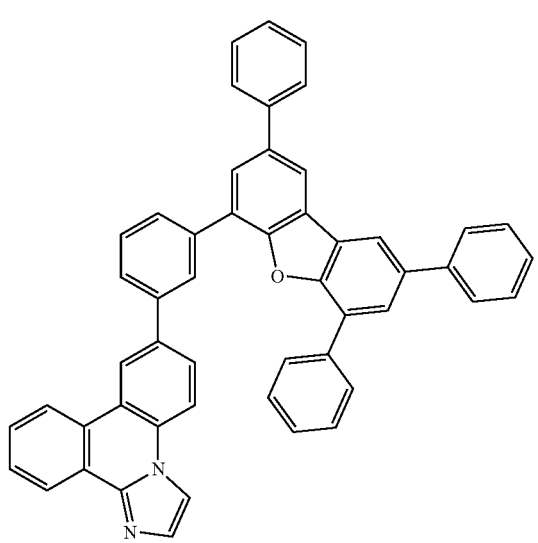
(239)
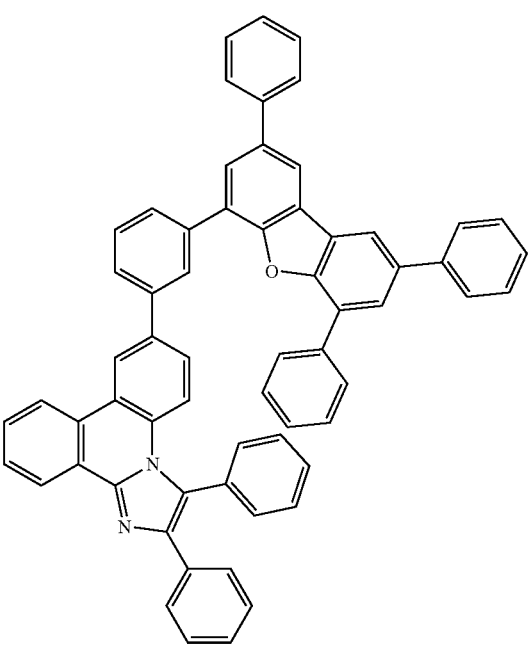
(240)
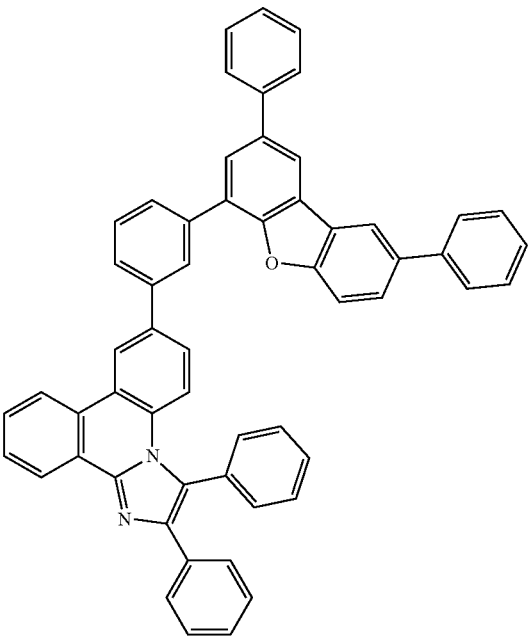
(241)

-continued
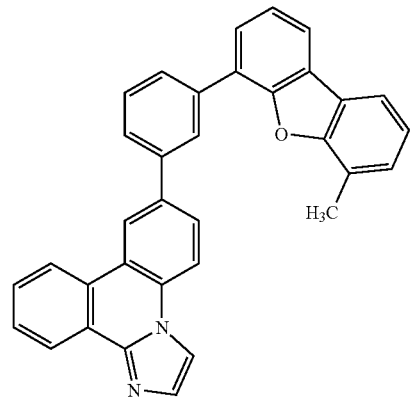
(242)
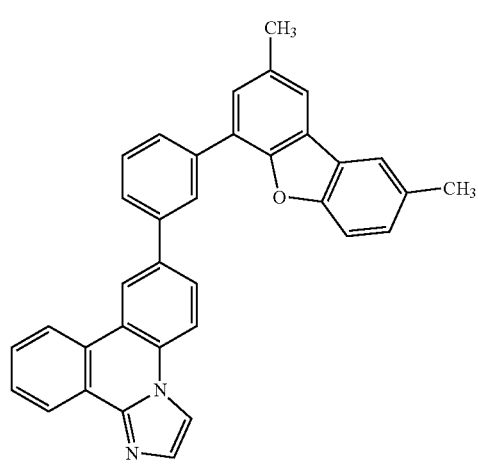
(243)
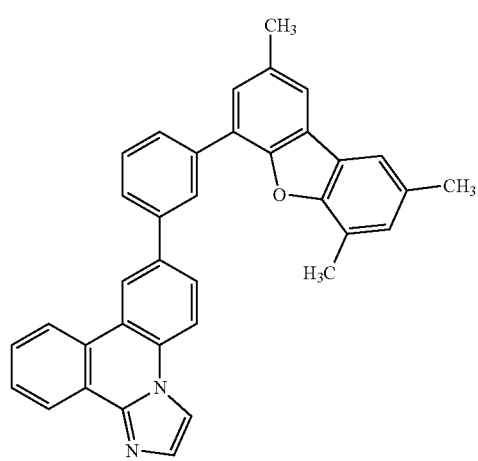
(244)
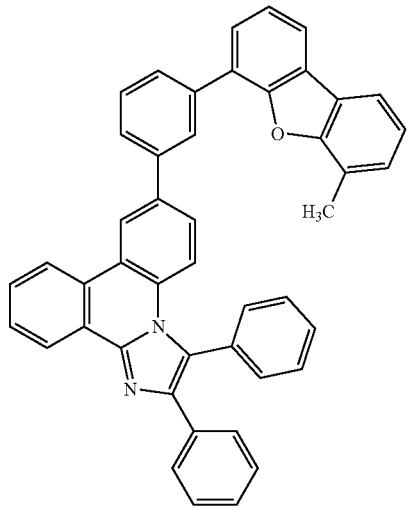
(245)
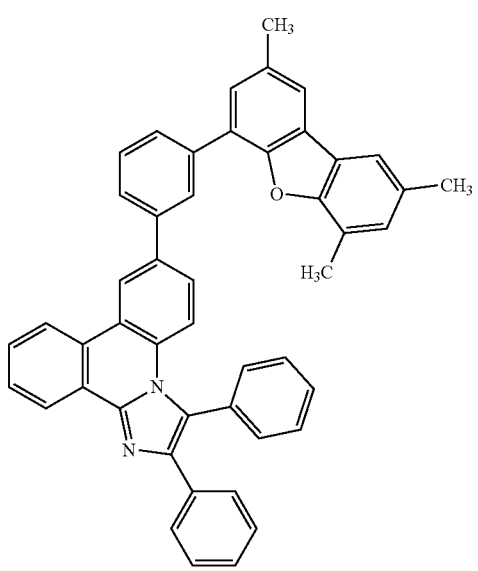
(246)
(247)

(248)
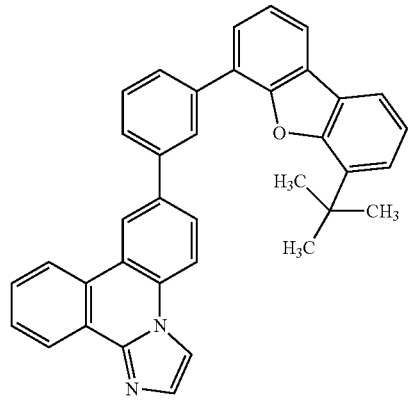
(249)
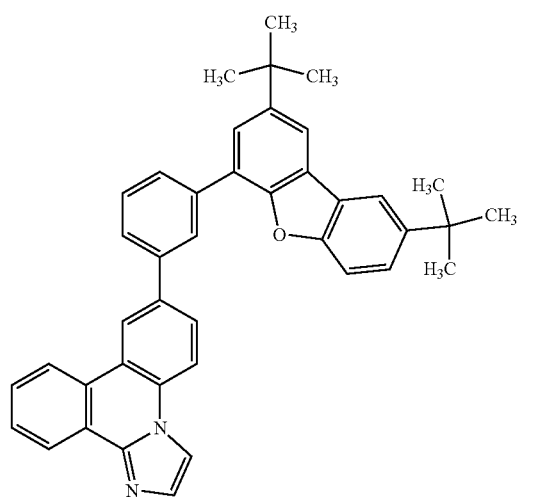
(250)
(251)
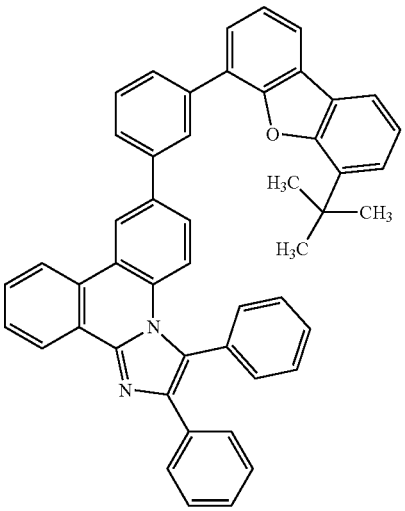
(252)
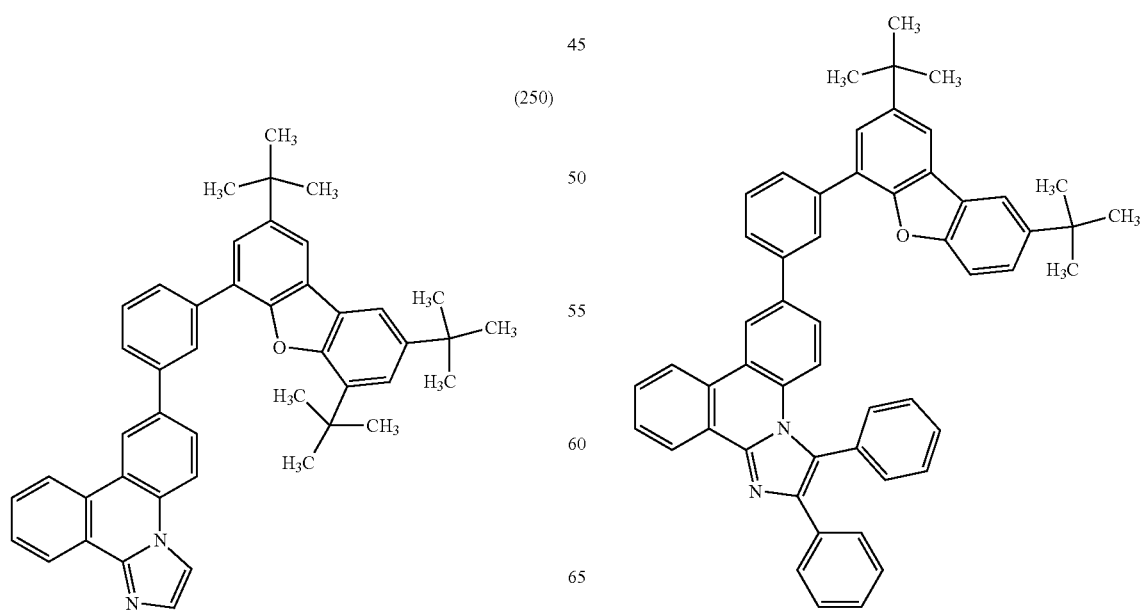

(253)
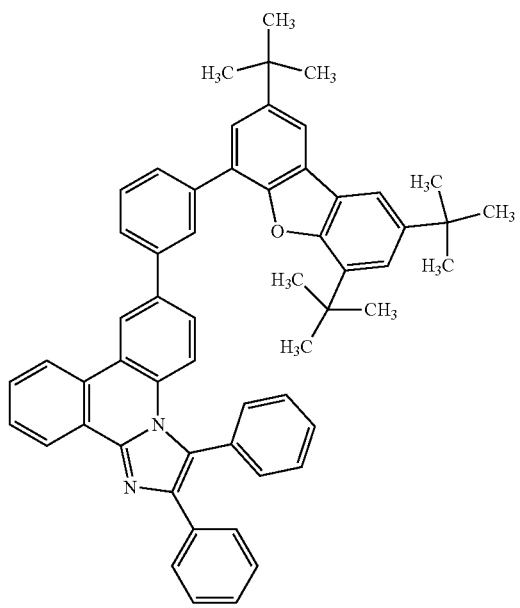
(254)
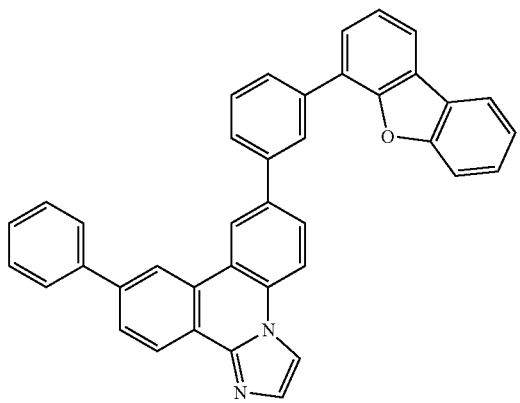
(255)
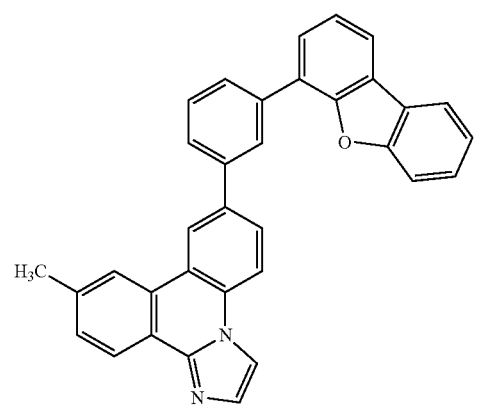
(256)
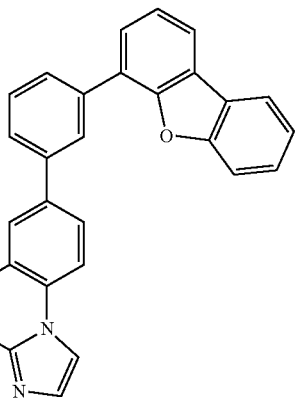
(257)
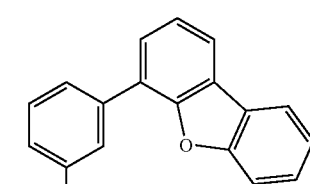
(258)
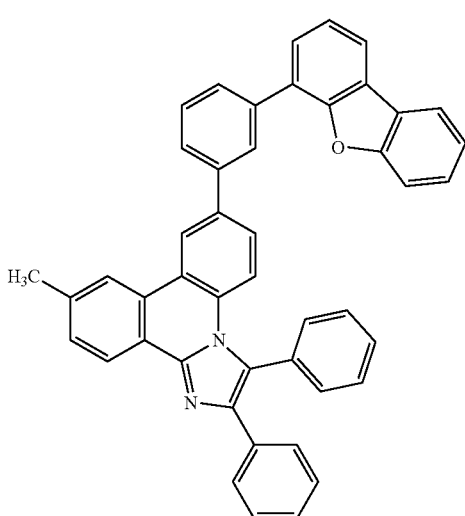

(259)
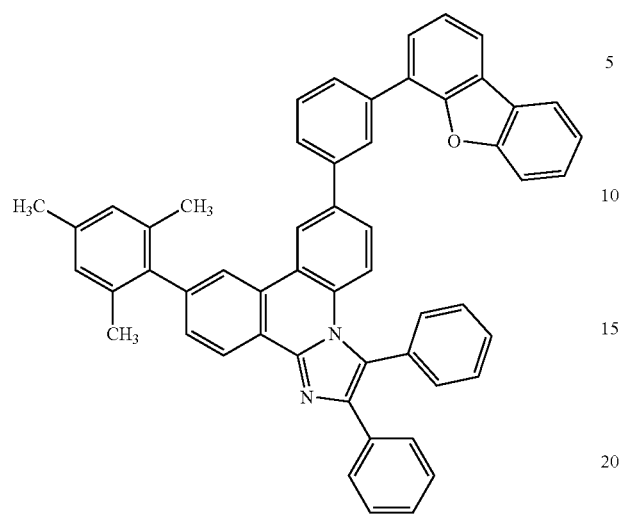
(262)
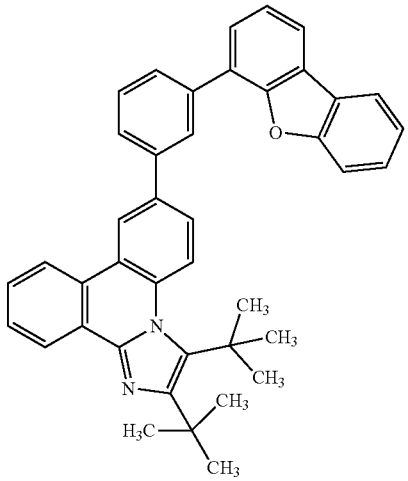
(260)
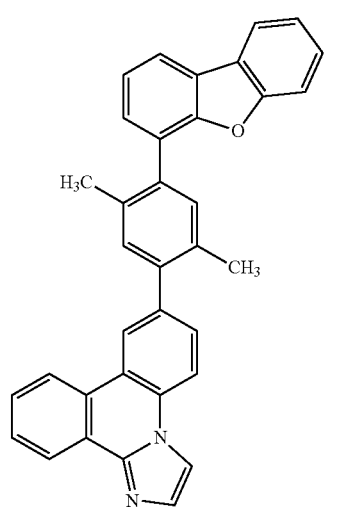
(263)
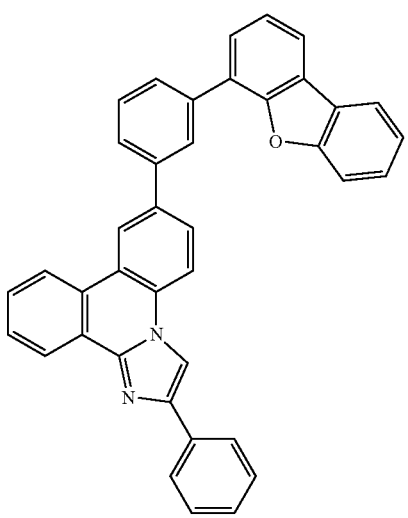
(261)
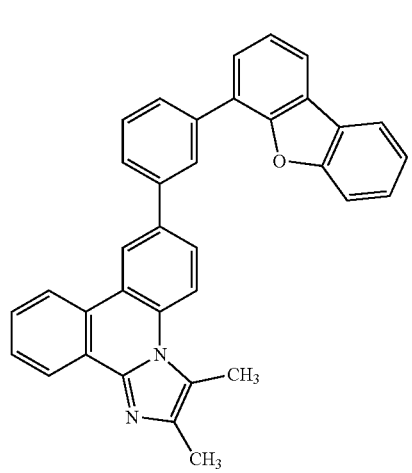
(264)
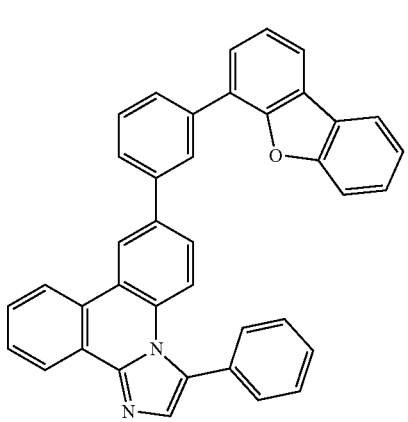

(265)

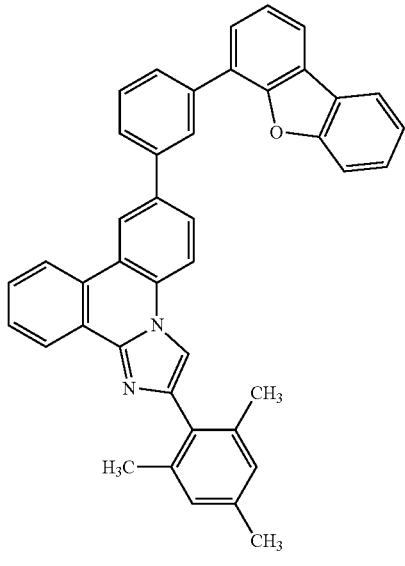

(266)

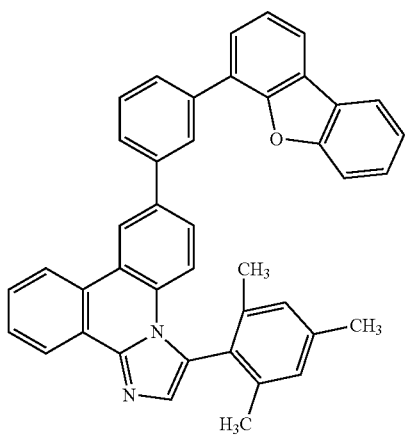

(267)

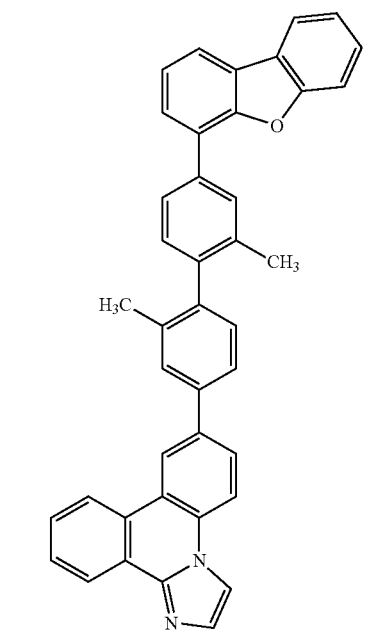

(268)

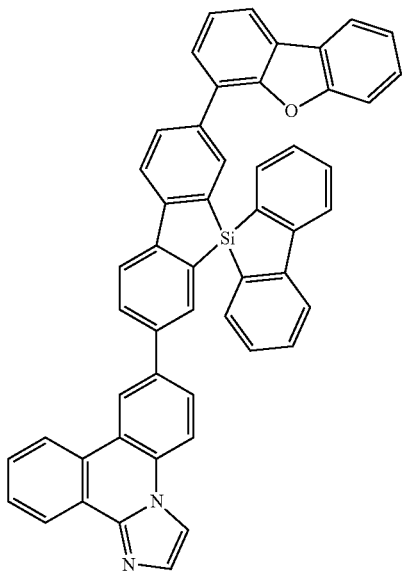

A variety of reactions can be applied to a synthesis method of the organic compound of one embodiment of the present invention. For example, synthesis reactions described below enable the synthesis of the organic compound represented by General Formula (G1). Note that the synthesis method of the organic compound is not limited to the synthesis method below.

<Synthesis Method of Organic Compound Represented by General Formula (G1)>

As shown in Synthesis Scheme (A-1), the objective compound can be obtained by coupling a halide of an imidazo[1,2-f]phenanthridine derivative (a compound 1) and an arylboronic ester or an arylboronic acid having a dibenzothiophene skeleton or a dibenzofuran skeleton (a compound 2) by the Suzuki-Miyaura reaction.

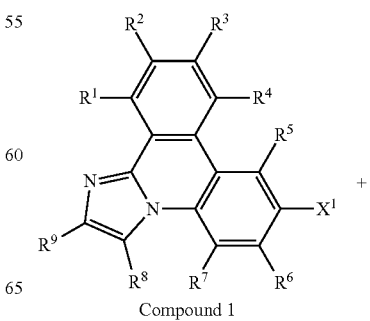

(A-1)

Compound 1

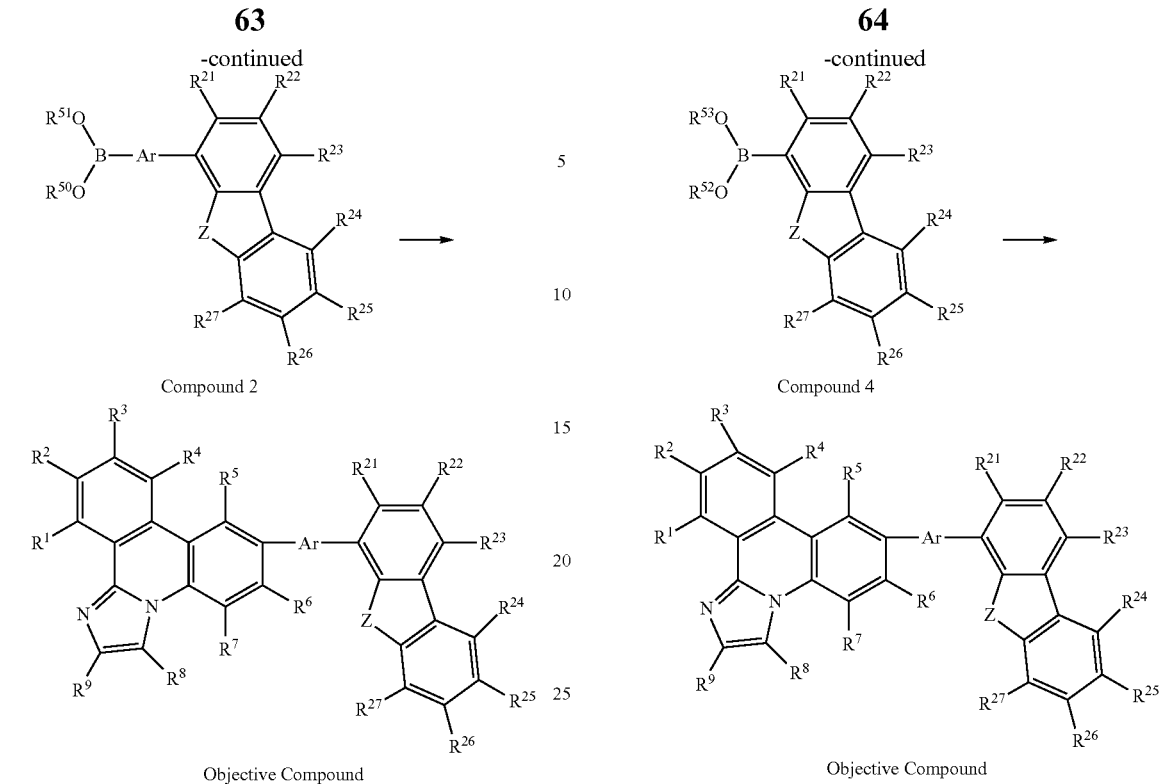

In Synthesis Scheme (A-1), $R^1$ to $R^9$ and $R^{21}$ to $R^{27}$ separately represent hydrogen, an alkyl group having 1 to 4 carbon atoms, or a substituted or unsubstituted aryl group having 6 to 13 carbon atoms. $R^{50}$ and $R^{51}$ represent either hydrogen or an alkyl group having 1 to 6 carbon atoms. $R^{50}$ and $R^{51}$ may be bonded to each other to form a ring. Z represents an oxygen atom or a sulfur atom. Further, $X^1$ represents a halogen.

Further, in the Suzuki-Miyaura reaction illustrated in Synthesis Scheme (A-1), an arylboronic ester or an arylboronic acid having an imidazo[1,2-f]phenanthridine skeleton may be coupled with a halide of a dibenzofuran derivative, a halide of a dibenzothiophene derivative, a dibenzofuran derivative having a triflate group as a substituent, or a dibenzothiophene derivative having a triflate group as a substituent.

As shown in Synthesis Scheme (B-1), the objective compound can also be obtained by coupling an aryl halide having an imidazo[1,2-f]phenanthridine skeleton (a compound 3) and a boronic ester or a boronic acid of a dibenzothiophene derivative or a dibenzofuran derivative (a compound 4) by a Suzuki-Miyaura reaction.

(B-1)

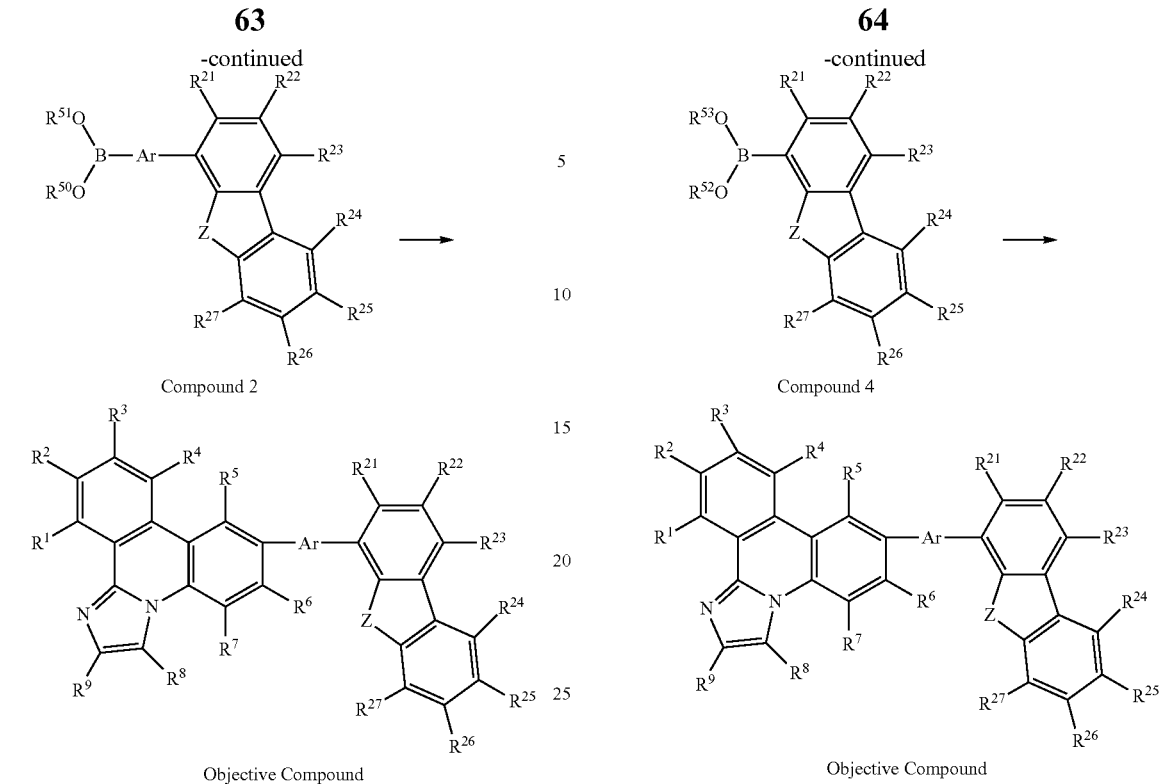

Compound 3

In Synthesis Scheme (B-1), $R^1$ to $R^9$ and $R^{21}$ to $R^{27}$ separately represent hydrogen, an alkyl group having 1 to 4 carbon atoms, or a substituted or unsubstituted aryl group having 6 to 13 carbon atoms. $R^{52}$ and $R^{53}$ represent either hydrogen or an alkyl group having 1 to 6 carbon atoms. $R^{52}$ and $R^{53}$ may be bonded to each other to form a ring. Z represents an oxygen atom or a sulfur atom. Further, $X^2$ represents a halogen or a triflate group, and the halogen is preferably iodine or bromine.

Further, in the Suzuki-Miyaura reaction illustrated in Synthesis Scheme (B-1), an arylboronic ester or an arylboronic acid having an imidazo[1,2-f]phenanthridine skeleton may be coupled with a halide of a dibenzofuran derivative, a halide of a dibenzothiophene derivative, a dibenzofuran derivative having a triflate group as a substituent, or a dibenzothiophene derivative having a triflate group as a substituent.

Examples of a palladium catalyst which can be used in Synthesis Schemes (A-1) and (B-1) include, but not limited to, palladium(II) acetate, tetrakis(triphenylphosphine)palladium(0), and bis(triphenylphosphine)palladium(II) dichloride.

Examples of a ligand of the palladium catalyst which can be used in Synthesis Schemes (A-1) and (B-1) include, but not limited to, tri(ortho-tolyl)phosphine, triphenylphosphine, and tricyclohexylphosphine.

Examples of a base which can be used in Synthesis Schemes (A-1) and (B-1) include, but not limited to, an organic base such as sodium tert-butoxide and an inorganic base such as potassium carbonate and sodium carbonate.

Examples of a solvent which can be used in Synthesis Schemes (A-1) and (B-1) include, but not limited to, a mixed solvent of toluene and water; a mixed solvent of toluene, alcohol such as ethanol, and water; a mixed solvent of xylene and water; a mixed solvent of xylene, alcohol such as ethanol, and water; a mixed solvent of benzene and water; a mixed solvent of benzene, alcohol such as ethanol, and water; and a mixed solvent of an ether such as ethylene glycol dimethyl ether and water. Note that a mixed solvent of toluene and water; a mixed solvent of toluene, ethanol, and water; or a mixed solvent of water and ether such as ethylene glycol dimethyl ether is further preferable.

In the reaction shown in Synthesis Schemes (A-1) and (B-1), cross coupling using an organoaluminum compound, an organozirconium compound, an organozinc compound, an organotin compound, or the like may be used instead of the coupling using the boronic esters or boronic acids. However, the present invention is not limited to these reactions. Further, in this coupling, a triflate group or the like may be used other than a halogen; however, the present invention is not limited thereto.

Thus, the organic compound of one embodiment of the present invention can be synthesized.

Note that the organic compound of one embodiment of the present invention has a high $T_1$ level and thus also has a high singlet excitation energy level ($S_1$ level). Thus, the organic compound of one embodiment of the present invention can also be used as a host material for a fluorescent material.

As examples of the light-emitting material that is used for the light-emitting layer 113 and converts triplet excitation energy into light, i.e., the guest material (the second organic compound), a phosphorescent material and a thermally activated delayed fluorescent (TADF) material emitting thermally activated delayed fluorescence can be given.

As the phosphorescent material, for example, a phosphorescent material having an emission peak at 440 nm to 520 nm is given, examples of which include organometallic iridium complexes having 4H-triazole skeletons, such as tris{2-[5-(2-methylphenyl)-4-(2,6-dimethylphenyl)-4H-1,2,4-triazol-3-yl-K/2]phenyl-K C}iridium(III) (abbreviation: Ir(mpptz-dmp)$_3$), tris(5-methyl-3,4-diphenyl-4H-1,2,4-triazolato)iridium(III) (abbreviation: [Ir(Mptz)$_3$], and tris[4-(3-biphenyl)-5-isopropyl-3-phenyl-4H-1,2,4-triazolato]iridium(III) (abbreviation: Ir(iPrptz-3b)$_3$); organometallic iridium complexes having 1H-triazole skeletons, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: Ir(Prptz1-Me)$_3$); organometallic iridium complexes having imidazole skeletons, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: and Ir(CF$_3$ppy)$_2$(pic)), bis[2-(4',6'-difluorophenyl)pyridinato-N,C$^{2'}$]iridium(III) acetylacetonate (abbreviation: FIr(acac)). Among the materials given above, the organometallic iridium complex having a 4H-triazole skeleton has high reliability and high emission efficiency and is thus especially preferable.

Examples of the phosphorescent material having an emission peak at 520 nm to 600 nm include organometallic iridium complexes having pyrimidine skeletons, such as tris(4-methyl-6-phenylpyrimidinato)iridium(III) (abbreviation: [Ir(mppm)$_3$]), tris(4-t-butyl-6-phenylpyrimidinato) iridium(III) (abbreviation: [Ir(tBuppm)$_3$]), (acetylacetonato) bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[4-(2-norbornyl)-6-phenylpyrimidinato]iridium(III) (endo- and exo-mixture) (abbreviation: Ir(nbppm)$_2$(acac)), (acetylacetonato)bis[5-methyl-6-(2-methylphenyl)-4-phenylpyrimidinato]iridium (III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having pyrazine skeletons, such as (acetylacetonato) bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having pyridine skeletons, such as tris (2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$) iridium(III) (abbreviation: [Ir(pq)$_3$], and bis(2-phenylquinolinato-N,C$^{2'}$)iridium(III) acetylacetonate (abbreviation: [Ir (pq)$_2$(acac)]); and a rare earth metal complex such as tris (acetylacetonato) (monophenanthroline)terbium(III) (abbreviation: [Tb(acac)$_3$(Phen)]). Among the materials given above, the organometallic iridium complex having a pyrimidine skeleton has distinctively high reliability and emission efficiency and is thus especially preferable.

Examples of the phosphorescent material having an emission peak at 600 nm to 700 nm include organometallic iridium complexes having pyrimidine skeletons, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and bis[4,6-di(naphthalen-1-yl)pyrimidinato](dipivaloylmethanato)iridium(III) (abbreviation: [Ir(dlnpm)$_2$(dpm)]); organometallic iridium complexes having pyrazine skeletons, such as (acetylacetonato)bis(2,3,5-triphenylpyrazinato) iridium(III) (abbreviation: [Ir(tppr)$_2$(acac)]), bis(2,3,5-triphenylpyrazinato) (dipivaloylmethanato)iridium(III) (abbreviation: [Ir(tppr)$_2$(dpm)]), and (acetylacetonato)bis[2,3-bis (4-fluorophenyl)quinoxalinato]iridium(III) (abbreviation: [Ir(Fdpq)$_2$(acac)]); organometallic iridium complexes having pyridine skeletons, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); a platinum complex such as 2,3,7,8,12,13,17,18-octaethyl-21H,23H-porphyrin platinum (II) (abbreviation: PtOEP); and rare earth metal complexes such as tris(1,3-diphenyl-1,3-propanedionato)(monophenanthroline)europium(III) (abbreviation: [Eu(DBM)$_3$ (Phen)]) and tris[1-(2-thenoyl)-3,3,3-trifluoroacetonato] (monophenanthroline)europium(III) (abbreviation: [Eu (TTA)$_3$(Phen)]). Among the materials given above, the organometallic iridium complex having a pyrimidine skeleton has distinctively high reliability and emission efficiency and is thus especially preferable. Further, the organometallic iridium complex having a pyrazine skeleton can provide red light emission with favorable chromaticity.

Further, as the hole-transport material which is used for the light-emitting layer 113, i.e., the assist material (the third organic compound), a substance with a high hole-transport property which can be used for the hole-injection layer 111 and the hole-transport layer 112 may be used.

Specifically, a compound having a carbazole skeleton is preferably used as the assist material (the third organic compound) which is included in the light-emitting layer 113 because the compound is highly reliable and has a high hole-transport property to contribute to a reduction in driving voltage.

It is preferable that each of the host material (the first organic compound) and the assist material (the third organic compound) do not exhibit absorption in the blue wavelength range. Specifically, its absorption edge is preferably at 440 nm or less.

The electron-transport layer 114 is a layer containing a substance with a high electron-transport property. For the electron-transport layer 114, a metal complex such as tris(8-quinolinolato)aluminum (abbreviation: Alq$_3$), tris(4-methyl-8-quinolinolato)aluminum (abbreviation: Almq$_3$), bis(10-hydroxybenzo[h]quinolinato)beryllium (abbreviation: BeBq$_2$), bis(2-methyl-8-quinolinolato)(4-phenylphenolato)aluminum (abbreviation: BAlq), bis[2-(2-hydroxyphenyl)benzoxazolato]zinc (abbreviation: Zn(BOX)$_2$), or bis[2-(2-hydroxyphenyl)benzothiazolato]zinc (abbreviation: Zn(BTZ)$_2$) can be used in addition to the above-described electron-transport materials. Further, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can be used. Further, a high molecular compound such as poly(2,5-pyridinediyl) (abbreviation: PPy), poly[(9,9-dihexylfluorene-2,7-diyl)-co-(pyridine-3,5-diyl)](abbreviation: PF-Py) or poly[(9,9-dioctylfluorene-2,7-diyl)-co-(2,2'-bipyridine-6,6'-diyl)](abbreviation: PF-BPy) can be used. The substances given here are mainly ones having an electron mobility of $10^{-6}$ cm$^2$/Vs or higher. Note that any other substance may be used for the electron-transport layer 114 as long as the substance has an electron-transport property higher than a hole-transport property.

The electron-transport layer 114 is not limited to a single layer, and may be a stack of two or more layers containing any of the above substances.

It is further preferable that the organic compound of one embodiment of the present invention be used for the electron-transport layer 114. Since the organic compound of one embodiment of the present invention has a high electron-transport property, it is suitably used for the electron-transport layer 114.

The electron-injection layer 115 is a layer containing a substance with a high electron-injection property. For the electron-injection layer 115, an alkali metal compound or an alkaline earth metal compound, such as lithium fluoride (LiF), cesium fluoride (CsF), calcium fluoride (CaF$_2$), or lithium oxide (LiOx) can be used. A rare earth metal compound such as erbium fluoride (ErF$_3$) can also be used. Any of the substances for forming the electron-transport layer 114, which are given above, can also be used.

Alternatively, a composite material in which an organic compound and an electron donor (donor) are mixed may be used for the electron-injection layer 115. Such a composite material is excellent in an electron-injection property and an electron-transport property because electrons are generated in the organic compound by the electron donor. In this case, the organic compound is preferably a material excellent in a property of transporting the generated electrons. Specifically, for example, the substances for forming the electron-transport layer 114 (e.g., a metal complex and a heteroaromatic compound), which are given above, can be used. As the electron donor, a substance exhibiting an electron-donating property to the organic compound may be used. Specifically, an alkali metal, an alkaline earth metal, and a rare earth metal are preferable, and lithium, cesium, magnesium, calcium, erbium, and ytterbium are given. Further, an alkali metal oxide or an alkaline earth metal oxide is preferable; examples thereof include lithium oxide, calcium oxide, and barium oxide. A Lewis base such as magnesium oxide can also be used. An organic compound such as tetrathiafulvalene (abbreviation: TTF) can also be used.

Note that each of the above-described hole-injection layer 111, hole-transport layer 112, light-emitting layer 113, electron-transport layer 114, and electron-injection layer 115, can be formed by a method such as an evaporation method (e.g., a vacuum evaporation method), an inkjet method, or a coating method.

In the above-described light-emitting element, current flows due to a potential applied between the first electrode 101 and the second electrode 103 and holes and electrons recombine in the EL layer 102, whereby light is emitted. Then, the light emitted is extracted outside through the first electrode 101, the second electrode 103, or both. Thus, the first electrode 101, the second electrode 103, or both are electrodes having light-transmitting properties.

As described above, the light-emitting element in this embodiment includes, between a cathode and an anode, a light-emitting layer containing an organic compound in which an imidazo[1,2-f]phenanthridine skeleton and a dibenzothiophene skeleton or a dibenzofuran skeleton are bonded through an arylene group. By the use of the organic compound for the light-emitting layer, the light-emitting element can have high current efficiency.

Note that the structure described in this embodiment can be combined as appropriate with any of the structures described in the other embodiments.

Embodiment 2

In this embodiment, a light-emitting element in which the organic compound of one embodiment of the present invention, a light-emitting material which converts triplet excitation energy into light, and a hole-transport material are used for a light-emitting layer will be described with reference to FIGS. 2A and 2B.

Figure 2A:
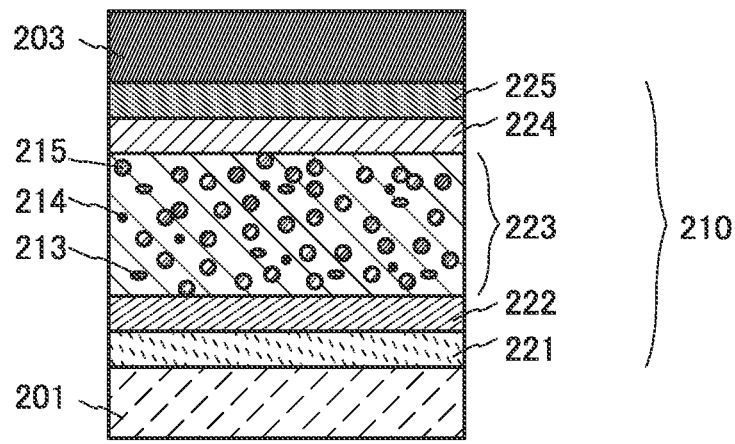
FIG. 2A illustrates a light-emitting element of one embodiment of the present invention.
Figure 2B:
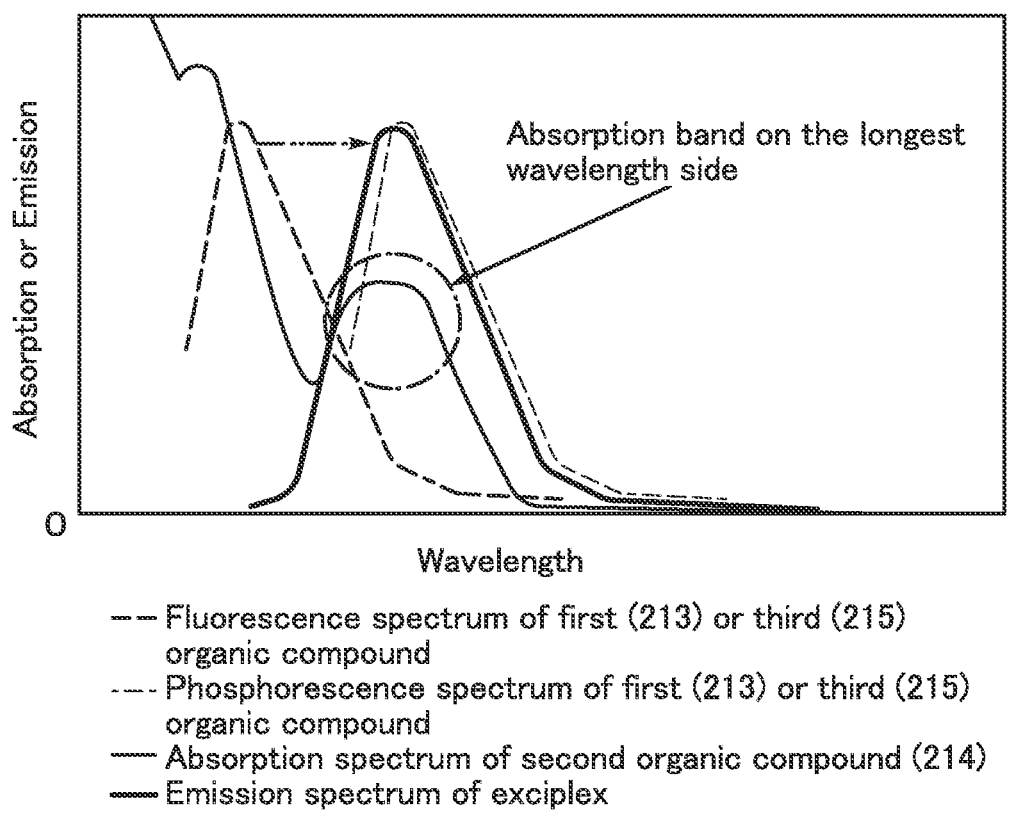
FIG. 2B is a schematic view of the absorption and emission spectra of the organic compounds in the light-emitting element.

A light-emitting element described in this embodiment includes an EL layer 210 between a first electrode 201 and a second electrode 203 as illustrated in FIG. 2A. Note that the EL layer 210 includes at least a light-emitting layer 223 and may further include a hole-injection layer 221, a hole-transport layer 222, an electron-transport layer 224, an electron-injection layer 225, and the like. The materials in Embodiment 1 which can be used for the hole-injection layer 111, the hole-transport layer 112, the electron-transport layer 114, and the electron-injection layer 115 can be respectively used for the hole-injection layer 221, the hole-transport layer 222, the electron-transport layer 224, and the electron-injection layer 225. The first electrode 201 is used as an anode and the second electrode 203 is used as a cathode in this embodiment.

In the light-emitting element described in this embodiment, the organic compound of one embodiment of the present invention is contained in the light-emitting layer 223. Note that the organic compound of one embodiment of the present invention may be contained in the electron-transport layer 224.

The light-emitting layer 223 includes a first organic compound 213, a second organic compound 214, and a third organic compound 215. In this embodiment, the first organic compound 213, the second organic compound 214, and the third organic compound 215 are used as a host material, a guest material, and an assist material, respectively. The organic compound of one embodiment of the present invention is a substance having a high electron-transport property, and thus can be applied to the first organic compound 213 that is used as the host material.

When the light-emitting layer 223 has the structure in which the guest material is dispersed in the host material, the crystallization of the light-emitting layer can be suppressed. Further, it is possible to suppress concentration quenching due to high concentration of the guest material; thus, the light-emitting element can have higher emission efficiency.

Note that it is preferable that a $T_1$ level of each of the first organic compound 213 and the third organic compound 215 be higher than that of the second organic compound 214. This is because, when the $T_1$ level of the first organic compound 213 (or the third organic compound 215) is lower than that of the second organic compound 214, the triplet excitation energy of the second organic compound 214, which contributes to light emission, is quenched by the first organic compound 213 (or the third organic compound 215) and accordingly the emission efficiency decreases.

Here, for improvement in efficiency of energy transfer from a host material to a guest material, Förster mechanism (dipole-dipole interaction) and Dexter mechanism (electron exchange interaction), which are known as mechanisms of energy transfer, are considered. According to the mechanisms, it is preferable that an emission spectrum of a host material (fluorescence spectrum in energy transfer from a singlet excited state, phosphorescence spectrum in energy transfer from a triplet excited state) largely overlap with an absorption spectrum of a guest material (specifically, spectrum of an absorption band on the longest wavelength (lowest energy) side). However, in the case of a general phosphorescent guest material, it is difficult to obtain an overlap between a fluorescence spectrum of the host material and an absorption spectrum of an absorption band on the longest wavelength side of the guest material. The reason for this is as follows: in the case where the fluorescence spectrum of the host material overlaps with the absorption spectrum of the absorption band on the longest wavelength side of the guest material, because the phosphorescence spectrum of the host material is located on the longer wavelength side than the fluorescence spectrum, the $T_1$ level of the host material becomes lower than the $T_1$ level of the guest material and the above-described problem of quenching occurs; yet, when the host material is designed in such a manner that the $T_1$ level of the host material is higher than the $T_1$ level of the guest material to avoid the problem of quenching, the fluorescence spectrum of the host material is shifted to the shorter wavelength (higher energy) side, and thus the fluorescence spectrum does not have any overlap with the absorption spectrum of the absorption band on the longest wavelength side of the guest material. For this reason, in general, it is difficult to obtain an overlap between a fluorescence spectrum of a host material and an absorption spectrum of an absorption band on the longest wavelength side of a guest material so as to maximize energy transfer from a singlet excited state of a host material.

Thus, in this embodiment, a combination of the first organic compound 213 and the third organic compound 215 preferably forms an excited complex (also referred to as exciplex). Thus, in the light-emitting layer 223, the first organic compound 213 and the third organic compound 215 give an emission of the exciplex on a longer wavelength side. Moreover, when the first organic compound 213 and the third organic compound 215 are selected in such a manner that the emission spectrum of the exciplex largely overlaps with the absorption spectrum of the guest material (the second organic compound 214), energy transfer from a singlet excited state can be maximized (see FIG. 2B).

The energy transfer from a triplet excited state is also likely to include the energy transfer from the exciplex of the first organic compound 213 and the third organic compound 215.

The organic compound of one embodiment of the present invention is preferably used as the first organic compound 213. The phosphorescent material described in Embodiment 1 (specifically, an organometallic iridium complex) is preferably used as the second organic compound 214. The hole-transport material described in Embodiment 1 is preferably used as the third organic compound 215.

The above-described combination of the first organic compound 213 and the third organic compound 215 is an example of the combination which enables an exciplex to be formed. The combination is determined so that the emission spectrum of the exciplex overlaps with the absorption spectrum of the second organic compound 214 and the peak of the emission spectrum of the exciplex has a longer wavelength than the peak of the absorption spectrum of the second organic compound 214 on the longest wavelength side.

Note that the electron-transport material and the hole-transport material act as the first organic compound 213 and the third organic compound 215; adjusting the mixture ratio thereof can control the carrier balance. Specifically, the ratio of the first organic compound to the third organic compound is preferably 1:9 to 9:1.

In the light-emitting element described in this embodiment, energy transfer efficiency can be improved owing to energy transfer utilizing an overlap between an emission spectrum of an exciplex and an absorption spectrum of a guest material; accordingly, it is possible to achieve high external quantum efficiency of a light-emitting element.

Note that the structure described in this embodiment can be combined as appropriate with any of the structures described in the other embodiments.

Embodiment 3

In this embodiment, as one embodiment of the present invention, a light-emitting element (hereinafter referred to as tandem light-emitting element) in which a charge-generation layer is provided between a plurality of EL layers will be described.

Figure 3A:
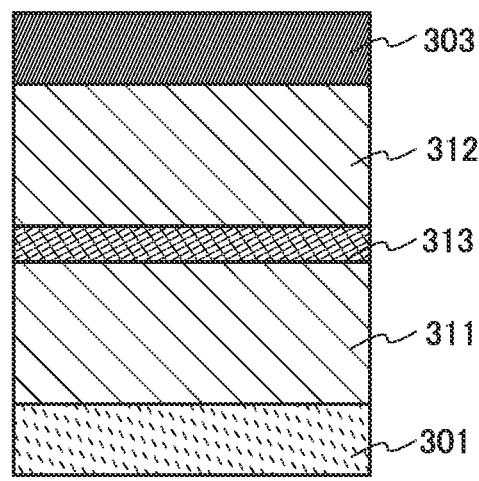
FIGS. 3A and 3B each illustrate a light-emitting element of one embodiment of the present invention.

A light-emitting element described in this embodiment is a tandem light-emitting element including a plurality of EL layers (a first EL layer 311 and a second EL layer 312) between a first electrode 301 and a second electrode 303, as illustrated in FIG. 3A.

In this embodiment, the first electrode 301 functions as an anode, and the second electrode 303 functions as a cathode. Note that the first electrode 301 and the second electrode 303 can have structures similar to those described in Embodiment 2. Although the plurality of EL layers may have the structures similar to those described in Embodiment 1 or 2, any of the EL layers may have a structure similar to that described in Embodiment 1 or 2. In other words, the structures of the first EL layer 311 and the second EL layer 312 may be the same or different from each other and can be similar to those described in Embodiment 1 or 2.

A charge-generation layer 313 is provided between the plurality of EL layers. The charge-generation layer 313 has a function of injecting electrons into one of the EL layers and injecting holes into the other of the EL layers when voltage is applied between the first electrode 301 and the second electrode 303. In this embodiment, when voltage is applied such that the potential of the first electrode 301 is higher than that of the second electrode 303, the charge-generation layer 313 injects electrons into the first EL layer 311 and injects holes into the second EL layer 312.

Note that in terms of light extraction efficiency, the charge-generation layer 313 preferably has a light-transmitting property with respect to visible light (specifically, the charge-generation layer 313 has a visible light transmittance of 40% or more). Further, the charge-generation layer 313 functions even if it has lower conductivity than the first electrode 301 or the second electrode 303.

The charge-generation layer 313 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), or BSPB, or the like can be used. The substances given here are mainly ones having a hole mobility of $10^{-6}$ cm$^2$/Vs or higher. However, substances other than the above substances may be used as long as they are organic compounds in which a hole-transport property is higher than an electron-transport property.

Further, as the electron acceptor, 7,7,8,8-tetracyano-2,3,5,6-tetrafluoroquinodimethane (abbreviation: F$_4$-TCNQ), chloranil, and the like can be given. In addition, a transition metal oxide such as an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is especially preferable since it is stable in the air, has a low hygroscopic property, and is easily handled.

On the other hand, in the case of the structure in which an electron donor is added to an organic compound having a high electron-transport property, as the organic compound having a high electron-transport property, for example, a metal complex having a quinoline skeleton or a benzoquinoline skeleton, such as Alq, Almq$_3$, BeBq$_2$, or BAlq, or the like can be used. Alternatively, a metal complex having an oxazole-based ligand or a thiazole-based ligand, such as Zn(BOX)$_2$ or Zn(BTZ)$_2$, or the like can be used. Other than metal complexes, PBD, OXD-7, TAZ, BPhen, BCP, or the like can be used. The substances given here are mainly ones having an electron mobility of $10^{-6}$ cm$^2$/Vs or higher. Note that any other substance may be used as long as the substance has an electron-transport property higher than a hole-transport property.

As the electron donor, an alkali metal, an alkaline earth metal, a rare earth metal, a metal belonging to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may also be used as the electron donor.

Figure 3B:
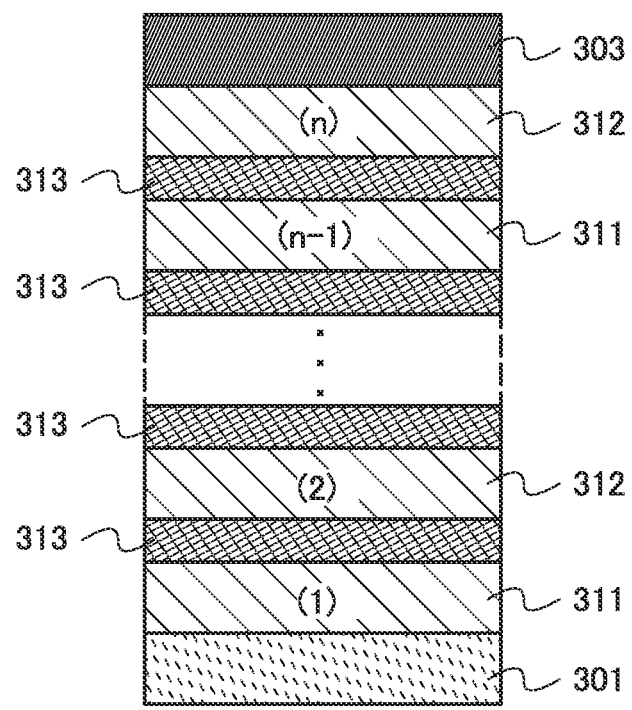

Although the light-emitting element having two EL layers is illustrated in FIG. 3A, the present invention can be similarly applied to a light-emitting element in which n EL layers (n is three or more) are stacked as illustrated in FIG. 3B. These structures allow the light-emitting element to emit light in a high luminance region while the current density is kept low. Since the current density can be kept low, the element can have a long lifetime. Moreover, a light-emitting device which can be driven at low voltage and has low power consumption can be achieved.

By making emission colors of the EL layers different, light of a desired color can be obtained from the light-emitting element as a whole. For example, by forming a light-emitting element having two EL layers such that the emission color of the first EL layer and the emission color of the second EL layer are complementary colors, the light-emitting element can provide white light emission as a whole. Note that "complementary colors" refer to colors which produce an achromatic color when mixed. In other words, emission of white light can be obtained by mixture of light emitted from substances whose emission colors are complementary colors.

Further, the same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined as appropriate with any of the structures described in the other embodiments.

Embodiment 4

In this embodiment, a light-emitting device of one embodiment of the present invention will be described.

Figure 4:
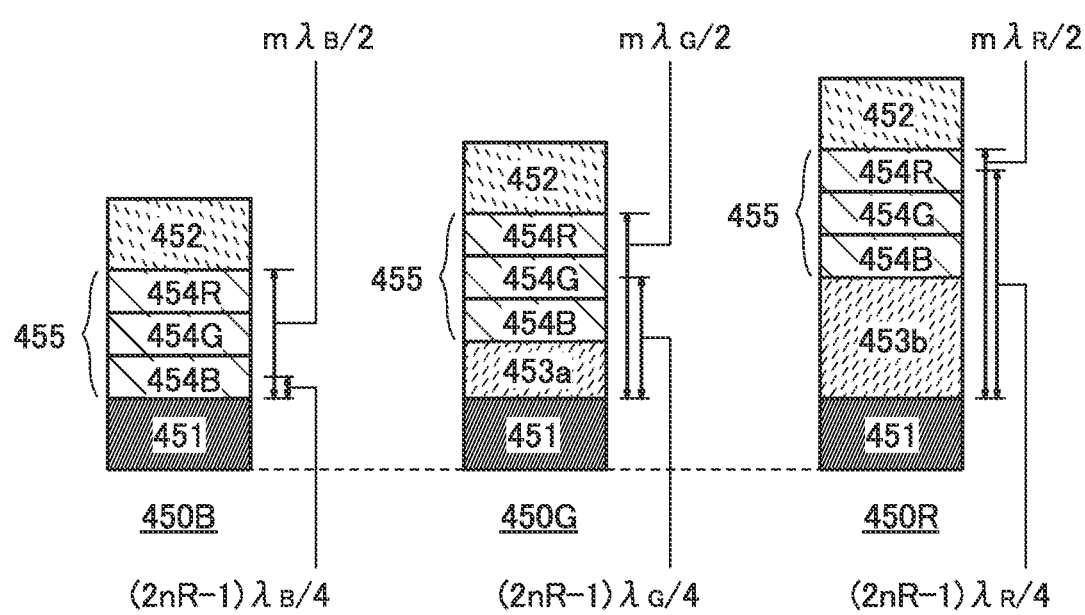
FIG. 4 illustrates a light-emitting device of one embodiment of the present invention.

A light-emitting device described in this embodiment has a micro optical resonator (microcavity) structure in which a light resonant effect between a pair of electrodes is utilized. The light-emitting device includes a plurality of light-emitting elements each of which includes at least an EL layer 455 between a pair of electrodes (a reflective electrode 451 and a semi-transmissive and semi-reflective electrode 452) as illustrated in FIG. 4. Further, the EL layer 455 includes at least light-emitting layers 454 (light-emitting layers 454R, 454G, and 454B). The EL layer 455 may further include a hole-injection layer, a hole-transport layer, an electron-transport layer, an electron-injection layer, a charge-generation layer, and the like.

A first light-emitting element 450B has a structure in which the EL layer 455 including the first light-emitting layer 454B, the second light-emitting layer 454G, and the third light-emitting layer 454R and the semi-transmissive and semi-reflective electrode 452 are sequentially stacked over the reflective electrode 451. A second light-emitting element 450G has a structure in which a first transparent conductive layer 453a, the EL layer 455, and the semi-transmissive and semi-reflective electrode 452 are sequentially stacked over the reflective electrode 451. A third light-emitting element 450R has a structure in which a second transparent conductive layer 453b, the EL layer 455, and the semi-transmissive and semi-reflective electrode 452 are sequentially stacked over the reflective electrode 451.

Note that the reflective electrode 451, the EL layer 455, and the semi-transmissive and semi-reflective electrode 452 are common to the light-emitting elements (the first light-emitting element 450B, the second light-emitting element 450G, and the third light-emitting element 450R). The first light-emitting layer 454B emits light having a peak wavelength ($\lambda$B) in a region from 420 nm to 480 nm, the second light-emitting layer 454G emits light having a peak wavelength (AG) in a region from 500 nm to 550 nm, and the third light-emitting layer 454R emits light having a peak wavelength ($\lambda_R$) in a region from 600 nm to 760 nm. Thus, the lights emitted from the first light-emitting layer 454B, the second light-emitting layer 454G, and the third light-emitting layer 454R are mixed; accordingly, light having a broad emission spectrum that covers a visible light range can be emitted. Note that the above wavelengths satisfy the relation of $\lambda B<\lambda G<\lambda R$.

Each of the light-emitting elements described in this embodiment has a structure in which the EL layer 455 is interposed between the reflective electrode 451 and the semi-transmissive and semi-reflective electrode 452. The lights emitted in all directions from the light-emitting layers included in the EL layer 455 are resonated by the reflective electrode 451 and the semi-transmissive and semi-reflective electrode 452 which function as a micro optical resonator. Note that the reflective electrode 451 is formed using a conductive material having reflectivity, and a film whose visible light reflectivity is 40% to 100%, preferably 70% to 100%, and whose resistivity is $1\times10^{-2}$ $\Omega$cm or lower is used. The semi-transmissive and semi-reflective electrode 452 is formed using a conductive material having reflectivity and a conductive material having a light-transmitting property, and a film whose visible light reflectivity is 20% to 80%, preferably 40% to 70%, and whose resistivity is $1\times10^{-2}$ $\Omega$cm or lower is used.

In this embodiment, the thicknesses of the transparent conductive layers (the first transparent conductive layer 453a and the second transparent conductive layer 453b) which are provided in the second light-emitting element 450G and the third light-emitting element 450R, respectively, are varied, whereby the light-emitting elements differ in the optical path length from the reflective electrode 451 to the semi-transmissive and semi-reflective electrode 452. In other words, the micro optical resonator formed by the reflective electrode 451 and the semi-transmissive and semi-reflective electrode 452 is able to amplify light which is resonated and attenuate light which is not resonated. Thus, when the elements differ in the optical path length from the reflective electrode 451 to the semi-transmissive and semi-reflective electrode 452, light with different wavelengths can be extracted even though the first to third light-emitting elements 450B, 450G, and 450R share the same EL layer 455.

Note that the optical path length (also referred to as optical distance) is expressed as a product of an actual distance and a refractive index, and in this embodiment, is a product of an actual thickness and n (refractive index). That is, the following relation is satisfied: optical path length=actual thickness×n.

The optical path length from the reflective electrode 451 to the semi-transmissive and semi-reflective electrode 452 is set to $m\lambda_B/2$ (m is a natural number of 1 or more) in the first light-emitting element 450B; the optical path length from the reflective electrode 451 to the semi-transmissive and semi-reflective electrode 452 is set to $m\lambda_G/2$ (m is a natural number of 1 or more) in the second light-emitting element 450G; and the optical path length from the reflective electrode 451 to the semi-transmissive and semi-reflective electrode 452 is set to $m\lambda_R/2$ (m is a natural number of 1 or more) in the third light-emitting element 450R.

In this manner, the light emitted from the first light-emitting layer 454B included in the EL layer 455 is mainly extracted from the first light-emitting element 450B, the light emitted from the second light-emitting layer 454G included in the EL layer 455 is mainly extracted from the second light-emitting element 450G, and the light emitted from the third light-emitting layer 454R included in the EL layer 455 is mainly extracted from the third light-emitting element 450R. Note that the light extracted from each of the light-emitting elements is emitted from the semi-transmissive and semi-reflective electrode 452 side.

Strictly speaking, the optical path length from the reflective electrode 451 to the semi-transmissive and semi-reflective electrode 452 is the optical path length from a reflection region in the reflective electrode 451 to a reflection region in the semi-transmissive and semi-reflective electrode 452. However, it is difficult to precisely determine the positions of the reflection regions in the reflective electrode 451 and the semi-transmissive and semi-reflective electrode 452 and the emission regions; therefore, in the present embodiment, as shown in FIG. 4, the following explanation is given by assuming that the reflection regions are the interface between the reflective electrode 451 and the EL layer 455 and the interface between the EL layer 455 and the semi-transmissive and semi-reflective electrode 452 and that the center of each of the first to third light-emitting layers (454R, 454G, and 454B) is an emission center.

Next, the optical path length from the reflective electrode 451 to the first light-emitting layer 454B is adjusted to $(2n_B-1)\lambda_B/4$ ($n_B$ is a natural number of 1 or more) because in the first light-emitting element 450B, light (first reflected light) that is emitted from the first light-emitting layer 454B and then reflected by the reflective electrode 451 interferes with light (first incident light) that is emitted from the first light-emitting layer 454B and then directly enters the semi-transmissive and semi-reflective electrode 452. By adjusting the optical path length, the phases of the first reflected light and the first incident light can be aligned with each other and the light emitted from the first light-emitting layer 454B can be amplified.

In a similar way, the optical path length from the reflective electrode 451 to the second light-emitting layer 454G is adjusted to $(2n_G-1)\lambda_G/4$ ($n_G$ is a natural number of 1 or more) because in the second light-emitting element 450G, light (second reflected light) that is emitted from the second light-emitting layer 454G and then reflected by the reflective electrode 451 interferes with light (second incident light) that is emitted from the second light-emitting layer 454G and then directly enters the semi-transmissive and semi-reflective electrode 452. By adjusting the optical path length, the phases of the second reflected light and the second incident light can be aligned with each other and the light emitted from the second light-emitting layer 454G can be amplified.

Similarly, the optical path length from the reflective electrode 451 to the third light-emitting layer 454R is adjusted to $(2n_R-1)\lambda_R/4$ ($n_R$ is a natural number of 1 or more) because in the third light-emitting element 450R, light (third reflected light) that is emitted from the third light-emitting layer 454R and then reflected by the reflective electrode 451 interferes with light (third incident light) that is emitted from the third light-emitting layer 454R and then directly enters the semi-transmissive and semi-reflective electrode 452. By adjusting the optical path length, the phases of the third reflected light and the third incident light can be aligned with each other and the light emitted from the third light-emitting layer 454R can be amplified.

Note that although each of the light-emitting elements in the above-described structure includes a single EL layer, the present invention is not limited thereto; for example, the structure of the tandem (stacked type) light-emitting element which is described in Embodiment 3 can be combined, in which case a plurality of EL layers are provided so that a charge-generation layer is interposed therebetween in one light-emitting element.

The light-emitting device described in this embodiment has a microcavity structure, in which light with wavelengths which differ depending on the light-emitting elements can be extracted even when they include the EL layers having the same structure, so that it is not necessary to individually form different EL layers for the colors of R, G, and B. Therefore, the above structure is advantageous for full color display owing to easiness in achieving higher resolution display or the like. In addition, intensity of emission with a predetermined wavelength in the front direction can be increased, whereby power consumption can be reduced. The above structure is particularly useful in the case of being applied to a color display (image display device) including pixels of three or more colors but may also be applied to lighting or the like.

Note that the structure described in this embodiment can be combined as appropriate with any of the structures described in the other embodiments.

Embodiment 5

In this embodiment, a light-emitting device including a light-emitting element which is one embodiment of the present invention will be described.

The light-emitting device can be either a passive matrix light-emitting device or an active matrix light-emitting device. Note that any of the light-emitting elements described in the other embodiments can be applied to the light-emitting device described in this embodiment.

In this embodiment, an active matrix light-emitting device is described with reference to FIGS. 5A and 5B.

Figure 5A:
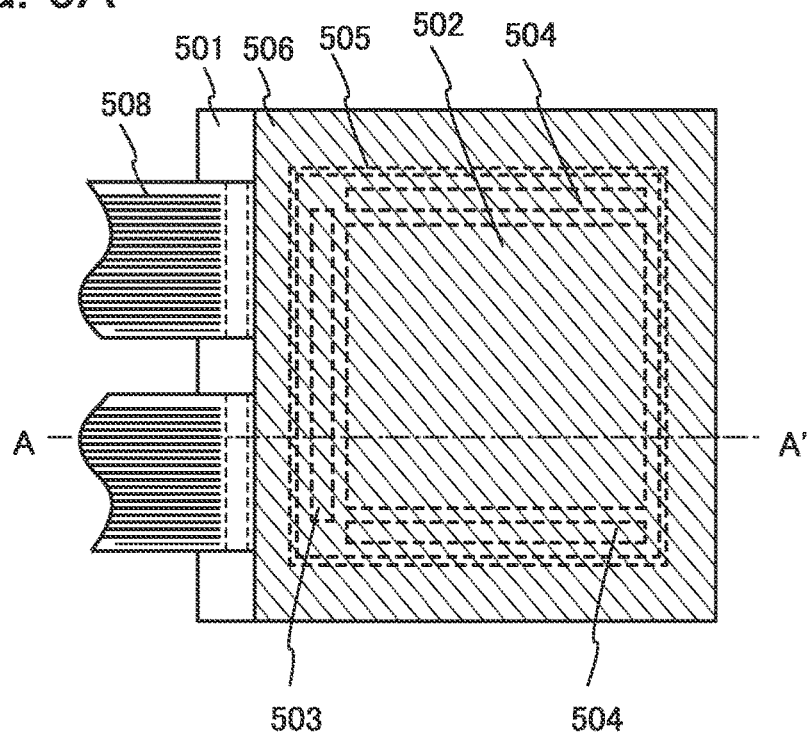
FIGS. 5A and 5B illustrate a light-emitting device of one embodiment of the present invention.
Figure 5B:
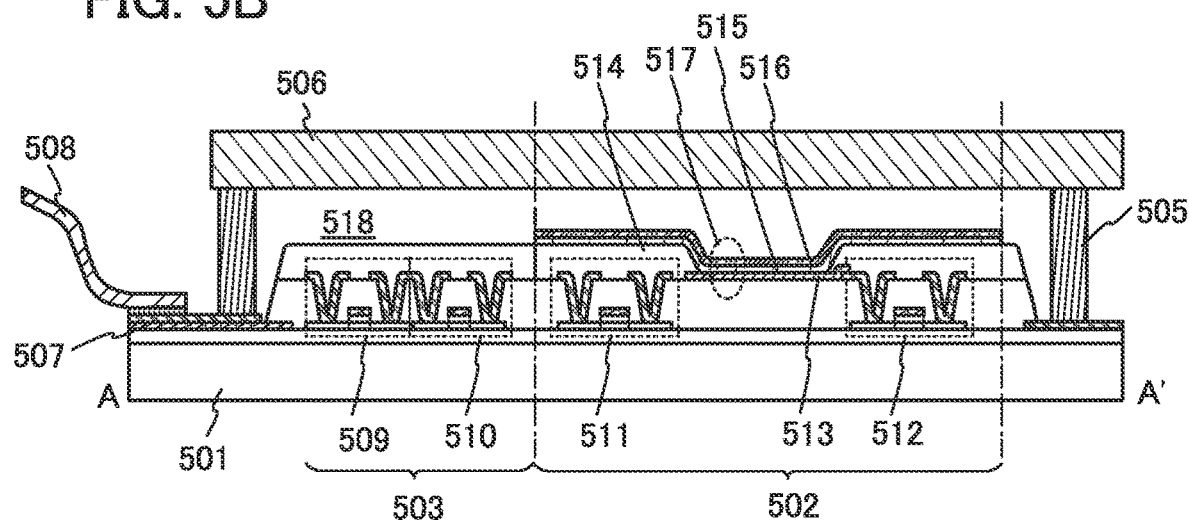

Note that FIG. 5A is a top view illustrating a light-emitting device and FIG. 5B is a cross-sectional view taken along the dotted line A-A' in FIG. 5A. The active matrix light-emitting device in this embodiment includes a pixel portion 502 provided over an element substrate 501, a driver circuit portion (a source line driver circuit) 503, and driver circuit portions (gate line driver circuits) 504. The pixel portion 502, the driver circuit portion 503, and the driver circuit portions 504 are sealed with a sealant 505 between the element substrate 501 and a sealing substrate 506.

Over the element substrate 501, a lead wiring 507 for connecting an external input terminal, through which a signal (e.g., a video signal, a clock signal, a start signal, a reset signal, or the like) or electric potential from the outside is transmitted to the driver circuit portion 503 and the driver circuit portions 504, is provided. Here, an example in which a flexible printed circuit (FPC) 508 is provided as the external input terminal is described. Although only the FPC is illustrated here, a printed wiring board (PWB) may be attached to the FPC. The light-emitting device in this specification includes, in its category, not only the light-emitting device itself but also the light-emitting device provided with the FPC or the PWB.

Next, a cross-sectional structure is described with reference to FIG. 5B. The driver circuit portion and the pixel portion are formed over the element substrate 501, and the driver circuit portion 503 which is the source line driver circuit and the pixel portion 502 are illustrated.

An example in which a CMOS circuit which is a combination of an n-channel TFT 509 and a p-channel TFT 510 is formed as the driver circuit portion 503 is illustrated. Note that a circuit included in the driver circuit portion may be formed using any of various circuits, such as a CMOS circuit, a PMOS circuit, or an NMOS circuit. Although this embodiment shows a driver integrated type in which the driver circuit is formed over the substrate, the driver circuit is not necessarily formed over the substrate, and the driver circuit can be formed outside, not over the substrate.

The pixel portion 502 is formed of a plurality of pixels each of which includes a switching TFT 511, a current control TFT 512, and a first electrode 513 which is electrically connected to a wiring (a source electrode or a drain electrode) of the current control TFT 512. An insulator 514 is formed so as to cover an edge portion of the first electrode 513. In this embodiment, the insulator 514 is formed using a positive photosensitive acrylic resin. Note that the first electrode 513 is used as an anode in this embodiment.

In order to obtain favorable coverage with a film which is to be stacked over the insulator 514, the insulator 514 is preferably formed so as to have a curved surface with curvature at an upper edge portion or a lower edge portion. For example, in the case of using a positive photosensitive acrylic resin as a material for the insulator 514, the insulator 514 is preferably formed so as to have a curved surface with a curvature radius (0.2 μm to 3 μm) at the upper edge portion. Note that the insulator 514 can be formed using either a negative photosensitive resin or a positive photosensitive resin. It is possible to use, without limitation to an organic compound, either an organic compound or an inorganic compound such as silicon oxide or silicon oxynitride for the insulator 514.

An EL layer 515 and a second electrode 516 are stacked over the first electrode 513. In the EL layer 515, at least a hole-transport layer and a light-emitting layer are provided. For the hole-transport layer and the light-emitting layer, those described in Embodiment 1 or 2 can be used. Note that in this embodiment, the second electrode 516 is used as a cathode.

A light-emitting element 517 is formed of a stacked structure of the first electrode 513, the EL layer 515, and the second electrode 516. For the first electrode 513, the EL layer 515, and the second electrode 516, the materials described in Embodiment 1 can be used. Although not illustrated, the second electrode 516 is electrically connected to an FPC 508 which is an external input terminal.

Although the cross-sectional view of FIG. 5B illustrates only one light-emitting element 517, a plurality of light-emitting elements are arranged in matrix in the pixel portion 502. Light-emitting elements that emit light of three kinds of colors (R, G, and B) are selectively formed in the pixel portion 502, whereby a light-emitting device capable of full color display can be obtained. Alternatively, a light-emitting device which is capable of full color display may be manufactured by a combination with color filters.

The sealing substrate 506 is attached to the element substrate 501 with the sealant 505, whereby the light-emitting element 517 is provided in a space 518 surrounded by the element substrate 501, the sealing substrate 506, and the sealant 505. Note that the space 518 may be filled with an inert gas (such as nitrogen and argon) or the sealant 505.

An epoxy-based resin is preferably used for the sealant 505. Such a material preferably allows as little moisture and oxygen as possible to permeate. As the sealing substrate 506, a plastic substrate formed of fiberglass-reinforced plastics (FRP), poly(vinyl fluoride) (PVF), a polyester, an acrylic resin, or the like can be used besides a glass substrate or a quartz substrate.

As described above, an active matrix light-emitting device can be obtained.

Note that the structure described in this embodiment can be combined as appropriate with any of the structures described in the other embodiments.

Embodiment 6

In this embodiment, an electronic device which includes the light-emitting device of one embodiment of the present invention which is described in the above embodiments will be described. Examples of the electronic device include cameras such as video cameras and digital cameras, goggle type displays, navigation systems, audio replay devices (e.g., car audio systems and audio systems), computers, game machines, portable information terminals (e.g., mobile computers, mobile phones, smartphones, portable game machines, e-book readers, and tablet terminals), and image replay devices in which a recording medium is provided (specifically, devices that are capable of replaying recording media such as digital versatile discs (DVDs) and equipped with a display device that can display an image). Specific examples of these electronic devices will be described with reference to FIGS. 6A to 6D and FIGS. 7A to 7C.

Figure 6A:
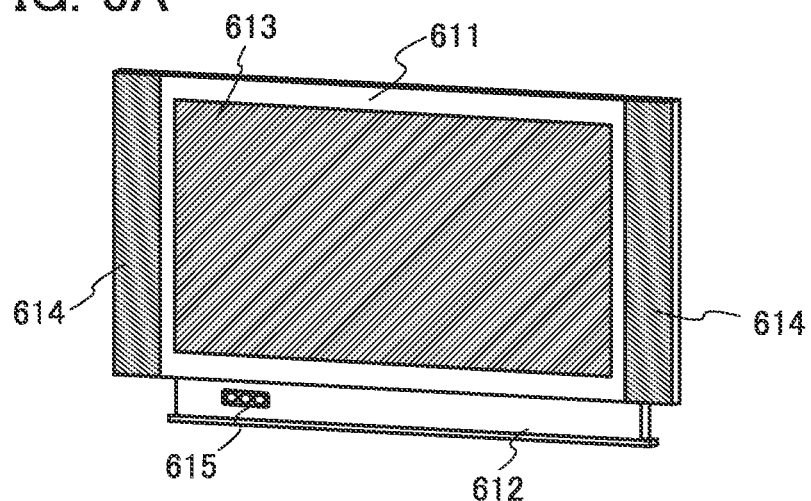
FIGS. 6A to 6D each illustrate an electronic device of one embodiment of the present invention.

FIG. 6A illustrates a television set of one embodiment of the present invention, which includes a housing 611, a supporting base 612, a display portion 613, speaker portions 614, video input terminals 615, and the like. In this television set, the light-emitting device of one embodiment of the present invention can be applied to the display portion 613. Since the light-emitting device of one embodiment of the present invention is driven at low voltage and has high current efficiency, by the application of the light-emitting device of one embodiment of the present invention, a television set with reduced power consumption can be obtained.

Figure 6B:
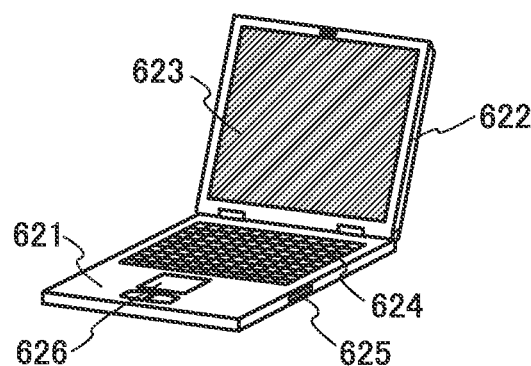

FIG. 6B illustrates a computer of one embodiment of the present invention, which includes a main body 621, a housing 622, a display portion 623, a keyboard 624, an external connection port 625, a pointing device 626, and the like. In this computer, the light-emitting device of one embodiment of the present invention can be applied to the display portion 623. Since the light-emitting device of one embodiment of the present invention is driven at low voltage and has high current efficiency, by the application of the light-emitting device of one embodiment of the present invention, a computer with reduced power consumption can be obtained.

Figure 6C:
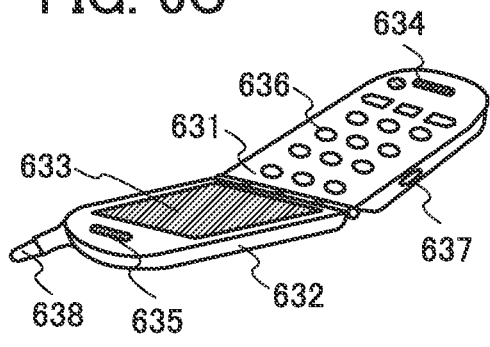

FIG. 6C illustrates a mobile phone of one embodiment of the present invention, which includes a main body 631, a housing 632, a display portion 633, an audio input portion 634, an audio output portion 635, operation keys 636, an external connection port 637, an antenna 638, and the like. In this mobile phone, the light-emitting device of one embodiment of the present invention can be applied to the display portion 633. Since the light-emitting device of one embodiment of the present invention is driven at low voltage and has high current efficiency, by the application of the light-emitting device of one embodiment of the present invention, a mobile phone with reduced power consumption can be obtained.

Figure 6D:
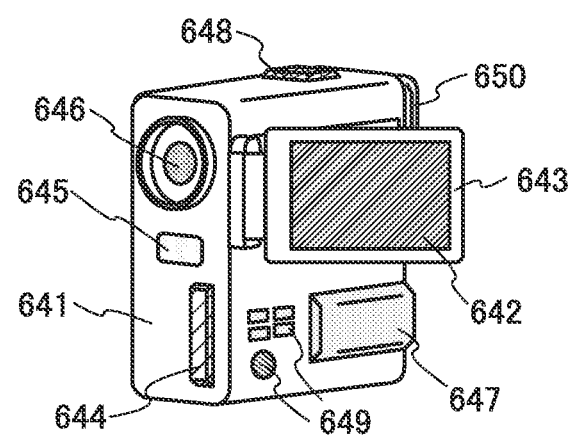

FIG. 6D illustrates a camera of one embodiment of the present invention, which includes a main body 641, a display portion 642, a housing 643, an external connection port 644, a remote control receiving portion 645, an image receiving portion 646, a battery 647, an audio input portion 648, operation keys 649, an eyepiece portion 650, and the like. In this camera, the light-emitting device of one embodiment of the present invention can be applied to the display portion 642. Since the light-emitting device of one embodiment of the present invention is driven at low voltage and has high current efficiency, by the application of the light-emitting device of one embodiment of the present invention, a camera with reduced power consumption can be obtained.

Figure 7A:
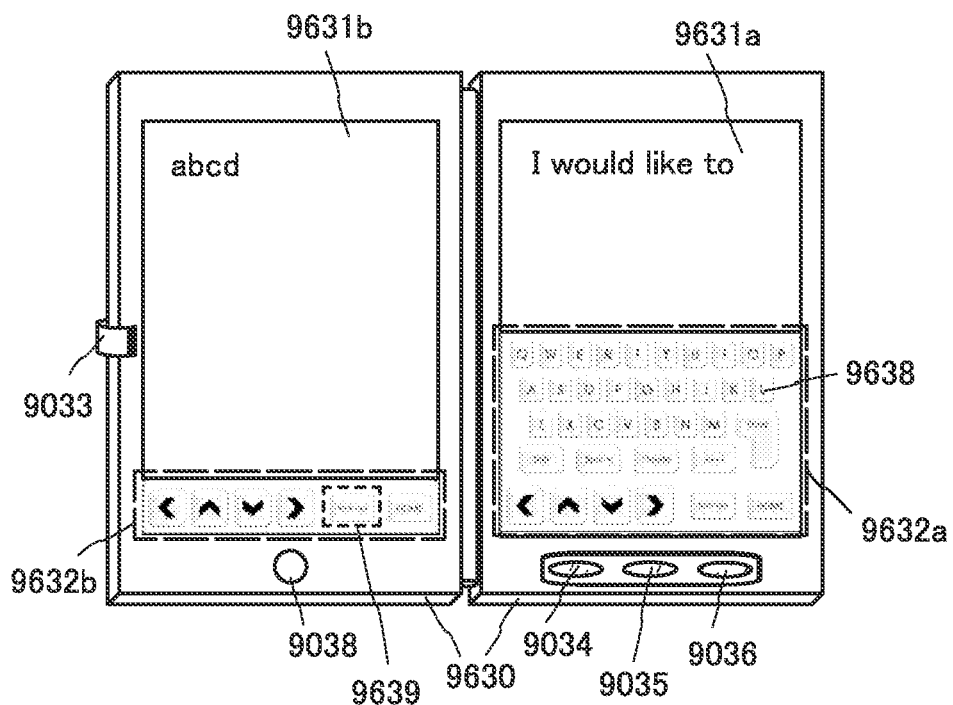
FIGS. 7A to 7C illustrate an electronic device of one embodiment of the present invention.
Figure 7B:
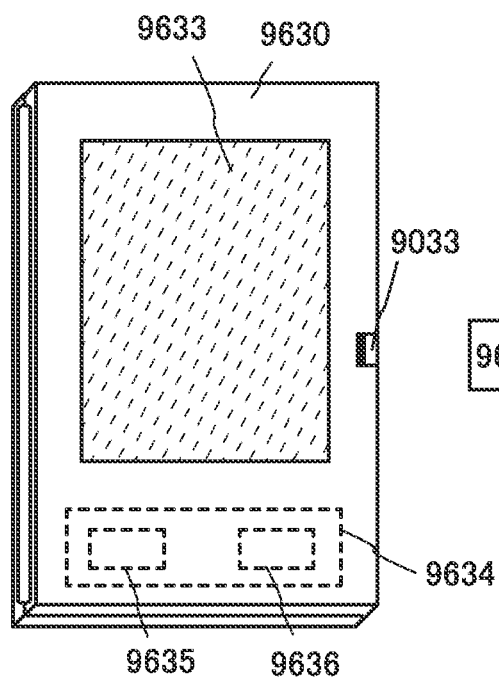

FIGS. 7A and 7B illustrate a foldable tablet terminal. The tablet terminal is opened in FIG. 7A. The tablet terminal includes a housing 9630, a display portion 9631a, a display portion 9631b, a display mode switch 9034, a power switch 9035, a power saver switch 9036, a clasp 9033, and an operation switch 9038.

The light-emitting device described in any of the above embodiments can be used for the display portion 9631a and the display portion 9631b, so that the tablet terminal can have reduced power consumption.

Part of the display portion 9631a can be a touch panel region 9632a and data can be input when a displayed operation key 9638 is touched. Although a structure in which a half region in the display portion 9631a has only a display function and the other half region has a touch panel function is shown as an example, the display portion 9631a is not limited to the structure. The whole region in the display portion 9631a may have a touch panel function. For example, the display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between a portrait mode, a landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Although the display portion 9631a and the display portion 9631b have the same display area in FIG. 7A, one embodiment of the present invention is not limited to this example. They may differ in size and/or image quality. For example, higher definition images may be displayed on one of the display portions 9631a and 9631b.

The tablet terminal is closed in FIG. 7B. The tablet terminal includes the housing 9630, a solar cell 9633, and a charge and discharge control circuit 9634. In FIG. 7B, a structure including a battery 9635 and a DCDC converter 9636 is illustrated as an example of the charge and discharge control circuit 9634.

Since the tablet terminal is foldable, the housing 9630 can be closed when the tablet terminal is not used. As a result, the display portion 9631*a* and the display portion 9631*b* can be protected; thus, a tablet terminal which has excellent durability and excellent reliability in terms of long-term use can be provided.

The tablet terminal illustrated in FIGS. 7A and 7B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

Figure 7C:
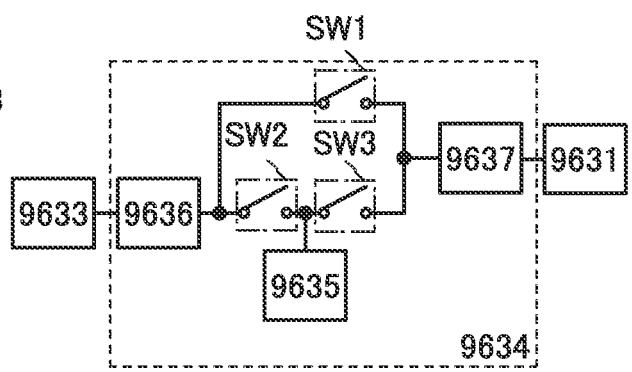

The structure and the operation of the charge and discharge control circuit 9634 illustrated in FIG. 7B will be described with reference to a block diagram in FIG. 7C. The solar cell 9633, the battery 9635, the DCDC converter 9636, a converter 9637, switches SW1 to SW3, and a display portion 9631 are illustrated in FIG. 7C, and the battery 9635, the DCDC converter 9636, the converter 9637, and the switches SW1 to SW3 correspond to the charge and discharge control circuit 9634 illustrated in FIG. 7B.

First, an example of the operation in the case where power is generated by the solar cell 9633 using external light is described. The voltage of power generated by the solar cell is stepped up or down by the DCDC converter 9636 so that the power has voltage for charging the battery 9635. Then, when the power from the solar cell 9633 is used for the operation of the display portion 9631, the switch SW1 is turned on and the voltage of the power is stepped up or down by the converter 9637 so as to be voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, there is no particular limitation on a way of charging the battery 9635, and the battery 9635 may be charged with another power generation means such as a piezoelectric element or a thermoelectric conversion element (Peltier element). For example, a non-contact electric power transmission module which transmits and receives power wirelessly (without contact) to charge the battery 9635, or a combination of the solar cell 9633 and another means for charge may be used.

The configuration, method, and the like described in this embodiment can be combined as appropriate with any of the configurations, methods, and the like described in the other embodiments.

As described above, the applicable range of the light-emitting device of one embodiment of the present invention is so wide that the light-emitting device can be applied to electronic devices in a variety of fields. With the use of the light-emitting device of one embodiment of the present invention, an electronic device with reduced power consumption can be obtained.

The light-emitting device of one embodiment of the present invention can also be used as a lighting device. Specific examples of the lighting device are described with reference to FIGS. 8A to 8C.

Figure 8A:
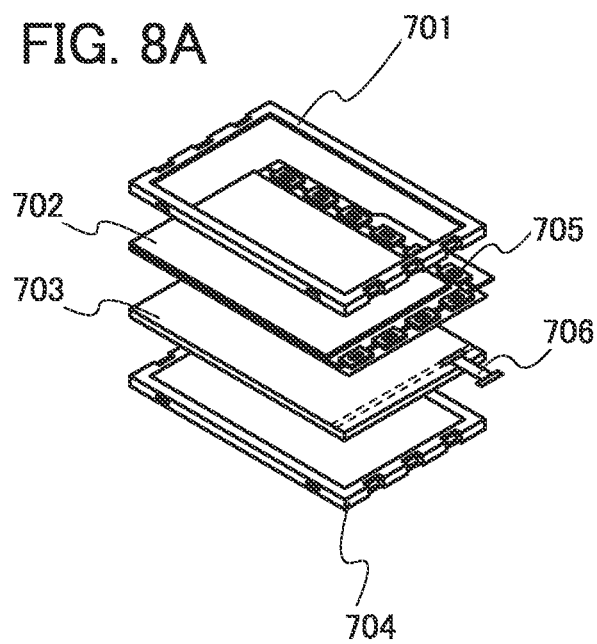
FIGS. 8A to 8C illustrate electronic devices and lighting devices of embodiments of the present invention.

FIG. 8A illustrates an example of a liquid crystal display device using the light-emitting device of one embodiment of the present invention as a backlight. The liquid crystal display device illustrated in FIG. 8A includes a housing 701, a liquid crystal panel 702, a backlight 703, and a housing 704. The liquid crystal panel 702 is connected to a driver IC 705. The light-emitting device of one embodiment of the present invention is used as the backlight 703, and current is supplied through a terminal 706. By using the light-emitting device of one embodiment of the present invention as a backlight of a liquid crystal display device as described above, a backlight with low power consumption can be obtained. Moreover, since the light-emitting device of one embodiment of the present invention is a lighting device for surface light emission and the enlargement of the light-emitting device is possible, the backlight can be made larger. Thus, a larger-area liquid crystal display device with low power consumption can be obtained.

Figure 8B:
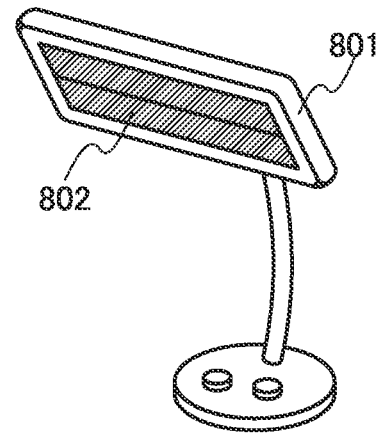

FIG. 8B illustrates an example in which the light-emitting device of one embodiment of the present invention is used for a desk lamp which is a lighting device. The desk lamp illustrated in FIG. 8B includes a housing 801 and a light source 802, and the light-emitting device of one embodiment of the present invention is used as the light source 802. Since the light-emitting device of one embodiment of the present invention is driven at low voltage and has high current efficiency, by the application of the light-emitting device of one embodiment of the present invention, a desk lamp with reduced power consumption can be obtained.

Figure 8C:
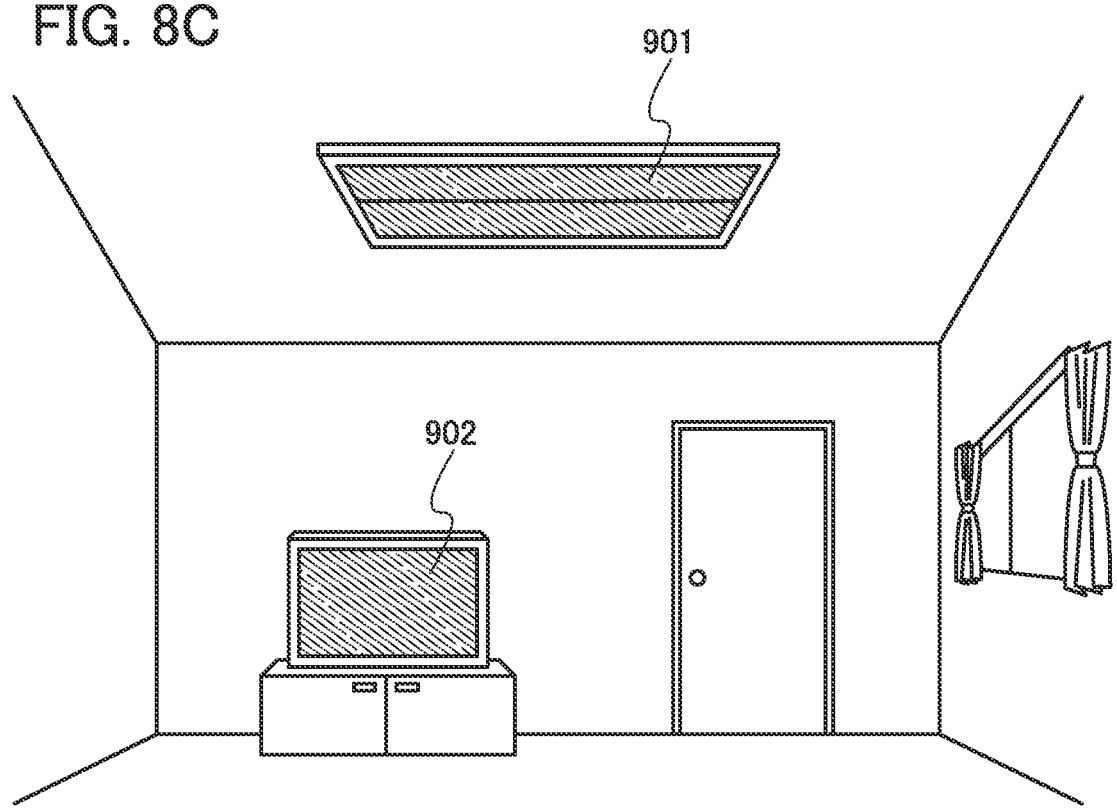

FIG. 8C illustrates an example in which the light-emitting device of one embodiment of the present invention is used for an indoor lighting device 901. Since the light-emitting device of one embodiment of the present invention can also have a larger area, the light-emitting device of one embodiment of the present invention can be used as a lighting device having a large area. Since the light-emitting device of one embodiment of the present invention is driven at low voltage and has high current efficiency, by the application of the light-emitting device of one embodiment of the present invention, a lighting device with reduced power consumption can be obtained. In a room where the light-emitting device of one embodiment of the present invention is used for the indoor lighting device 901 as described above, a television set 902 of one embodiment of the present invention as described with reference to FIG. 6A can be installed so that public broadcasting and movies can be watched.

Note that this embodiment can be combined with any of the other embodiments as appropriate.

Example 1

In this example, an example of a method for synthesizing the organic compound which is represented by Structural Formula (101) in Embodiment 1 will be described.

Method for Synthesizing 7-[3-(Dibenzothiophen-4-yl)phenyl]imidazo[1,2-f]phenanthridine (Abbreviation: 7mDBTPIPt-II) Represented by Structural Formula (101)

First, an example of a method for synthesizing 7mDBT-PIPt-II represented by Structural Formula (101) will be described.

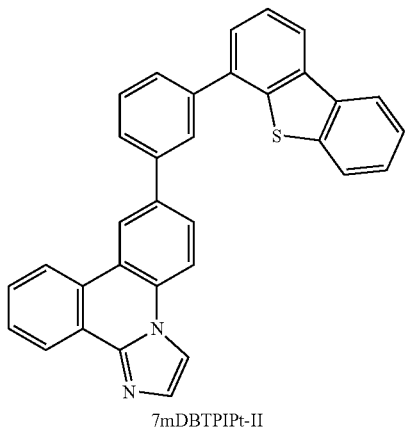

7mDBTPIPt-II

In a 200-mL three-neck flask were put 1.2 g (4.0 mmol) of 7-bromoimidazo[1,2-f]phenanthridine, 1.3 g (4.4 mmol) of 3-(dibenzothiophen-4-yl)phenylboronic acid, 40 mL of toluene, 8 mL of ethanol, and 4 mL of a 2M aqueous solution of potassium carbonate. The mixture was degassed by being stirred under reduced pressure, and the air in the flask was replaced with nitrogen. To the mixture, 92 mg (80 μmol) of tetrakis(triphenylphosphine)palladium(0) was added, and the mixture was stirred at 80° C. under a nitrogen stream for 6 hours. After the predetermined time elapsed, water was added to the mixture. A precipitated solid was subjected to suction filtration and the solid was washed with methanol. The obtained solid was purified by silica gel column chromatography (toluene:ethyl acetate=1:1) to give a solid. The solid was recrystallized with toluene to give 1.4 g of a white powder of the objective substance in a yield of 74%.

Purification by a train sublimation method was performed on 1.4 g of the white powder of 7-[3-(dibenzothiophen-4-yl)phenyl]imidazo[1,2-f]phenanthridine. In the purification by sublimation, 7-[3-(dibenzothiophen-4-yl)phenyl]imidazo[1,2-f]phenanthridine was heated at 280° C. under the conditions where the pressure was 3.3 Pa and the argon flow rate was 5 mL/min. After the purification by sublimation, 1.3 g of a white solid of 7-[3-(dibenzothiophen-4-yl)phenyl]imidazo[1,2-f]phenanthridine was obtained at a collection rate of 93%. Reaction Scheme (C-1) of the above synthesis method is shown below.

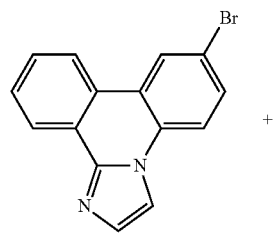

(C-1)

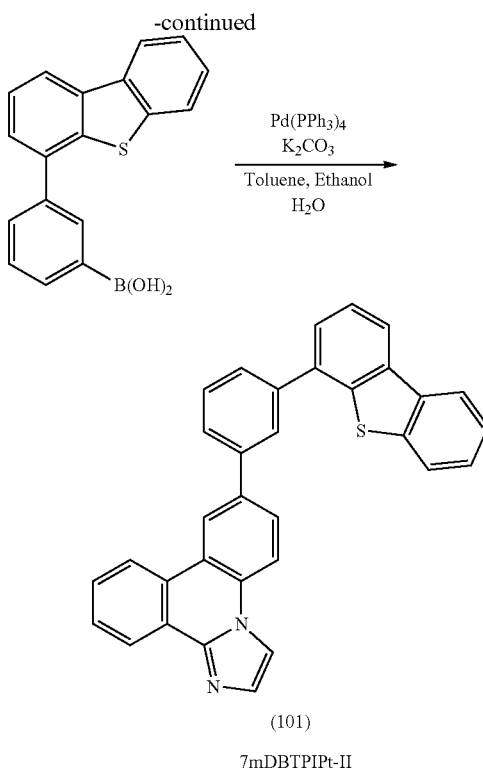

7mDBTPIPt-II

The compound obtained by Reaction Scheme (C-1) was identified by a nuclear magnetic resonance ($^1$H NMR) method. The measurement data are shown below.

$^1$H NMR (CDCl$_3$, 300 MHz): δ(ppm)=7.45-7.52 (m, 2H), 7.58-7.70 (m, 6H), 7.78-7.87 (m, 3H), 7.94-8.00 (m, 2H), 8.03 (d, J=1.5 Hz, 1H), 8.12 (t, J=1.8 Hz, 1H), 8.19-8.23 (m, 2H), 8.47-8.50 (m, 1H), 8.67-8.70 (m, 1H), 8.75 (d, J=1.5 Hz, 1H).

Figure 9A:
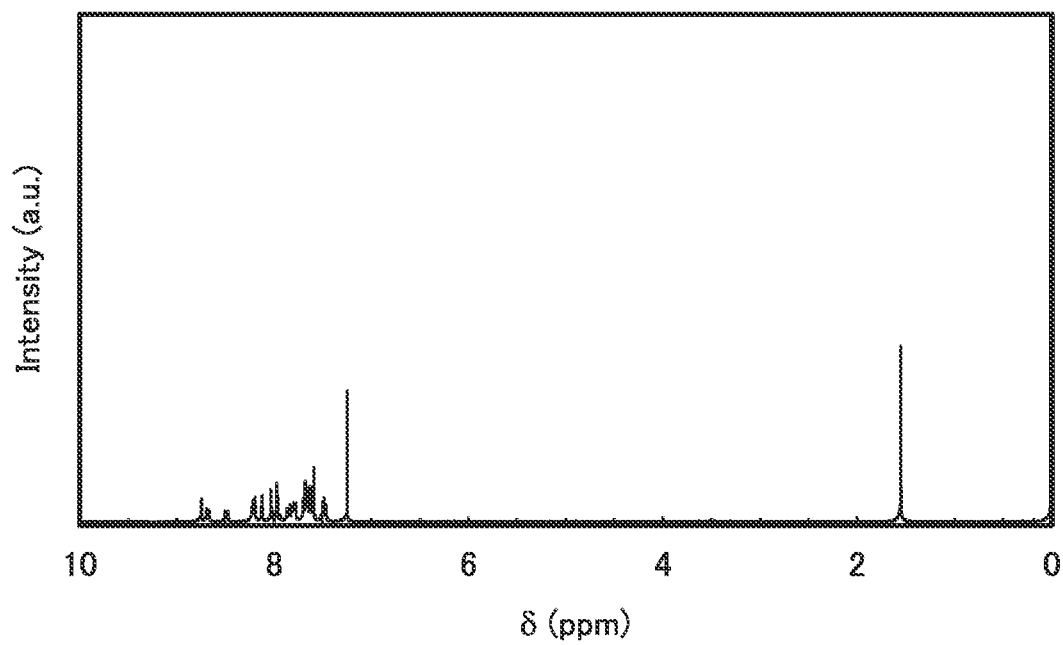
FIGS. 9A and 9B are $^1$H NMR charts of 7mDBTPIPt-II.
Figure 9B:
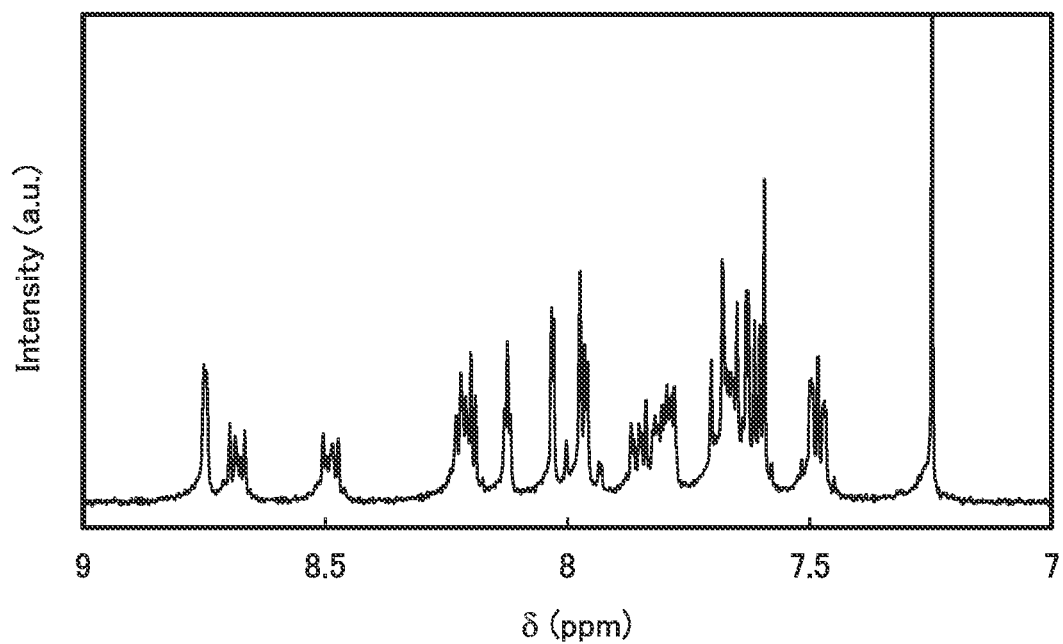

FIGS. 9A and 9B are $^1$H NMR charts. Note that FIG. 9B is an enlarged chart of FIG. 9A. The measurement results reveal that 7mDBTPIPt-II, which was the objective substance, was obtained.

Next, 7mDBTPIPt-II obtained in this example was analyzed by liquid chromatography mass spectrometry (LC/MS).

The analysis by LC/MS was carried out with Acquity UPLC (produced by Waters Corporation) and Xevo G2 Tof MS (produced by Waters Corporation).

In the MS analysis, ionization was carried out by an electrospray ionization (ESI) method. Capillary voltage and sample cone voltage were set to 3.0 kV and 30 V, respectively. Detection was performed in a positive mode. A component which underwent the ionization under the above-mentioned conditions was collided with an argon gas in a collision cell to dissociate into product ions. Energy (collision energy) for the collision with argon was 70 eV. A mass range for the measurement was m/z=100-1200.

Figure 10:
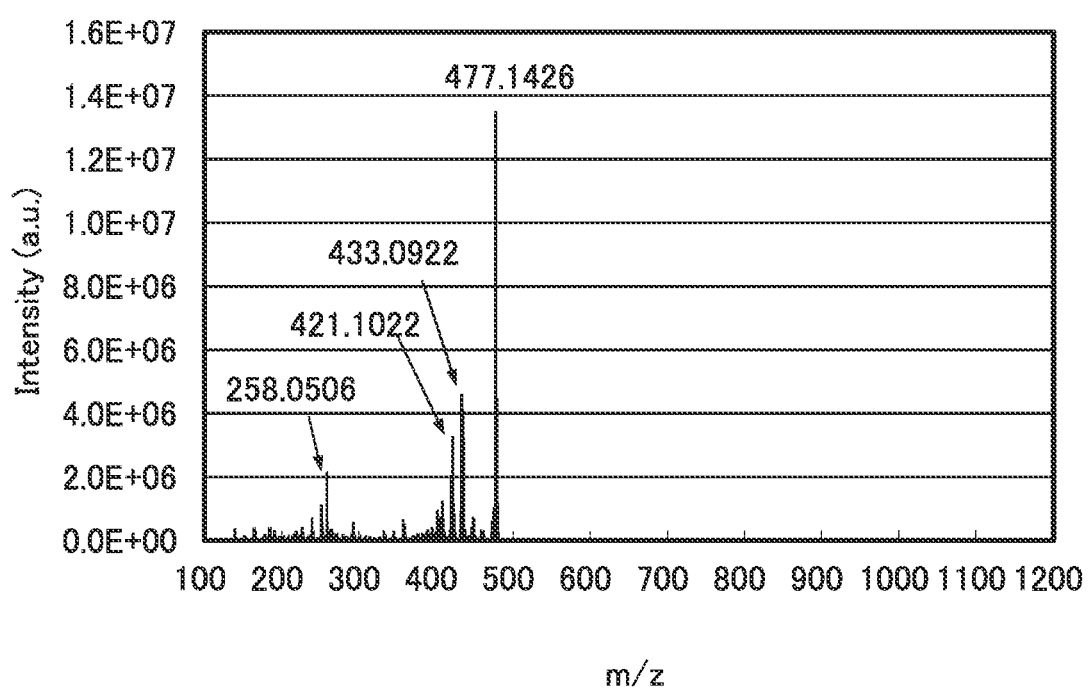
FIG. 10 shows LC/MS measurement results of 7mDBT-PIPt-II.

FIG. 10 shows the results of the MS analysis. The results in FIG. 10 show that as for 7mDBTPIPt-II which is one embodiment of the present invention, peaks of product ions are detected mainly around m/z=258, m/z=421, and m/z=433, and a peak derived from a precursor ion is detected around m/z=477. Here, in the analysis by LC/MS, "around" is used to express changes in values of product ions and precursor ions due to the existence and absence of hydrogen ions and the existence of isotopes, and these changes in values are in an acceptable range included in similar skeletons. Note that the results in FIG. 10 show characteristics derived from 7mDBTPIPt-II and therefore can be regarded as important data for identifying 7mDBT-PIPt-II contained in a mixture.

Figure 11A:
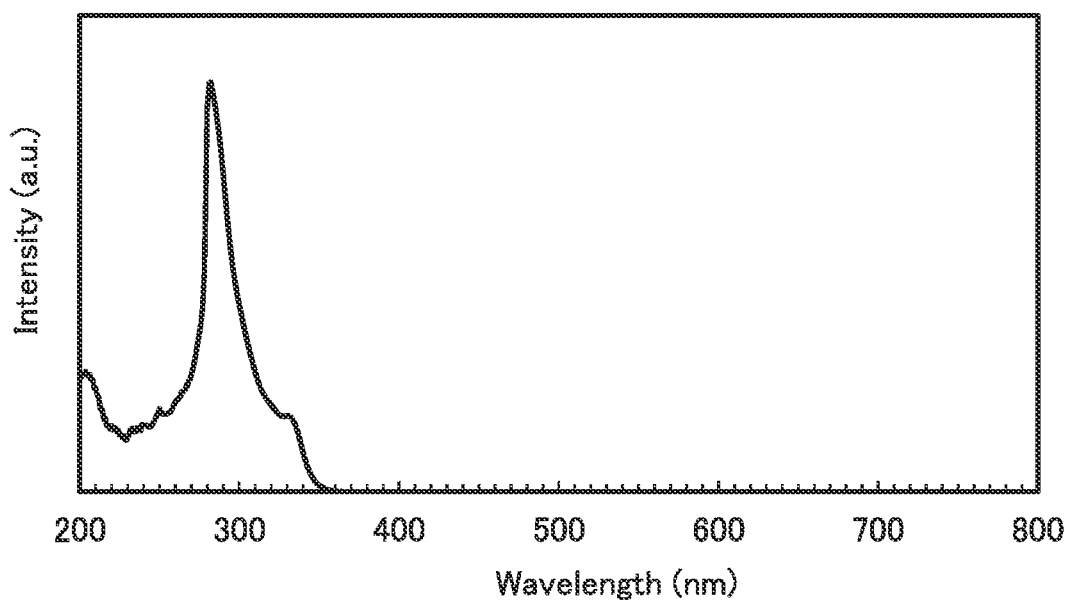
FIGS. 11A and 11B show an absorption spectrum and an emission spectrum of a toluene solution of 7mDBTPIPt-II.
Figure 11B:
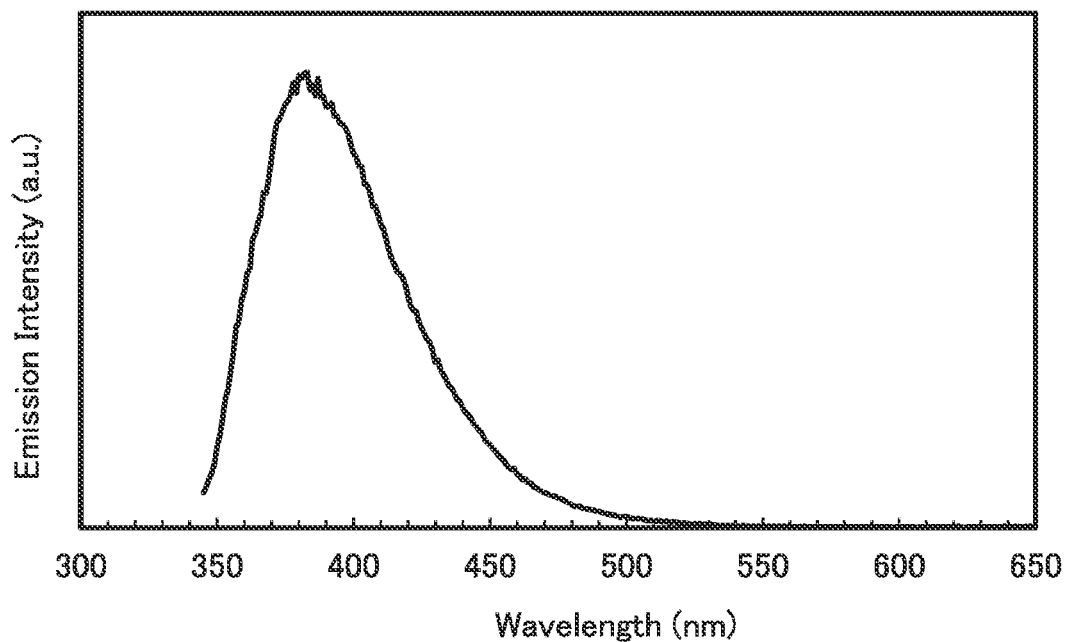
Figure 12A:
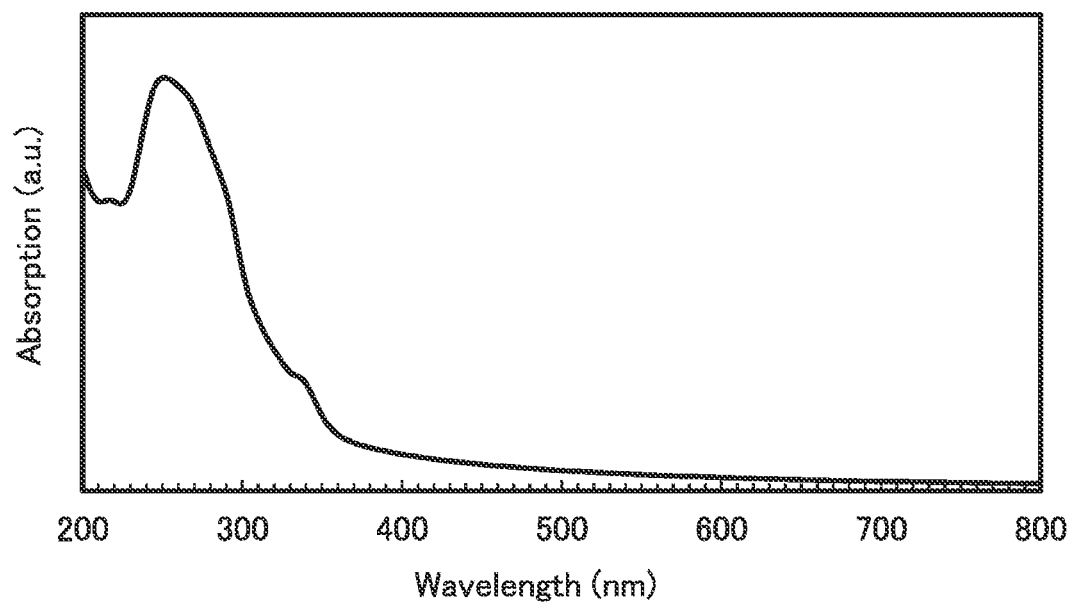
FIGS. 12A and 12B show an absorption spectrum and an emission spectrum of a thin film of 7mDBTPIPt-II.
Figure 12B:
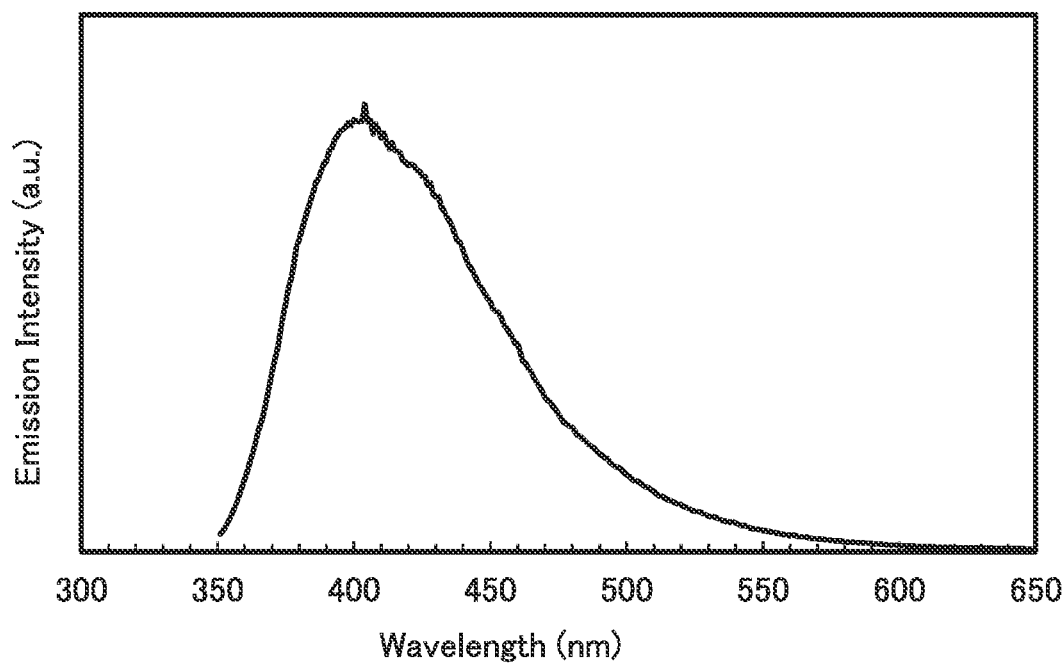

FIG. 11A shows an absorption spectrum of a toluene solution of 7mDBTPIPt-II and FIG. 11B shows an emission spectrum thereof. FIG. 12A shows an absorption spectrum of a thin film of 7mDBTPIPt-II and FIG. 12B shows an emission spectrum thereof. The absorption spectrum was measured with a UV-visible spectrophotometer (V550, produced by JASCO Corporation). The measurement was performed with samples prepared in such a manner that the solution was put in a quartz cell while the thin film was obtained by evaporation onto a quartz substrate. The absorption spectrum of the solution was obtained by subtracting the absorption spectra of quartz and toluene from those of quartz and the solution, and the absorption spectrum of the thin film was obtained by subtracting the absorption spectrum of the quartz substrate from those of the quartz substrate and the thin film.

In FIGS. 11A and 11B and FIGS. 12A and 12B, the horizontal axis represents wavelength (nm) and the vertical axis represents intensity (arbitrary unit). In the case of the toluene solution, the absorption peaks are at 282 nm and 333 nm, and the emission peak is at 382 nm (excitation wavelength: 334 nm). In the case of the thin film, the absorption peaks are at 251 nm, 264 nm, 284 nm, and 335 nm, and the emission peak is at 402 nm (excitation wavelength: 338 nm).

Example 2

In this example, an example of a method for synthesizing the organic compound which is represented by Structural Formula (107) in Embodiment 1 will be described.

Method for Synthesizing 7-[3'-(Dibenzothiophen-4-yl)biphenyl-3-yl]imidazo[1,2-f]phenanthridine (Abbreviation: 7mDBtBPIPt) Represented by Structural Formula (107)

First, an example of a method for synthesizing 7mDBtBPIPt represented by Structural Formula (107) will be described.

In a 200-mL three-neck flask were put 1.8 g (6.0 mmol) of 7-bromoimidazo[1,2-f]phenanthridine, 2.5 g (6.6 mmol) of 3'-(dibenzothiophen-4-yl)-3-biphenylboronic acid, 0.18 g (0.60 mmol) of tri(ortho-tolyl)phosphine, 60 mL of toluene, 12 mL of ethanol, and 6 mL of a 2M aqueous solution of potassium carbonate. The mixture was degassed by being stirred under reduced pressure, and the air in the flask was replaced with nitrogen. To the mixture, 27 mg (0.12 mmol) of palladium(II) acetate was added, and the mixture was stirred at 80° C. under a nitrogen stream for 11 hours. After the predetermined time elapsed, water was added to the mixture and an aqueous layer was extracted with toluene. The obtained solution of the extract and an organic layer were combined and washed with water and a saturated saline, and then, the organic layer was dried over magnesium sulfate. This mixture was subjected to gravity filtration, and the filtrate was concentrated to give a solid. The obtained solid was purified by silica gel column chromatography (toluene:ethyl acetate=1:1) to give a white solid. The solid was recrystallized with a mixed solvent of toluene and hexane to give 2.9 g of a white powder of the objective substance in a yield of 88%.

Purification by a train sublimation method was performed on 2.6 g of the white powder of 7mDBtBPIPt. In the purification by sublimation, 7mDBtBPIPt was heated at 310° C. under the conditions where the pressure was 4.9 Pa and the argon flow rate was 10 mL/min. After the purification by sublimation, 2.1 g of a white solid of 7mDBtBPIPt was obtained at a collection rate of 81%. Reaction Scheme (D-1) of the above synthesis method is shown below.

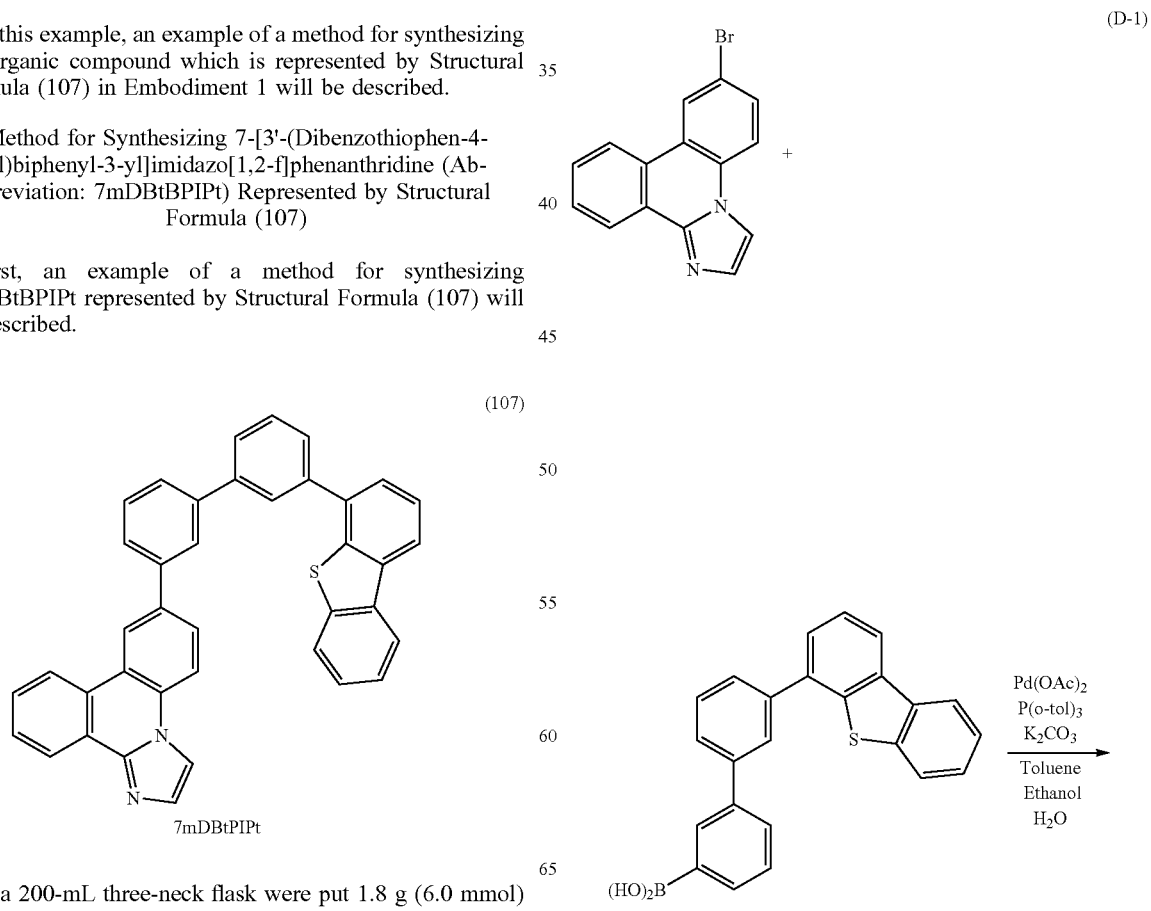

-continued

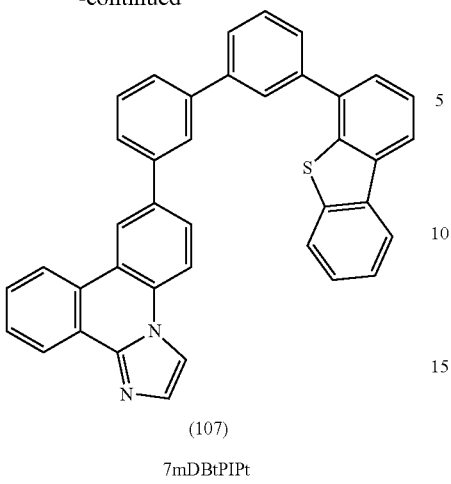

(107)

7mDBtPIPt

The compound obtained by Reaction Scheme (D-1) was identified by the 1H NMR method. The measurement data are shown below.

$^1$H NMR (CDCl$_3$, 300 MHz): δ=7.45-7.52 (m, 2H), 7.58-7.70 (m, 7H), 7.74-7.84 (m, 5H), 7.92-8.05 (m, 4H), 8.10-8.12 (m, 1H), 8.18-8.23 (m, 2H), 8.50 (dd, J=6.9 Hz, 2.4 Hz, 1H), 8.69 (dd, J=6.9 Hz, 2.4 Hz, 1H), 8.74 (d, J=2.4 Hz, 1H).

Figure 23A:
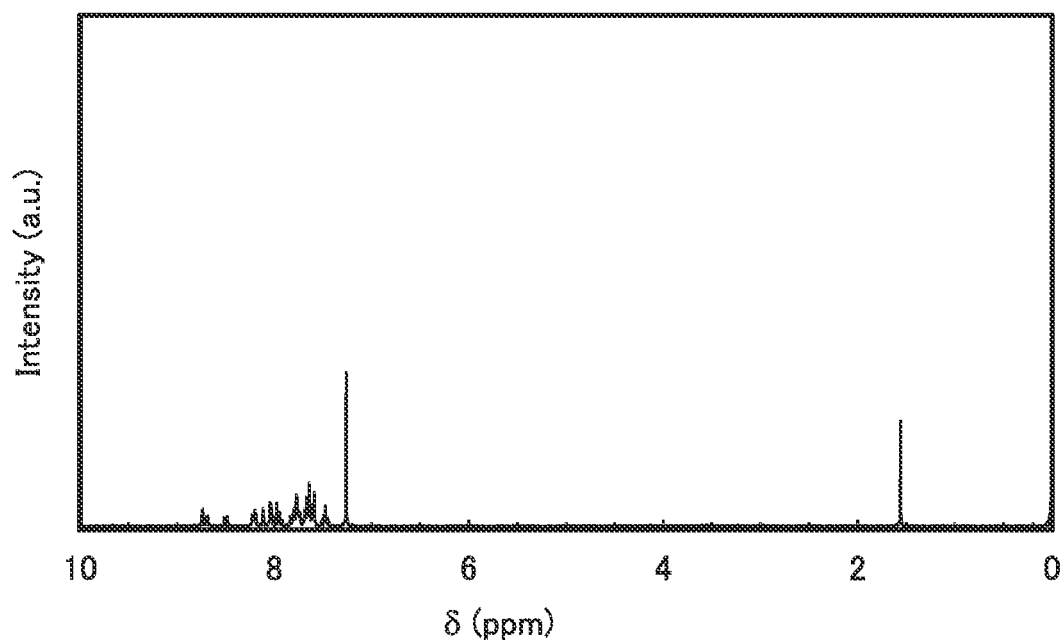
FIGS. 23A and 23B are $^1$H NMR charts of 7mDBtBPIPt.
Figure 23B:
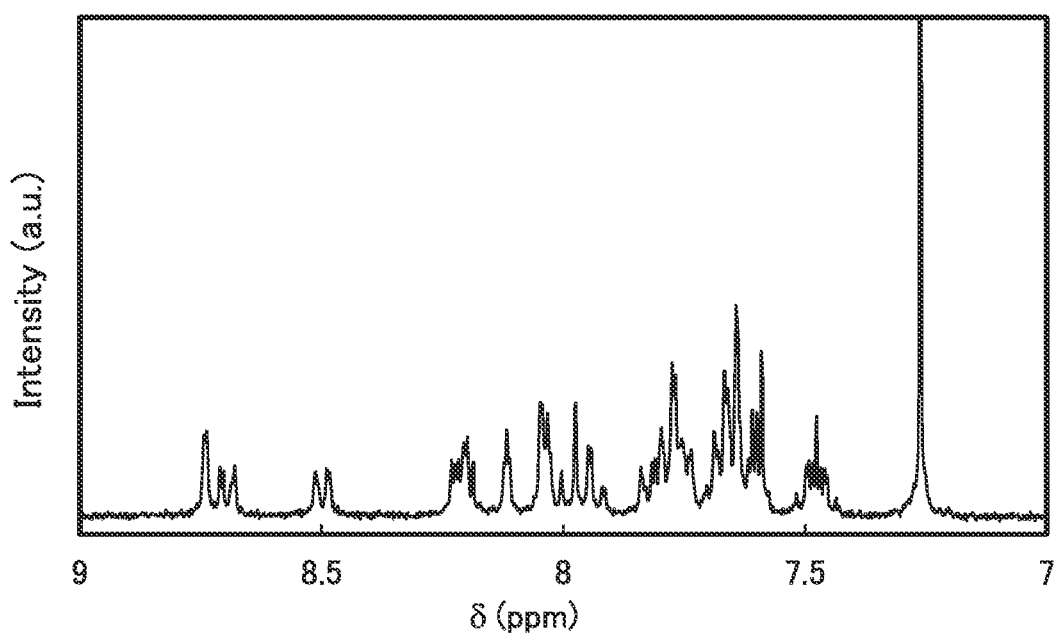

FIGS. 23A and 23B are $^1$H NMR charts. Note that FIG. 23B is an enlarged chart of FIG. 23A. The measurement results reveal that 7mDBtBPIPt, which was the objective substance, was obtained.

Next, 7mDBtBPIPt obtained in this example was analyzed by LC/MS.

Measuring devices and the conditions similar to those in Example 1 were adopted for the LC/MS analysis.

Figure 24:
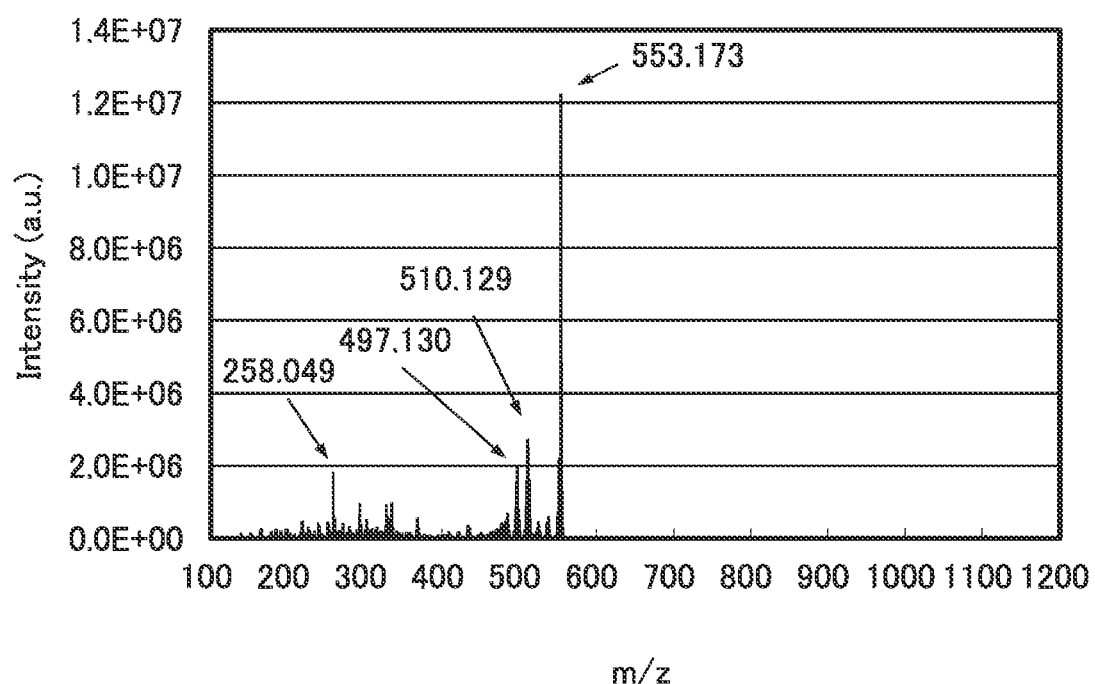
FIG. 24 shows LC/MS measurement results of 7mDBtBPIPt.

FIG. 24 shows results of the MS analysis. The results in FIG. 24 show that as for 7mDBtBPIPt which is one embodiment of the present invention, peaks of product ions are detected mainly around m/z=258, m/z=497, and m/z=510, and a peak derived from a precursor ion is detected around m/z=553. Note that the results in FIG. 24 show characteristics derived from 7mDBtBPIPt and therefore can be regarded as important data for identifying 7mDBtBPIPt contained in a mixture.

Figure 25A:
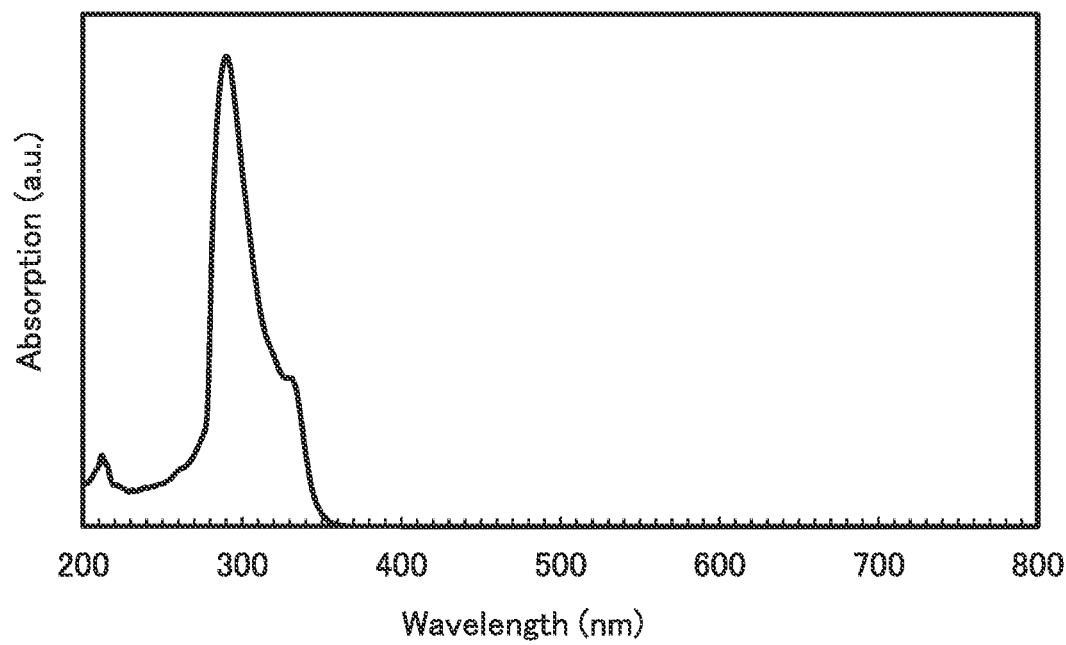
FIGS. 25A and 25B show an absorption spectrum and an emission spectrum of a toluene solution of 7mDBtBPIPt.
Figure 25B:
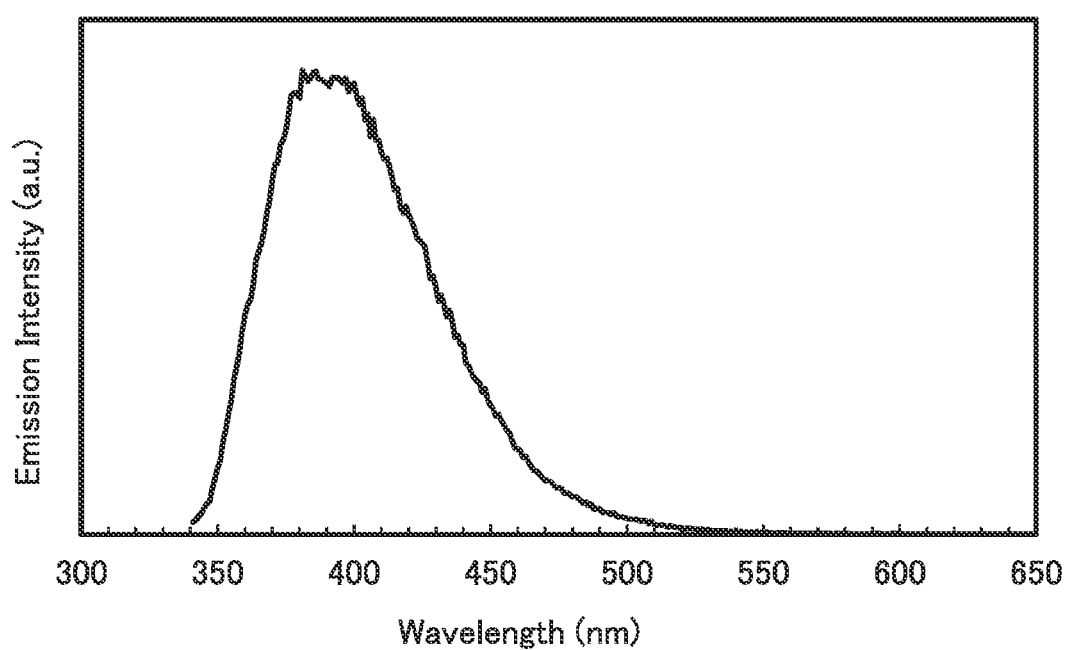
Figure 26A:
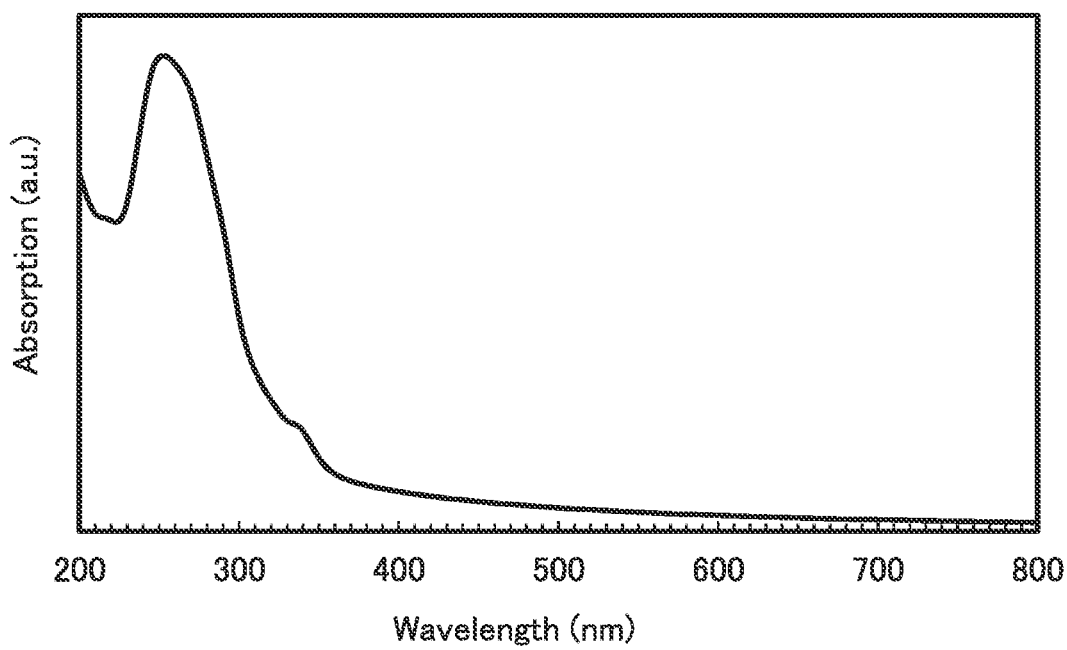
FIGS. 26A and 26B show an absorption spectrum and an emission spectrum of a thin film of 7mDBtBPIPt.
Figure 26B:
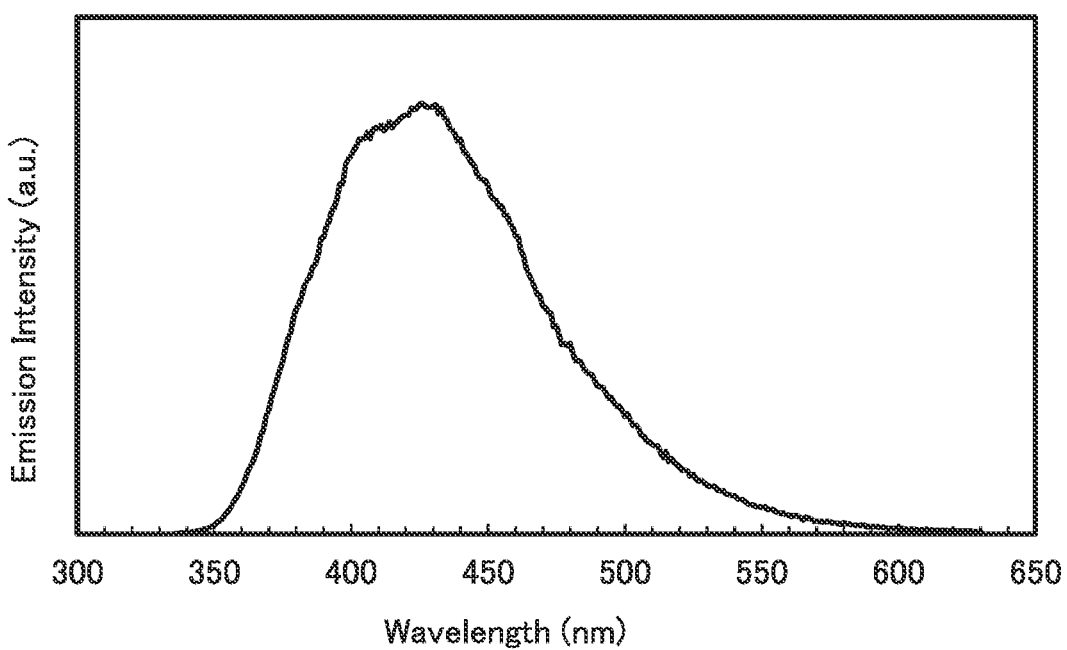

FIG. 25A shows an absorption spectrum of a toluene solution of 7mDBtBPIPt and FIG. 25B shows an emission spectrum thereof. FIG. 26A shows an absorption spectrum of a thin film of 7mDBtBPIPt and FIG. 26B shows an emission spectrum thereof. The absorption spectra and the emission spectra were obtained by adopting the instruments and the conditions which are the same as those of Example 1.

In FIGS. 25A and 25B and FIGS. 26A and 26B, the horizontal axis represents wavelength (nm) and the vertical axis represents intensity (arbitrary unit). In the case of the toluene solution, the absorption peaks are at 290 nm and 330 nm, and the emission peak is at 388 nm (excitation wavelength: 332 nm). In the case of the thin film, the absorption peaks are at 267 nm, 288 nm, 320 nm, and 336 nm, and the emission peaks are at 410 nm and 426 nm (excitation wavelength: 321 nm).

Example 3

Figure 13:
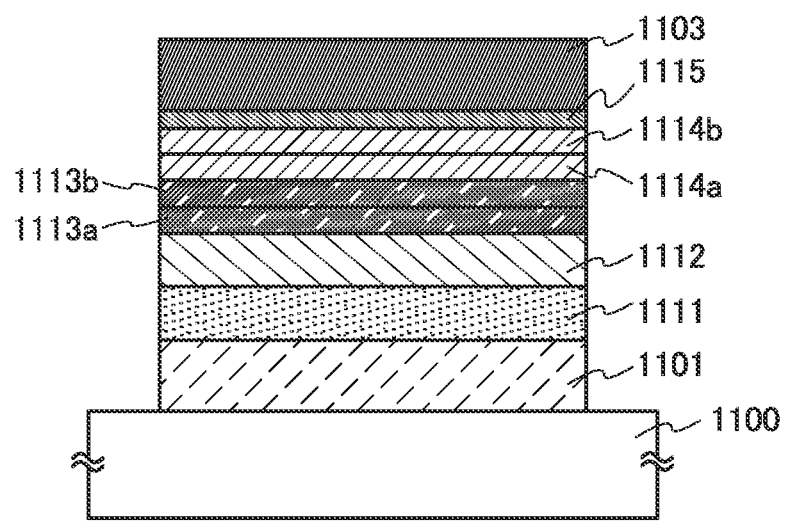
FIG. 13 is a diagram to explain light-emitting elements (light-emitting elements 1 and 2) in Examples.

In this example, a light-emitting element of one embodiment of the present invention (a light-emitting element 1) will be described with reference to FIG. 13. Chemical formulae of materials used in this example are shown below.

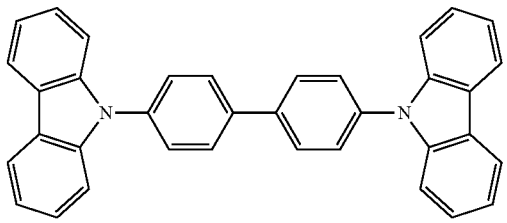

CBP

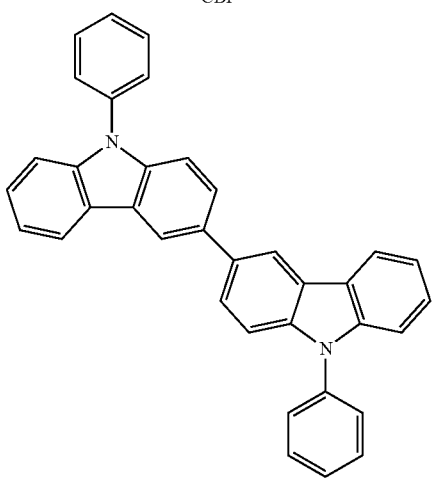

PCCP

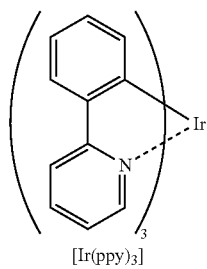

[Ir(ppy)$_3$]

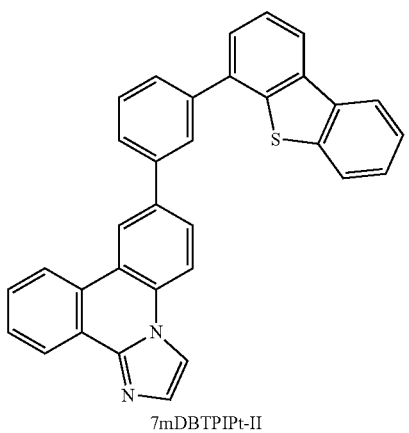

7mDBTPIPt-II

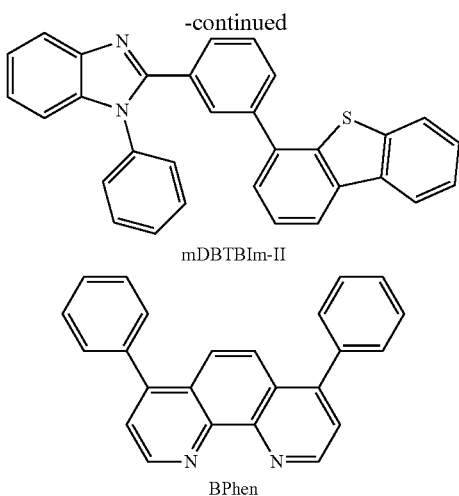

mDBTBIm-II

BPhen

A method for manufacturing the light-emitting element 1 of this example will be described below.

(Light-emitting Element 1)

First, over a substrate 1100, indium oxide-tin oxide containing silicon or silicon oxide (ITO-$SiO_2$, hereinafter abbreviated to ITSO) was deposited by a sputtering method, whereby a first electrode 1101 was formed. Note that the composition of the target used was as follows: $In_2O_3$:$SnO_2$:$SiO_2$=85:10:5 [wt %]. The thickness of the first electrode 1101 was 110 nm and the electrode area was 2 mm×2 mm. Here, the first electrode 1101 functions as an anode of the light-emitting element.

Next, as pretreatment for forming the light-emitting element over the substrate 1100, the surface of the substrate was washed with water, baked at 200° C. for 1 hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the first electrode 1101 was formed was fixed to a substrate holder provided in the vacuum evaporation apparatus so that the surface provided with the first electrode 1101 faced downward. The pressure in the vacuum evaporation apparatus was reduced to about $10^{-4}$ Pa. After that, on the first electrode 1101, by an evaporation method using resistance heating, CBP and molybdenum oxide were deposited by co-evaporation, whereby a hole-injection layer 1111 was formed. The thickness of the hole-injection layer 1111 was set to 60 nm, and the weight ratio of CBP to molybdenum oxide was adjusted to 4:2 (=CBP: molybdenum oxide).

Next, PCCP was deposited on the hole-injection layer 1111 by evaporation, whereby a hole-transport layer 1112 was formed. The thickness of the hole-transport layer 1112 was set to 20 nm.

Next, on the hole-transport layer 1112, PCCP, 7mDBT-PIPt-II, and Ir(ppy)$_3$ were deposited by co-evaporation, whereby a first light-emitting layer 1113a was formed. Here, the weight ratio of PCCP to 7mDBTPIPt-II and Ir(ppy)$_3$ was adjusted to 0.3:1:0.06 (=PCCP: 7mDBTPIPt-II: Ir(ppy)$_3$). The thickness of the first light-emitting layer 1113a was set to 20 nm.

Note that in the first light-emitting layer 1113a, 7mDBT-PIPt-II that is one embodiment of the present invention was used as the first organic compound (host material), Ir(ppy)$_3$ was used as the second organic compound (guest material), and PCCP was used as the third organic compound (assist material). As described in this example, a hole-transport material without an amine skeleton is used as the third organic compound (assist material).

Then, a second light-emitting layer 1113b was formed on the first light-emitting layer 1113a by co-evaporation of 7mDBTPIPt-II and Ir(ppy)$_3$]. Here, the weight ratio of 7mDBTPIPt-II to Ir(ppy)$_3$ was adjusted to 1:0.06 (=7mDBT-PIPt-II: Ir(ppy)$_3$). The thickness of the second light-emitting layer 1113b was set to 20 nm.

Note that in the second light-emitting layer 1113b, 7mDBTPIPt-II was used as the first organic compound (host material), and Ir(ppy)$_3$ was used as the second organic compound (guest material).

Next, on the second light-emitting layer 1113b, a film of 2-[3-(dibenzothiophen-4-yl)phenyl]-1-phenyl-1H-benzimidazole (abbreviation: mDBTBIm-II) was formed to a thickness of 15 nm to form a first electron-transport layer 1114a.

Next, BPhen was deposited to a thickness of 20 nm on the first electron-transport layer 1114a, whereby a second electron-transport layer 1114b was formed.

Next, lithium fluoride was deposited by evaporation to a thickness of 1 nm on the second electron-transport layer 1114b, whereby an electron-injection layer 1115 was formed.

Lastly, aluminum was deposited by evaporation to a thickness of 200 nm as a second electrode 1103 which functions as a cathode. Through the above steps, the light-emitting element 1 of this example was manufactured.

Note that in all the above evaporation steps, evaporation was performed by a resistance-heating method.

Table 1 shows an element structure of the light-emitting element 1 obtained as described above.

TABLE 1

Device structure of the light-emitting element 1

| First Electrode | Hole-injection Layer | Hole-transport Layer | Light-emitting Layer | | Electron-transport Layer | | Electron-Injection Layer | Second Electrode |
|---|---|---|---|---|---|---|---|---|
| | | | $1^{st}$ | $2^{nd}$ | $1^{st}$ | $2^{nd}$ | | |
| ITSO 110 nm | CBP:MoO$_x$ (4:2) 60 nm | PCCP 20 nm | a 20 nm | b 20 nm | mDBTBIm-II 15 nm | BPhen 20 nm | LiF 1 nm | Al 200 nm |

[a] PCCP:7mDBTPIPt-II:Ir(ppy)$_3$ = 0.3:1:0.06
[b] 7mDBTPIPt-II:Ir(ppy)$_3$ = 1:0.06

Next, in a glove box containing a nitrogen atmosphere, the light-emitting element 1 was sealed with a glass substrate so as not to be exposed to the air (specifically, a sealant was applied onto an outer edge of the element and heat treatment was performed at 80° C. for 1 hour at the time of sealing). Then, the operating characteristics of the light-emitting element 1 were measured. Note that the measurement was carried out at room temperature (in an atmosphere kept at 25° C.).

Figure 14:
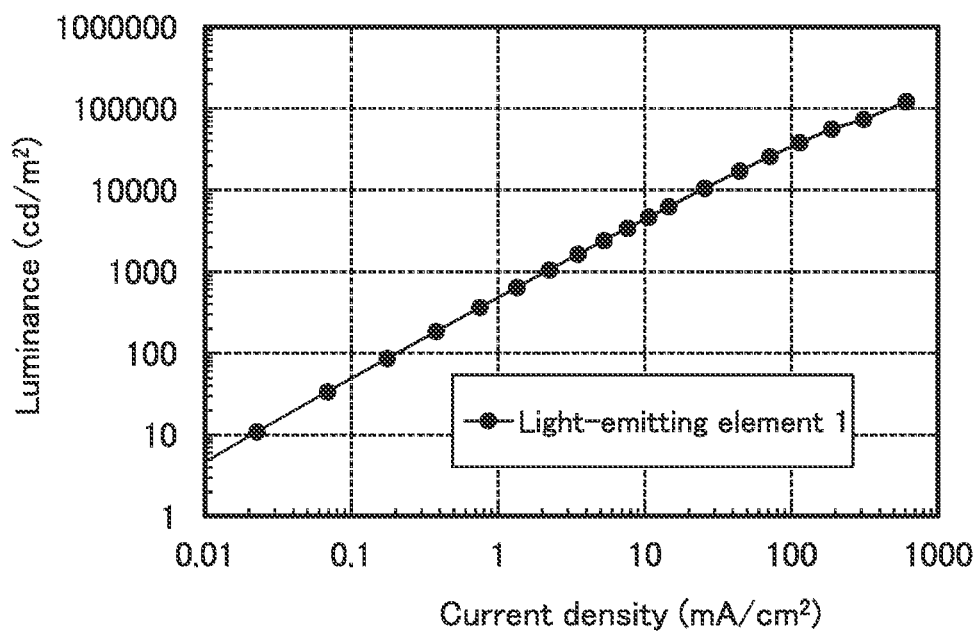
FIG. 14 shows current density-luminance characteristics of a light-emitting element 1.
Figure 15:
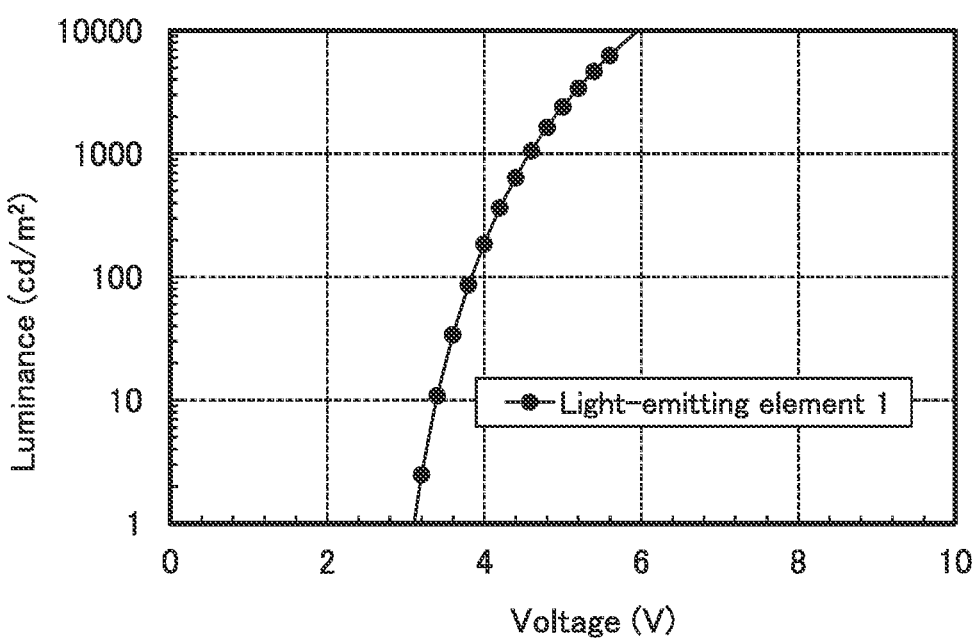
FIG. 15 shows voltage-luminance characteristics of a light-emitting element 1.
Figure 16:
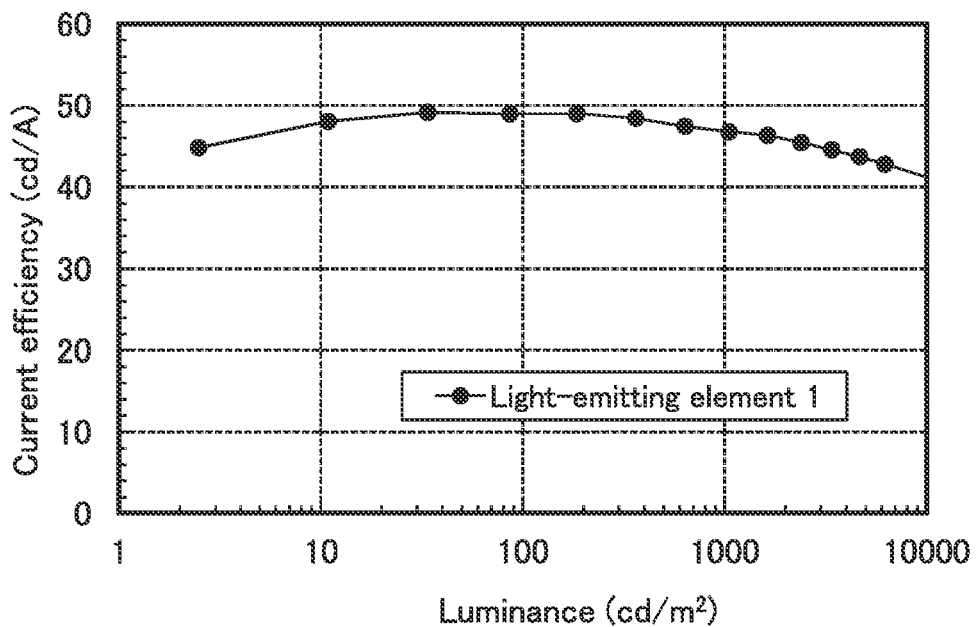
FIG. 16 shows luminance-current efficiency characteristics of a light-emitting element 1.
Figure 17:
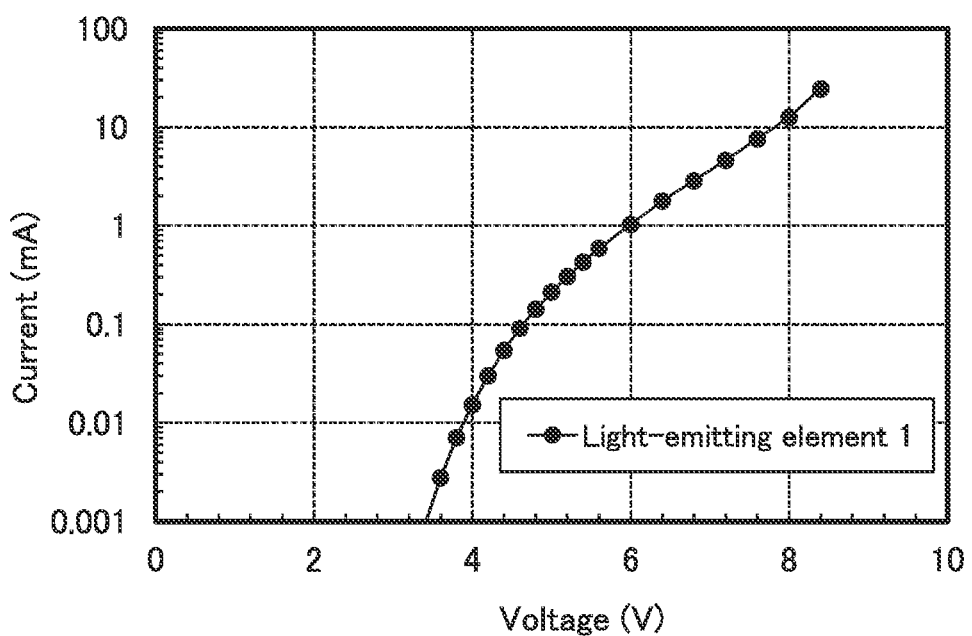
FIG. 17 shows voltage-current characteristics of a light-emitting element 1.

FIG. 14 shows current density-luminance characteristics of the light-emitting element 1. In FIG. 14, the horizontal axis represents current density (mA/cm$^2$) and the vertical axis represents luminance (cd/m$^2$). FIG. 15 shows voltage-luminance characteristics of the light-emitting element 1. In FIG. 15, the horizontal axis represents voltage (V) and the vertical axis represents luminance (cd/m$^2$). FIG. 16 shows luminance-current efficiency characteristics of the light-emitting element 1. In FIG. 16, the horizontal axis represents luminance (cd/m$^2$) and the vertical axis represents current efficiency (cd/A). Further, FIG. 17 shows voltage-current characteristics of the light-emitting element 1. In FIG. 17, the horizontal axis represents voltage (V) and the vertical axis represents current (mA).

Table 2 shows the voltage (V), current density (mA/cm$^2$), CIE chromaticity coordinates (x, y), current efficiency (cd/A), and external quantum efficiency (%) of the light-emitting element 1 at a luminance of 1050 cd/m$^2$.

TABLE 2

Characteristics of the light-emitting element 1 at 1050 cd/m$^2$

| Voltage (V) | Current Density (mA/cm$^2$) | CIE Chromaticity Coordinates x | CIE Chromaticity Coordinates y | Luminance (cd/m$^2$) | Current Efficiency (cd/A) | External Quantum Efficiency (%) |
|---|---|---|---|---|---|---|
| 4.6 | 2.2 | 0.31 | 0.62 | 1051 | 47 | 14 |

The above results demonstrate that the light-emitting element 1, which is one embodiment of the present invention, is driven at low voltage and has high current efficiency.

Figure 18:
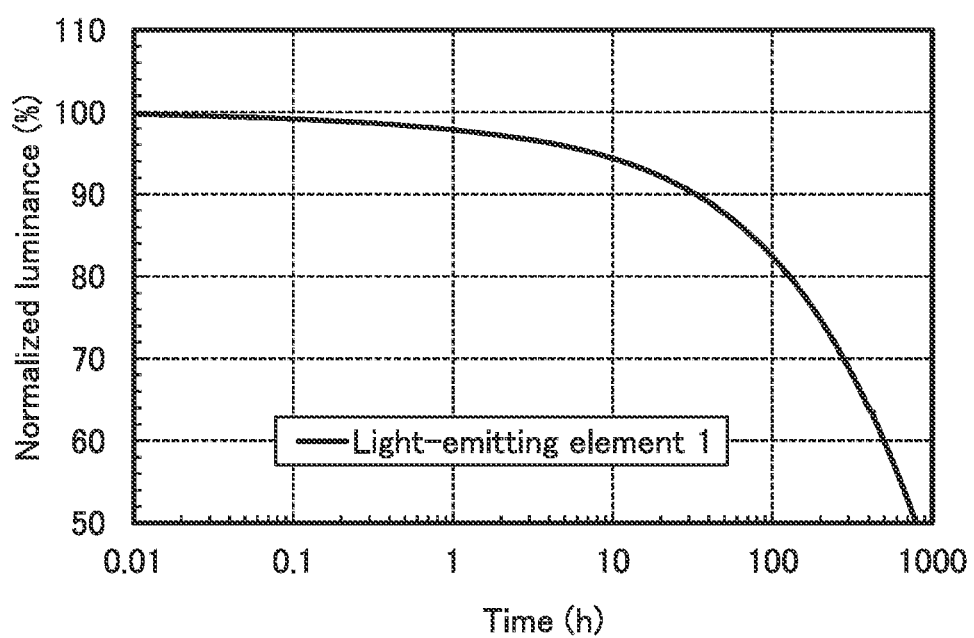
FIG. 18 shows results of a reliability test of a light-emitting element 1.

Next, a reliability test was performed on the light-emitting element 1. FIG. 18 shows the results of the reliability test.

In the reliability test, the light-emitting element 1 was driven under the conditions where the initial luminance was 5000 cd/m$^2$ and the current density was constant, and the variation of the luminance was monitored. In FIG. 18, the horizontal axis represents driving time (h) of the element on a logarithmic scale, and the vertical axis represents normalized luminance (%) at the initial luminance of 100%.

As shown in FIG. 18, the 50% decrease in the normalized luminance of the light-emitting element 1 took 790 hours.

The above results demonstrate that the light-emitting element 1, which is one embodiment of the present invention, has a long lifetime.

Example 4

In this example, a light-emitting element of one embodiment of the present invention (a light-emitting element 2) will be described with reference to FIG. 13. Chemical formulae of materials used in this example are shown below.

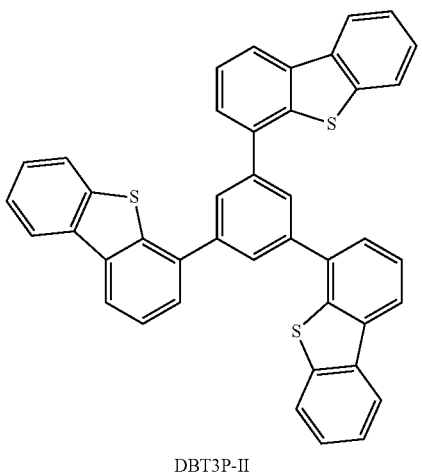

DBT3P-II

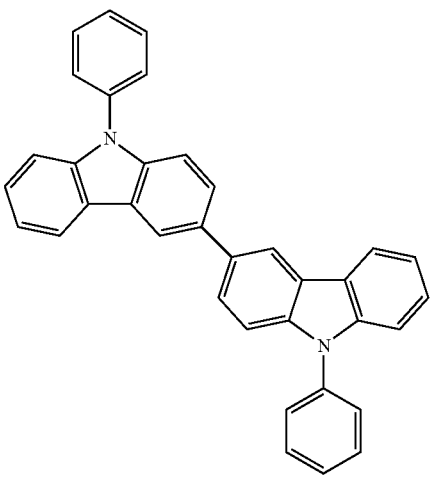

PCCP

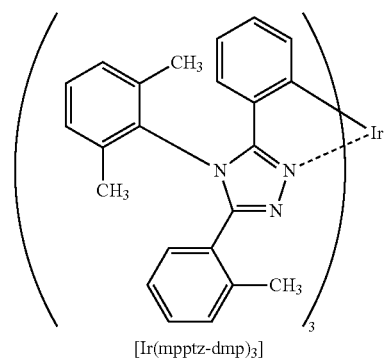

[Ir(mpptz-dmp)$_3$]

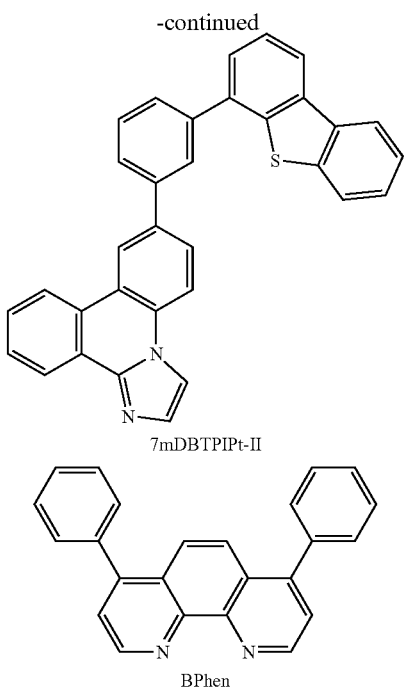

7mDBTPIPt-II

BPhen

A method for manufacturing the light-emitting element 2 of this example will be described below.

(Light-emitting Element 2)

First, over the substrate 1100, ITO-SiO$_2$ was deposited by a sputtering method, whereby the first electrode 1101 was formed. Note that the composition of the target used was as follows: In$_2$O$_3$:SnO$_2$:SiO$_2$=85:10:5 [wt %]. The thickness of the first electrode 1101 was 110 nm and the electrode area was 2 mm×2 mm. Here, the first electrode 1101 functions as the anode of the light-emitting element.

Next, as pretreatment for forming the light-emitting element over the substrate 1100, the surface of the substrate was washed with water, baked at 200° C. for 1 hour, and subjected to UV ozone treatment for 370 seconds.

After that, the substrate 1100 was transferred into a vacuum evaporation apparatus where the pressure had been reduced to approximately 10$^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the first electrode 1101 was formed was fixed to a substrate holder provided in the vacuum evaporation apparatus so that the surface provided with the first electrode 1101 faced downward. The pressure in the vacuum evaporation apparatus was reduced to about 10$^{-4}$ Pa. After that, on the first electrode 1101, by an evaporation method using resistance heating, DBT3P-II and molybdenum oxide were deposited by co-evaporation, whereby the hole-injection layer 1111 was formed. The thickness of the hole-injection layer 1111 was set to 60 nm, and the weight ratio of DBT3P-II to molybdenum oxide was adjusted to 4:2 (=DBT3P-II: molybdenum oxide).

Next, PCCP was deposited on the hole-injection layer 1111 by evaporation, whereby the hole-transport layer 1112 was formed. The thickness of the hole-transport layer 1112 was set to 20 nm.

Next, on the hole-transport layer 1112, PCCP, 7mDBT-PIPt-II, and Ir(mpptz-dmp)$_3$ were deposited by co-evaporation, whereby the first light-emitting layer 1113a was formed. Here, the weight ratio of PCCP, to 7mDBTPIPt-II and Ir(mpptz-dmp)$_3$ was adjusted to 1:0.3:0.06 (=PCCP: 7mDBTPIPt-II: Ir(mpptz-dmp)$_3$). The thickness of the first light-emitting layer 1113a was set to 30 nm.

Note that in the first light-emitting layer 1113a, 7mDBT-PIPt-II that is one embodiment of the present invention was used as the third organic compound (assist material), Ir(mpptz-dmp)$_3$ was used as the second organic compound (guest material), and PCCP was used as the first organic compound (host material).

Then, the second light-emitting layer 1113b was formed on the first light-emitting layer 1113a by co-evaporation of 7mDBTPIPt-II and Ir(mpptz-dmp)$_3$. Here, the weight ratio of 7mDBTPIPt-II to Ir(mpptz-dmp)$_3$ was adjusted to 1:0.06 (=7mDBTPIPt-II: Ir(mpptz-dmp)$_3$). The thickness of the second light-emitting layer 1113b was set to 10 nm.

Note that in the second light-emitting layer 1113b, 7mDBTPIPt-II (abbreviation) that is one embodiment of the present invention was used as the first organic compound (host material), and Ir(mpptz-dmp)$_3$ was used as the second organic compound (guest material).

Next, on the second light-emitting layer 1113b, a film of 7mDBTPIPt-II was formed to a thickness of 10 nm to form the first electron-transport layer 1114a.

The structure can be favorably employed in which the first electron-transport layer 1114a is formed in contact with the second light-emitting layer 1113b and each of the first light-emitting layer 1113a, the second light-emitting layer 1113b, and the first electron-transport layer 1114a contains 7mDBTPIPt-II that is one embodiment of the present invention, as described above, because the structure enables improvement in emission characteristics.

Next, BPhen was deposited to a thickness of 15 nm on the first electron-transport layer 1114a, whereby the second electron-transport layer 1114b was formed.

Next, lithium fluoride was deposited by evaporation to a thickness of 1 nm on the second electron-transport layer 1114b, whereby the electron-injection layer 1115 was formed.

Lastly, aluminum was deposited by evaporation to a thickness of 200 nm as the second electrode 1103 which functions as the cathode. Through the above steps, the light-emitting element 2 of this example was manufactured.

Note that in all the above evaporation steps, evaporation was performed by a resistance-heating method.

Table 3 shows an element structure of the light-emitting element 2 obtained as described above.

TABLE 3

| | | | Light-emitting Layer | | Electron-transport Layer | | | |
|---|---|---|---|---|---|---|---|---|
| First Electrode | Hole-injection Layer | Hole-transport Layer | $1^{st}$ | $2^{nd}$ | $1^{st}$ | $2^{nd}$ | Electron-Injection Layer | Second Electrode |
| ITSO 110 nm | DBT3P-II:MoO$_x$ (4:2) 60 nm | PCCP 20 nm | a 30 nm | b 10 nm | 7mDBTPIPt-II 10 nm | BPhen 15 nm | LiF 1 nm | Al 200 nm |

$^a$PCCP:7mDBTPIPt-II:Ir(mpptz-dmp)$_3$ = 1:0.3:0.06
$^b$7mDBTPIPt-II:Ir(mpptz-dmp)$_3$ = 1:0.06

Next, in a glove box containing a nitrogen atmosphere, the light-emitting element 2 was sealed with a glass substrate so as not to be exposed to the air (specifically, a sealant was applied onto an outer edge of the element and heat treatment was performed at 80° C. for 1 hour at the time of sealing). Then, the operating characteristics of the light-emitting element 2 were measured. Note that the measurement was carried out at room temperature (in an atmosphere kept at 25° C.).

Figure 19:
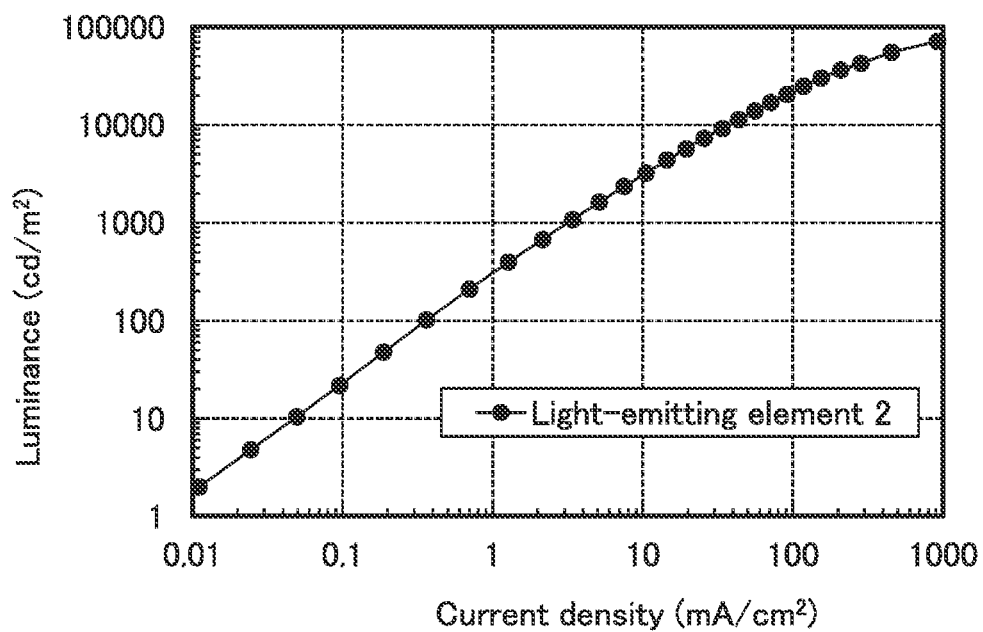
FIG. 19 shows current density-luminance characteristics of a light-emitting element 2.
Figure 20:
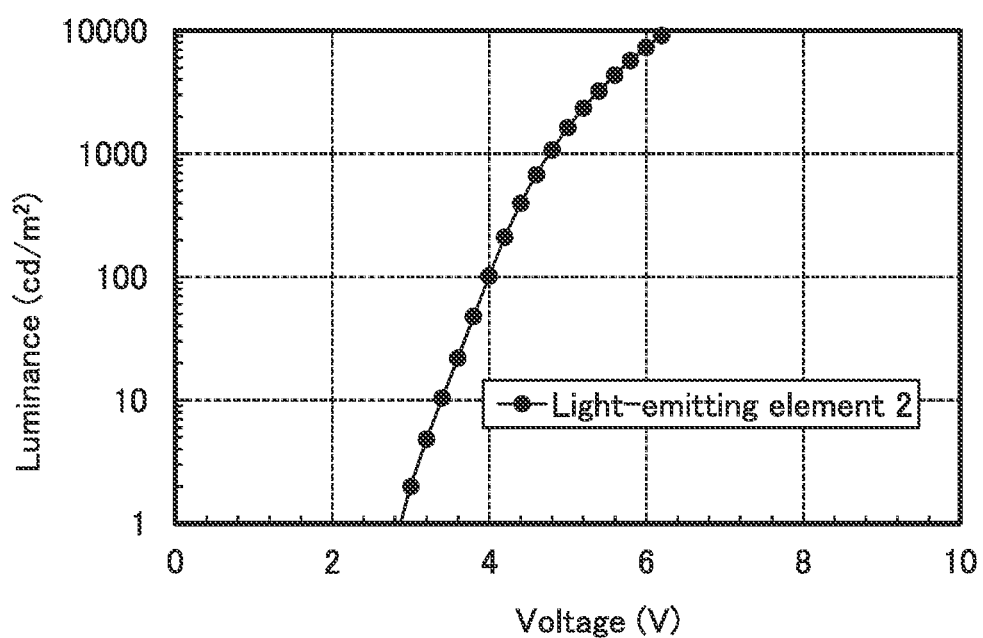
FIG. 20 shows voltage-luminance characteristics of a light-emitting element 2.
Figure 21:
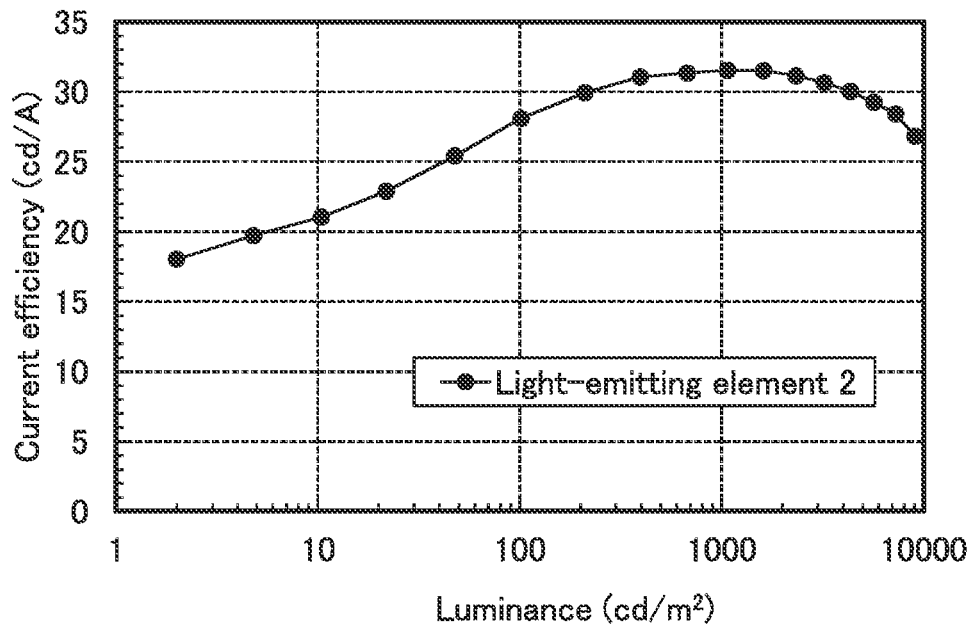
FIG. 21 shows luminance-current efficiency characteristics of a light-emitting element 2.
Figure 22:
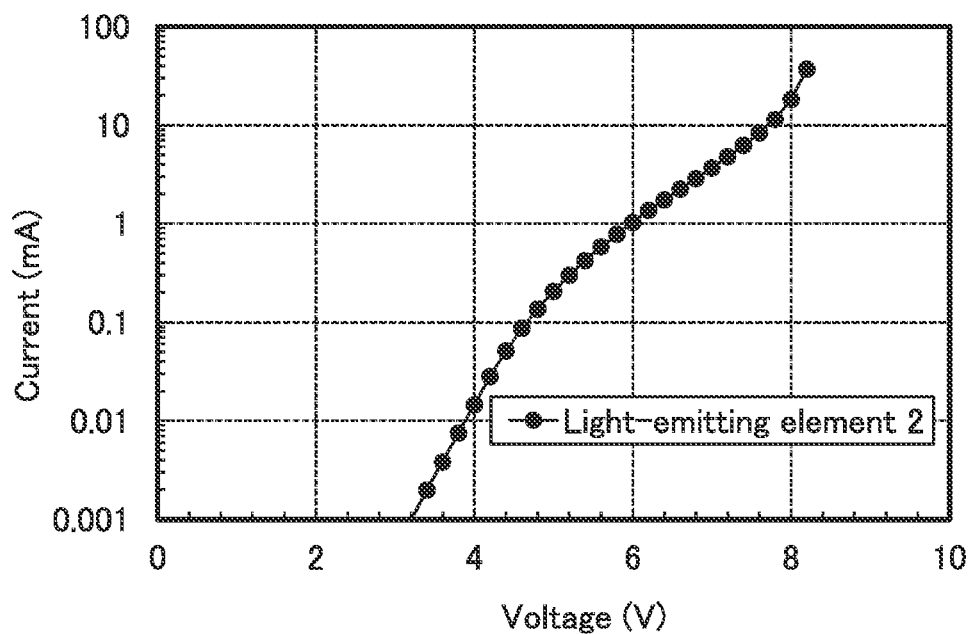
FIG. 22 shows voltage-current characteristics of a light-emitting element 2.

FIG. 19 shows current density-luminance characteristics of the light-emitting element 2. In FIG. 19, the horizontal axis represents current density (mA/cm$^2$) and the vertical axis represents luminance (cd/m$^2$). FIG. 20 shows voltage-luminance characteristics of the light-emitting element 2. In FIG. 20, the horizontal axis represents voltage (V) and the vertical axis represents luminance (cd/m$^2$). FIG. 21 shows luminance-current efficiency characteristics of the light-emitting element 2. In FIG. 21, the horizontal axis represents luminance (cd/m$^2$) and the vertical axis represents current efficiency (cd/A). Further, FIG. 22 shows voltage-current characteristics of the light-emitting element 2. In FIG. 22, the horizontal axis represents voltage (V) and the vertical axis represents current (mA).

Table 4 shows the voltage (V), current density (mA/cm$^2$), CIE chromaticity coordinates (x, y), current efficiency (cd/A), and external quantum efficiency (%) of the light-emitting element 2 at a luminance of 1070 cd/m$^2$.

TABLE 4

Characteristics of the light-emitting element 2 at 1070 cd/m$^2$

| Voltage (V) | Current Density (mA/cm$^2$) | CIE Chromaticity Coordinates | | Luminance (cd/m$^2$) | Current Efficiency (cd/A) | External Quantum Efficiency (%) |
|---|---|---|---|---|---|---|
| | | x | y | | | |
| 4.8 | 3.4 | 0.20 | 0.37 | 1072 | 32 | 13 |

The above results demonstrate that the light-emitting element 2, which is one embodiment of the present invention, is driven at low voltage and has high current efficiency.

Example 5

In this example, a light-emitting element of one embodiment of the present invention (a light-emitting element 3) will be described with reference to FIG. 13. Chemical formulae of materials used in this example are shown below.

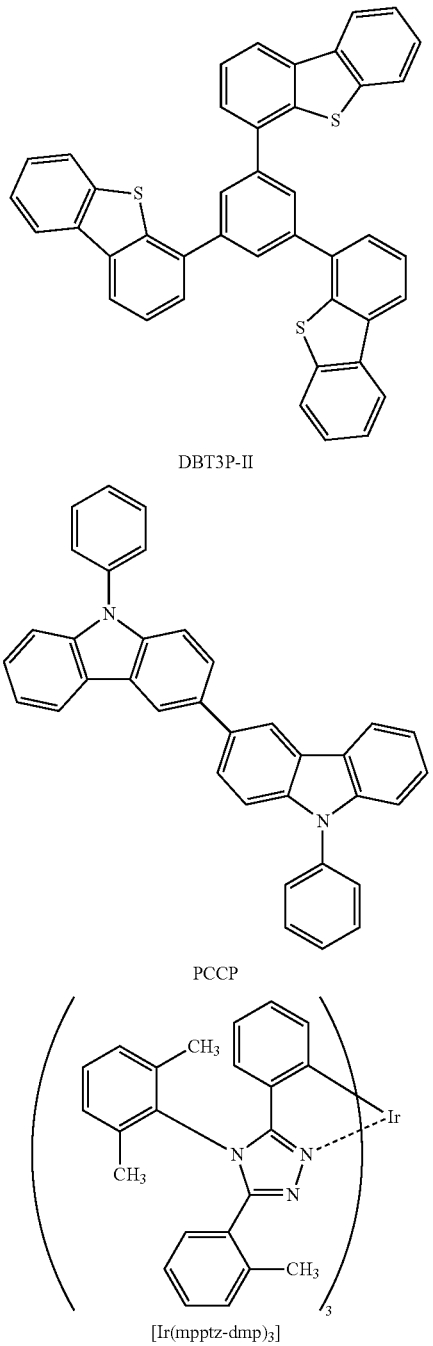

DBT3P-II

PCCP

[Ir(mpptz-dmp)$_3$]

-continued

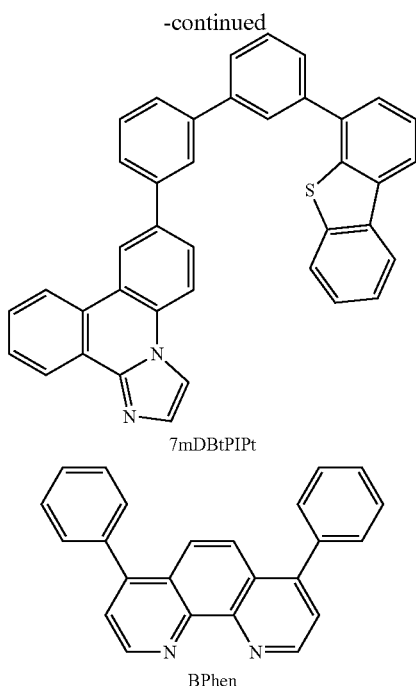

7mDBtPIPt

BPhen compound (host material), the low triplet excitation energy level causes quenching of triplet excitation energy of the second organic compound which contributes to light emission, so that emission efficiency is reduced.

The second light-emitting layer 1113b was formed on the first light-emitting layer 1113a by co-evaporation of 7mDBtBPIPt and [Ir(mpptz-dmp)$_3$]. Here, the weight ratio of 7mDBtBPIPt to Ir(mpptz-dmp)$_3$ was adjusted to 1:0.06 (=7mDBtBPIPt: Ir(mpptz-dmp)$_3$).

Note that in the second light-emitting layer 1113b, 7mDBtBPIPt was used as the first organic compound (host material), and Ir(mpptz-dmp)$_3$ was used as the second organic compound (guest material).

The first electron-transport layer 1114a was formed by depositing a film of 7mDBtBPIPt on the second light-emitting layer 1113b.

The structure can be favorably employed in which the first electron-transport layer 1114a is formed in contact with the second light-emitting layer 1113b and each of the first light-emitting layer 1113a, the second light-emitting layer 1113b, and the first electron-transport layer 1114a contains 7mDBtBPIPt that is one embodiment of the present invention, as described above, because the structure enables improvement in emission characteristics.

Table 5 shows an element structure of the light-emitting element 3 obtained as described above.

TABLE 5

| | | | Device structure of the light-emitting element 3 | | | | | |
|---|---|---|---|---|---|---|---|---|
| First Electrode | Hole-injection Layer | Hole-transport Layer | Light-emitting Layer 1$^{st}$ | 2$^{nd}$ | Electron-transport Layer 1$^{st}$ | 2$^{nd}$ | Electron-Injection Layer | Second Electrode |
| ITSO 110 nm | DBT3P-II:MoO$_x$ 4:2 60 nm | PCCP 20 nm | $^a$ 30 nm | $^b$ 10 nm | 7mDBtBPIPt 10 nm | BPhen 15 nm | LiF 1 nm | Al 200 nm |

$^a$PCCP:7mDBtBPIPt:Ir(mpptz-dmp)$_3$ = 1:0.5:0.06
$^b$7mDBtBPIPt:Ir(mpptz-dmp)$_3$ = 1:0.06

(Light-emitting Element 3)

The light-emitting element 3 was prepared in a manner similar to that of the light-emitting element 2. The differences between the light-emitting elements 2 and 3 are the use of materials different from those used in the light-emitting element 2 in the first light-emitting layer 1113a, the second light-emitting layer 1113b, and the first electron-transport layer 1114a.

Specifically, on the hole-transport layer 1112, PCCP, 7mDBtBPIPt, and Ir(mpptz-dmp)$_3$ were deposited by co-evaporation, whereby the first light-emitting layer 1113a was formed at a thickness of 30 nm. Here, the weight ratio of PCCP to 7mDBtBPIPt and Ir(mpptz-dmp)$_3$ was adjusted to 1:0.5:0.06 (=PCCP: 7mDBtBPIPt: Ir(mpptz-dmp)$_3$).

Note that in the first light-emitting layer 1113a, 7mDBtBPIPt that is one embodiment of the present invention was used as the third organic compound (assist material), Ir(mpptz-dmp)$_3$ was used as the second organic compound (guest material), and PCCP was used as the first organic compound (host material). As described in this example, a hole-transport material without an amine skeleton is used as the third organic compound (assist material). As described above, in the case where a hole-transport material with an amine skeleton is used as the first organic The operating characteristics of the light-emitting element 3 were measured at room temperature (in an atmosphere kept at 25° C.).

Figure 27:
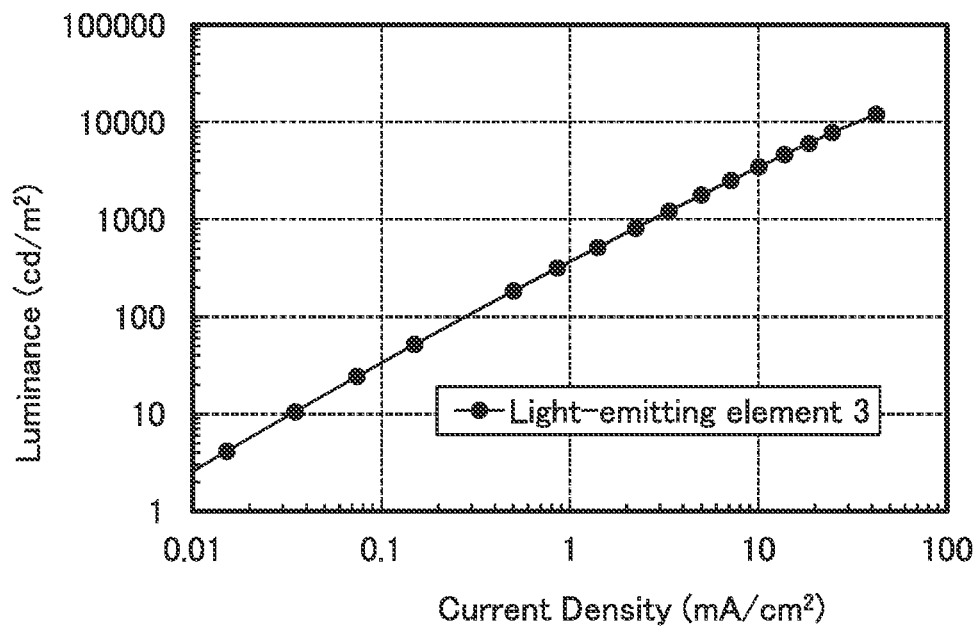
FIG. 27 shows current density-luminance characteristics of a light-emitting element 3.
Figure 28:
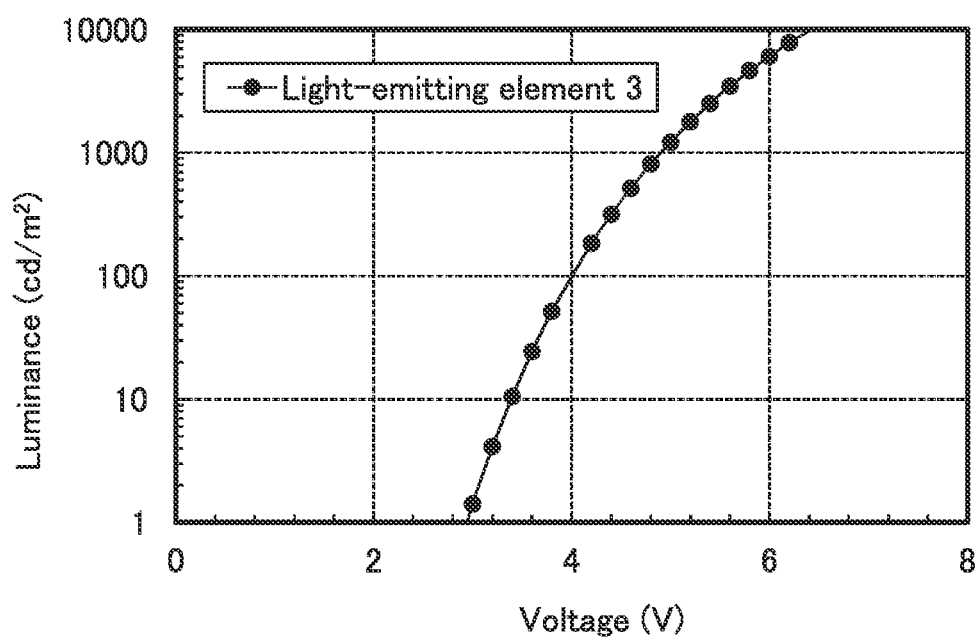
FIG. 28 shows voltage-luminance characteristics of a light-emitting element 3.
Figure 29:
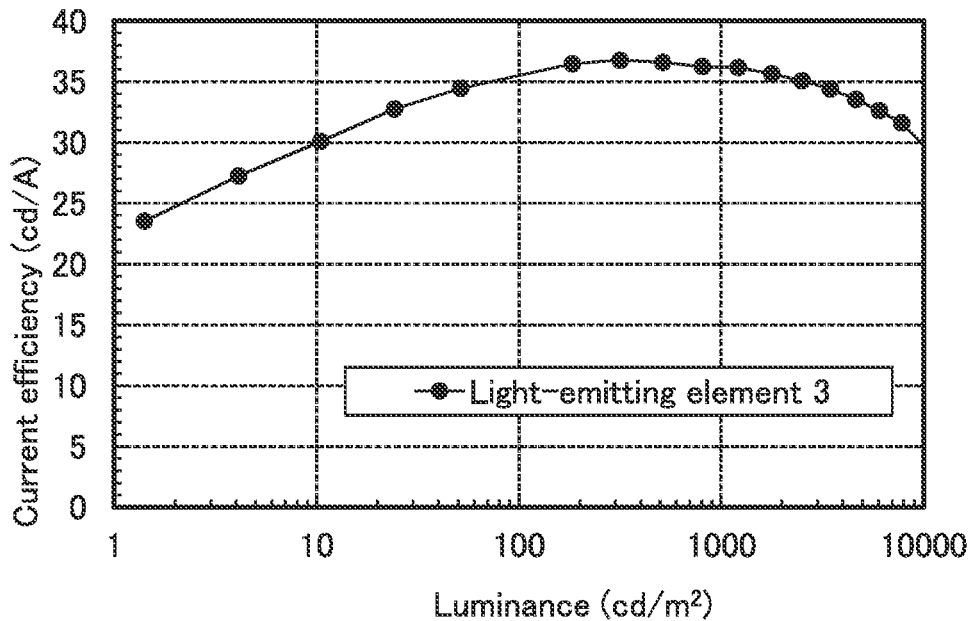
FIG. 29 shows luminance-current efficiency characteristics of a light-emitting element 3.
Figure 30:
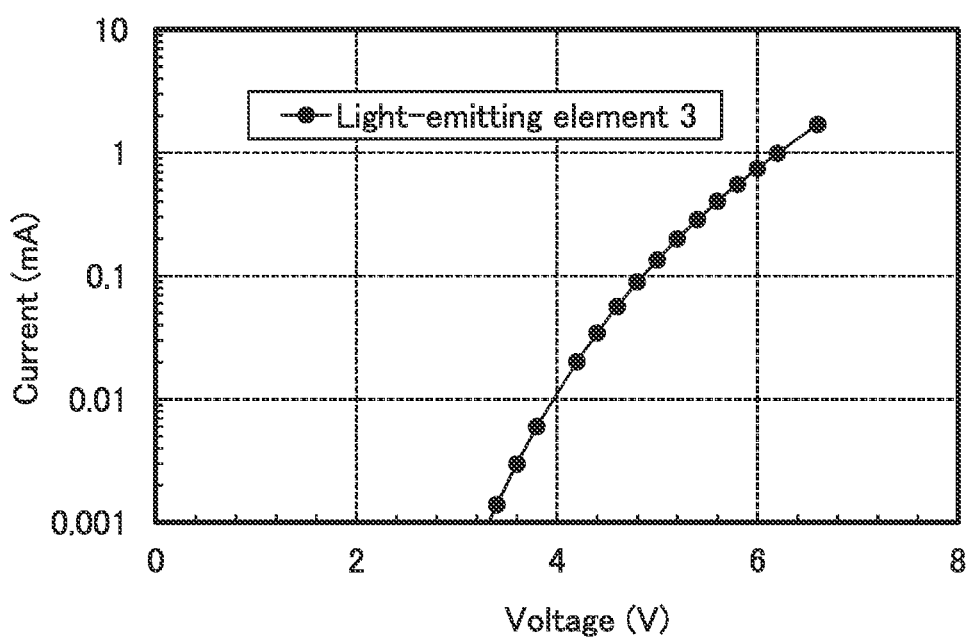
FIG. 30 shows voltage-current characteristics of a light-emitting element 3.

FIG. 27 shows current density-luminance characteristics of the light-emitting element 3. In FIG. 27, the horizontal axis represents current density (mA/cm$^2$) and the vertical axis represents luminance (cd/m$^2$). FIG. 28 shows voltage-luminance characteristics of the light-emitting element 3. In FIG. 28, the horizontal axis represents voltage (V) and the vertical axis represents luminance (cd/m$^2$). FIG. 29 shows luminance-current efficiency characteristics of the light-emitting element 3. In FIG. 29, the horizontal axis represents luminance (cd/m$^2$) and the vertical axis represents current efficiency (cd/A). Further, FIG. 30 shows voltage-current characteristics of the light-emitting element 3. In FIG. 30, the horizontal axis represents voltage (V) and the vertical axis represents current (mA).

Table 6 shows the voltage (V), current density (mA/cm$^2$), CIE chromaticity coordinates (x, y), current efficiency (cd/A), and external quantum efficiency (%) of the light-emitting element 3 at a luminance of 810 cd/m$^2$.

TABLE 6

| Characteristics of the light-emitting element 3 at 810 cd/m² | | | | | | |
|---|---|---|---|---|---|---|
| Voltage | Current Density | CIE Chromaticity Coordinates | | Luminance | Current Efficiency | External Quantum Efficiency |
| (V) | (mA/cm²) | x | y | (cd/m²) | (cd/A) | (%) |
| 4.8 | 2.2 | 0.22 | 0.39 | 810 | 36 | 15 |

The above results demonstrate that the light-emitting element 3, which is one embodiment of the present invention, is driven at low voltage and has high current efficiency.

Reference Example

A method for synthesizing Ir(mpptz-dmp)$_3$, which was used in Examples 4 and 5, will be described. A structure of Ir(mpptz-dmp)$_3$ is shown below.

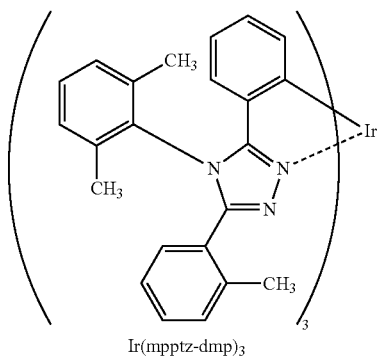

Ir(mpptz-dmp)$_3$

Step 1: Synthesis of 3-(2-Methylphenyl)-4-(2,6-Dimethylphenyl)-5-Phenyl-4H-1,2,4-Triazole (Abbreviation: Hmpptz-Dmp)

First, 12.6 of g (43.3 mmol) N-[1-chloro-1-(2-methylphenyl)methylidene]-N'-[1-chloro-(1-phenyl)methylidene]hydrazine, 15.7 g (134.5 mmol) of 2,6-dimethylaniline, and 100 ml of N,N-dimethylaniline were put into a 500-ml recovery flask and heated and stirred at 120° C. for 20 hours. After reaction for the predetermined time, this reacted solution was slowly added to 200 ml of 1N hydrochloric acid. Dichloromethane was added to this solution and an objective substance was extracted to an organic layer. The obtained organic layer was washed with water and an aqueous solution of sodium hydrogen carbonate, and was dried over magnesium sulfate. The magnesium sulfate was removed by gravity filtration, and the obtained filtrate was concentrated to give a black liquid. This liquid was purified by silica gel column chromatography. A mixed solvent of ethyl acetate and hexane in a ratio of 1:5 was used as a developing solvent. The obtained fraction was concentrated to give a white solid. This solid was recrystallized with ethyl acetate to give 4.5 g of a white solid of Hmpptz-dmp in a yield of 31%. A synthesis scheme of Step 1 is shown below.

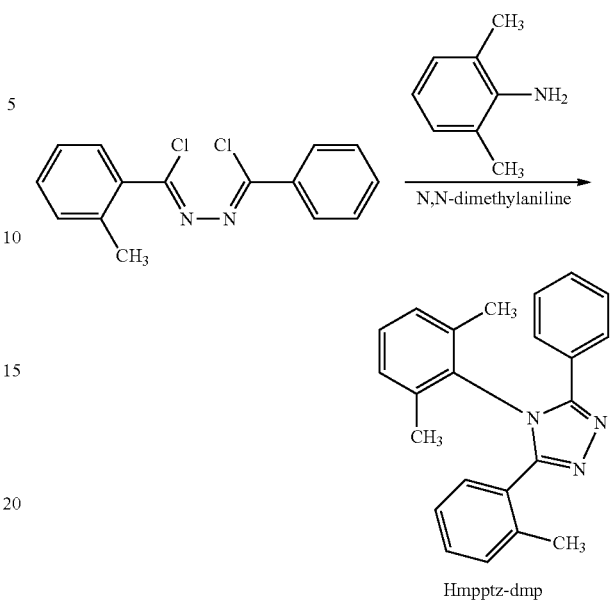

Step 2: Synthesis of Ir(Mpptz-Dmp)$_3$

Then, 2.5 g (7.4 mmol) of Hmpptz-dmp, which was the ligand obtained in Step 1, and 0.7 g (1.5 mmol) of tris(acetylacetonato)iridium(III) were put into a container for high-temperature heating, and degasification was carried out. The mixture in the reaction container was heated and stirred at 250° C. for 48 hours under Ar flow. After reaction for the predetermined time, the obtained solid was washed with dichloromethane, and an insoluble green solid was obtained by suction filtration. This solid was dissolved in toluene and filtered through a stack of alumina and Celite. The obtained fraction was concentrated to give a green solid. This solid was recrystallized with toluene, so that 0.8 g of a green powder of Ir(mpptz-dmp)$_3$, which is a phosphorescent organometallic iridium complex, was obtained in a yield of 45%. A synthesis scheme of Step 2 is shown below.

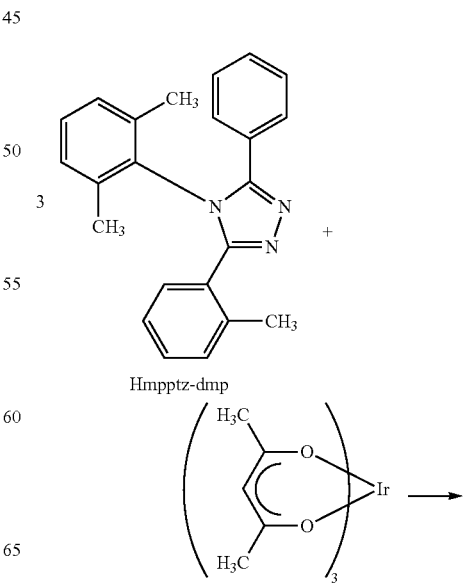

-continued

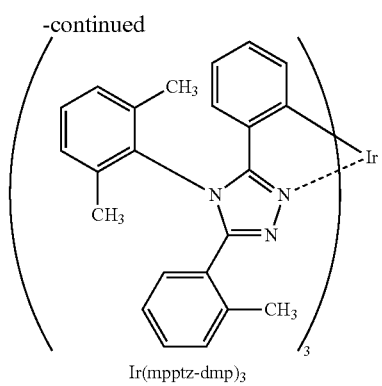

Ir(mpptz-dmp)₃

An analysis result by ¹H NMR method of the green powder obtained in Step 2 is described below. The result reveals that the organometallic complex Ir(mpptz-dmp)₃ (abbreviation) was obtained by the synthesis method.

¹H NMR. δ(toluene-d8): 1.82 (s, 3H), 1.90 (s, 3H), 2.64 (s, 3H), 6.56-6.62 (m, 3H), 6.67-6.75 (m, 3H), 6.82-6.88 (m, 1H), 6.91-6.97 (t, 1H), 7.00-7.12 (m, 2H), 7.63-7.67 (d, 1H).

This application is based on Japanese Patent Application serial no. 2012-157602 filed with Japan Patent Office on Jul. 13, 2012, the entire contents of which are hereby incorporated by reference.

What is claimed is:

1. A light-emitting device comprising:
a first electrode;
a light-emitting layer including a first organic compound, a second organic compound, and a third organic compound over the first electrode; and
a second electrode over the light-emitting layer,
wherein the first organic compound is represented by a formula (G1):

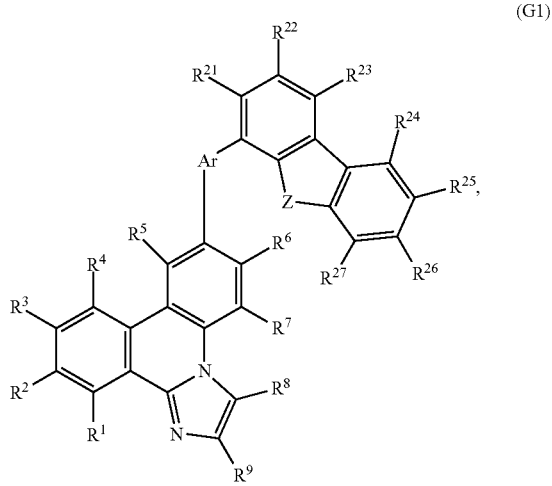

(G1)

wherein:
R¹ to R⁷ separately represent hydrogen, an alkyl group having 1 to 4 carbon atoms, or a substituted or unsubstituted aryl group having 6 to 13 carbon atoms;
R⁸, R⁹, and R²¹ to R²⁷ each represent hydrogen;
Ar represents a substituted or unsubstituted arylene group having 6 to 13 carbon atoms; and
Z represents a sulfur atom or an oxygen atom, wherein the second organic compound is a phosphorescent material, and
wherein the first organic compound and the third organic compound form an exciplex.

2. The light-emitting device according to claim 1,
wherein the first organic compound is represented by a formula (G2):

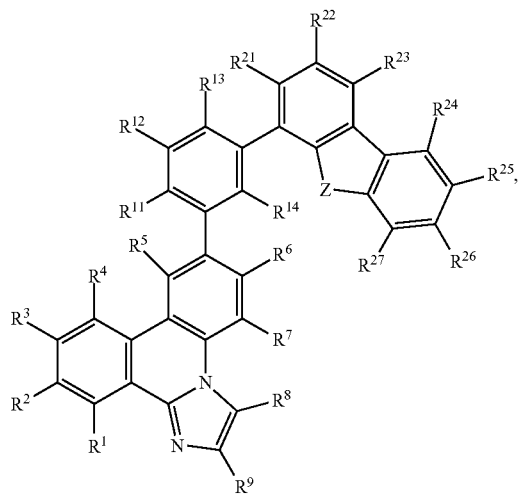

(G2)

wherein R¹¹ to R¹⁴ separately represent hydrogen, an alkyl group having 1 to 4 carbon atoms, or a substituted or unsubstituted aryl group having 6 to 13 carbon atoms.

3. The light-emitting device according to claim 1,
wherein the first organic compound is represented by any one of the following formulae:

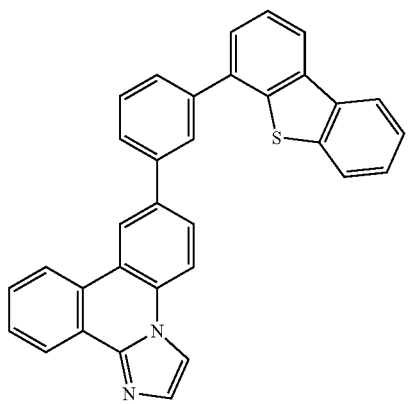

-continued
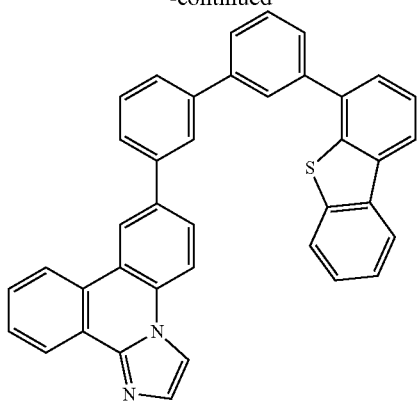
4. The light-emitting device according to claim 1, wherein the third organic compound includes a carbazole skeleton.
* * * * *